(12) United States Patent
Lee et al.

(10) Patent No.: US 11,921,419 B2
(45) Date of Patent: Mar. 5, 2024

(54) OPTICAL PROXIMITY CORRECTION METHOD AND METHOD OF FABRICATING A SEMICONDUCTOR DEVICE USING THE SAME

(71) Applicant: SAMSUNG ELECTRONICS CO., LTD., Suwon-si (KR)

(72) Inventors: Sooyong Lee, Yongin-si (KR); Bong-Soo Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 294 days.

(21) Appl. No.: 17/382,773

(22) Filed: Jul. 22, 2021

(65) Prior Publication Data
US 2022/0179301 A1    Jun. 9, 2022

(30) Foreign Application Priority Data
Dec. 3, 2020 (KR) .......... 10-2020-0167314

(51) Int. Cl.
*G03F 1/36* (2012.01)
*H01L 21/8234* (2006.01)

(52) U.S. Cl.
CPC ........ *G03F 1/36* (2013.01); *H01L 21/823487* (2013.01)

(58) Field of Classification Search
CPC ....................................................... G03F 1/36
USPC ........................................................... 438/5
See application file for complete search history.

(56) References Cited

U.S. PATENT DOCUMENTS

| 6,928,636 | B2 | 8/2005 | Ohnuma |
| 7,239,735 | B2 | 7/2007 | Nozaki |
| 7,546,564 | B2 | 6/2009 | Moon |
| 8,448,099 | B2 | 5/2013 | Wong et al. |
| 8,910,098 | B1 | 12/2014 | Lei et al. |
| 10,170,495 | B2 | 1/2019 | Kim et al. |
| 10,534,257 | B2 | 1/2020 | Tetiker et al. |
| 10,852,645 | B2 | 12/2020 | Shin et al. |
| 11,256,176 | B1 * | 2/2022 | Ho ............... G03F 7/705 |
| 2018/0247008 | A1 * | 8/2018 | Hamouda .......... G03F 1/36 |
| 2020/0249578 | A1 * | 8/2020 | Hsu ............ G03F 7/70091 |

(Continued)

FOREIGN PATENT DOCUMENTS

| JP | 2004-163472 A | 6/2004 |
| KR | 10-2010-0050285 A | 5/2010 |
| KR | 10-2010-0073663 A | 7/2010 |

(Continued)

*Primary Examiner* — Igwe U Anya
(74) *Attorney, Agent, or Firm* — Sughrue Mion, PLLC

(57) ABSTRACT

A method of fabricating a semiconductor device includes performing an optical proximity correction (OPC) operation on a design pattern of a layout, and forming a photoresist pattern on a substrate, using a photomask which is manufactured with the layout corrected by the OPC operation. The OPC operation includes generating a target pattern based on the design pattern, performing a first OPC operation, based on the target pattern, to generate a first correction pattern, measuring a target error by comparing a first simulation image of the first correction pattern with the target pattern, generating a retarget pattern from the target pattern, based on the target error, and performing a second OPC operation, based on the retarget pattern, to generate a second correction pattern.

18 Claims, 79 Drawing Sheets

(56) References Cited

U.S. PATENT DOCUMENTS

2020/0395354 A1* 12/2020 Lee .................. G06F 30/394
2021/0104463 A1* 4/2021 Lee .................. H01L 23/5283

FOREIGN PATENT DOCUMENTS

KR    10-2010-0127671 A    12/2010
KR    10-2015-0024500 A    3/2015

* cited by examiner

OPTICAL PROXIMITY CORRECTION METHOD AND METHOD OF FABRICATING A SEMICONDUCTOR DEVICE USING THE SAME

CROSS-REFERENCE TO RELATED APPLICATIONS

This application claims priority under 35 U.S.C. § 119 to Korean Patent Application No. 10-2020-0167314, filed on Dec. 3, 2020, in the Korean Intellectual Property Office, the disclosure of which is incorporated by reference herein in its entirety.

BACKGROUND

The present disclosure relates to a method of fabricating a semiconductor device, and in particular, to a method of fabricating a semiconductor device using an optical proximity correction (OPC) method.

Due to their small-sized, multifunctional, and/or low-cost characteristics, semiconductor devices are considered important elements in the electronics industry. Semiconductor devices are classified into a memory device for storing data, a logic device for processing data, and a hybrid device including both of memory and logic elements. As the electronics industry is highly developed, there is an increasing demand for semiconductor devices with improved characteristics. For example, there is an increasing demand for semiconductor devices with high reliability, high performance, and/or multiple functions. To satisfy these technical requirements, complexity and/or integration density of semiconductor devices are being increased.

SUMMARY

One or more example embodiments of the disclosure provide an OPC method having an extremely high precision.

One or more example embodiments of the disclosure also provide a method of fabricating a highly integrated and highly reliable semiconductor device.

In accordance with an aspect of an example embodiment, a method of fabricating a semiconductor device includes performing an optical proximity correction (OPC) operation on a design pattern of a layout; and forming a photoresist pattern on a substrate, using a photomask which is manufactured with the layout corrected by the OPC operation, wherein the OPC operation includes generating a target pattern based on the design pattern; performing a first OPC operation, based on the target pattern, to generate a first correction pattern; measuring a first target error by comparing a first simulation image of the first correction pattern with the target pattern; generating a retarget pattern from the target pattern, based on the first target error; and performing a second OPC operation, based on the retarget pattern, to generate a second correction pattern.

In accordance with an aspect of an example embodiment, a method of fabricating a semiconductor device includes performing an optical proximity correction (OPC) operation on a layout; and forming a photoresist pattern on a substrate, using a photomask which is manufactured with the layout corrected by the OPC operation, wherein the OPC operation includes generating a target pattern comprising a first edge, a second edge, a third edge, and a fourth edge; performing a first OPC operation, based on the target pattern, to generate a first correction pattern; measuring a first target error by comparing a first simulation image of the first correction pattern with the target pattern; compensating each of the first to fourth edges of the target pattern, based on the first target error, to generate a retarget pattern; and performing a second OPC operation, based on the retarget pattern, to generate a second correction pattern.

In accordance with an aspect of an example embodiment, a method of fabricating a semiconductor device includes forming a peripheral circuit structure on a substrate, the peripheral circuit structure comprising peripheral transistors and lower interconnection lines provided on the peripheral transistors, the substrate comprising a cell array region and a connection region; forming a semiconductor layer on the peripheral circuit structure; alternately stacking insulating layers and sacrificial layers on the semiconductor layer to form a stack; patterning the stack on the connection region to form a staircase structure; forming channel holes to penetrate the stack on the cell array region; forming dummy holes to penetrate the staircase structure on the connection region; forming vertical channel structures in the channel holes, respectively, each of the vertical channel structures comprising a vertical insulating pattern comprising a charge storing layer, a vertical semiconductor pattern connected to the semiconductor layer, and a gap-fill insulating pattern; forming dummy structures in the dummy holes, respectively; replacing the sacrificial layers with electrodes, respectively; forming bit lines, each bit line of the bit lines being electrically connected to a respective one of the vertical channel structures; and forming upper interconnection lines, each upper interconnection line of the upper interconnection lines being electrically connected to a respective one of the electrodes exposed through the staircase structure. The forming of the channel holes includes: designing a layout defining the channel holes; performing an optical proximity correction (OPC) operation on the designed layout; and performing a photolithography process using a photomask which is manufactured with the layout corrected by the OPC operation. The OPC operation includes: generating a target pattern including a first edge, a second edge, a third edge, and a fourth edge; performing a first OPC operation, based on the target pattern, to generate a first correction pattern; measuring a first target error by comparing a first simulation image of the first correction pattern with the target pattern; compensating each of the first to fourth edges of the target pattern, based on the first target error, to generate a retarget pattern; and performing a second OPC operation, based on the retarget pattern, to generate a second correction pattern.

BRIEF DESCRIPTION OF THE DRAWINGS

The above and other aspects of certain example embodiments of the present disclosure will be more apparent from the following description taken in conjunction with the accompanying drawings, in which.

DETAILED DESCRIPTION

Figure 1:
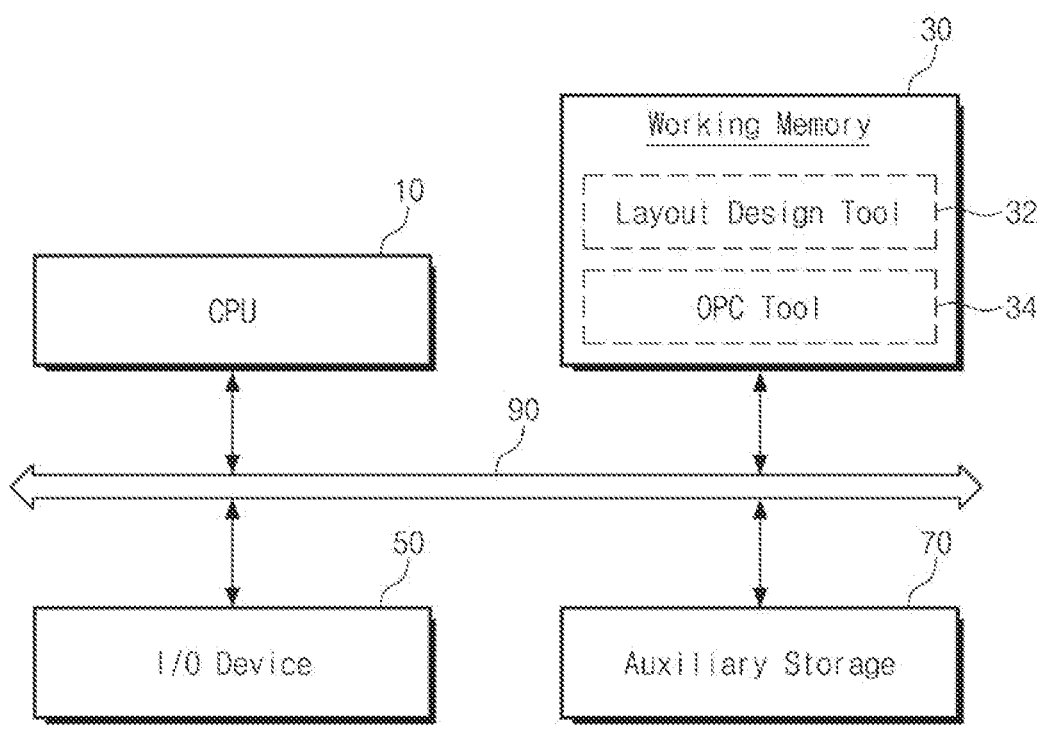
FIG. 1 is a block diagram illustrating a computer system for performing a semiconductor design process, according to an example embodiment.

FIG. 1 is a block diagram illustrating a computer system for performing a semiconductor design process, according to an example embodiment. Referring to FIG. 1, a computer system may include a central processing unit (CPU) 10, a working memory 30, an input-output device 50, and an auxiliary storage device 70. In some example embodiments, the computer system may be a customized system for performing a layout design process. Furthermore, the computer system may include a computing system configured to execute various design and check simulation programs.

The CPU 10 may be configured to run a variety of software programs, such as application programs, operating systems, and device drivers. For example, the CPU 10 may be configured to run an operating system loaded on the working memory 30. Furthermore, the CPU 10 may be configured to run various application programs on the operating system. For example, the CPU 10 may be configured to run a layout design tool 32 and/or OPC tool 34 loaded on the working memory 30.

The operating system or application programs may be loaded on the working memory 30. For example, when the computer system starts a booting operation, an OS image stored in the auxiliary storage device 70 may be loaded on the working memory 30 according to a booting sequence. In the computer system, overall input/output operations may be managed by the operating system. Some application programs, which may be selected by a user or be provided for basic services, may be loaded on the working memory 30. According to some example embodiments, the layout design tool 32 and/or OPC tool 34 may be loaded on the working memory 30, from the auxiliary storage device 70.

The layout design tool 32 may provide a function for changing biasing data for specific layout patterns; for example, the layout design tool 32 may be configured to allow the specific layout patterns to have shapes and positions different from those defined by a design rule. The layout design tool 32 may be configured to perform a design rule check (DRC) under the changed condition of the bias data. The OPC tool 34 may be configured to perform an optical proximity correction (OPC) process on layout data, which is obtained by the layout design tool 32. The working memory 30 may be one of volatile memory devices (e.g., static random access memory (SRAM) or dynamic random access memory (DRAM) devices) or nonvolatile memory devices (e.g., phase-change memory (PRAM), magnetoresistive random access memory (MRAM), resistive random access memory (ReRAM), ferroelectric random access memory (FRAM), or NOR FLASH memory devices).

The input-output device 50 may be configured to control user input and output operations of user interface devices. For example, the input-output device 50 may include a keyboard or a monitor, allowing a designer to input relevant information. By using the input-output device 50, the designer may receive information on several regions or data paths of a semiconductor device to which adjusted operating characteristics will be applied. The input-output device 50 may be configured to display a progress status or a process result of the OPC tool 34.

The auxiliary storage device 70 may serve as a storage medium for the computer system. The auxiliary storage device 70 may be configured to store application programs, an OS image, and various data. The auxiliary storage device 70 may be provided in the form of one of memory cards (e.g., MultiMediaCard (MMC), embedded MMC (eMMC), Secure Digital (SD), MicroSD, and so forth) or a hard disk drive (HDD). The auxiliary storage device 70 may include a NAND FLASH memory device with a large memory capacity. Alternatively, the auxiliary storage device 70 may include at least one of next-generation nonvolatile memory devices (e.g., PRAM, MRAM, ReRAM, or FRAM) or NOR FLASH memory devices.

A system interconnector 90 may serve as a system bus for realizing a network in the computer system. The CPU 10, the working memory 30, the input-output device 50, and the auxiliary storage device 70 may be electrically connected to each other through the system interconnector 90, and thus, data may be exchanged therebetween. However, the system interconnector 90 may not be limited to the afore-described configuration; for example, it may further include an additional element for increasing efficiency in data communication.

Figure 2:
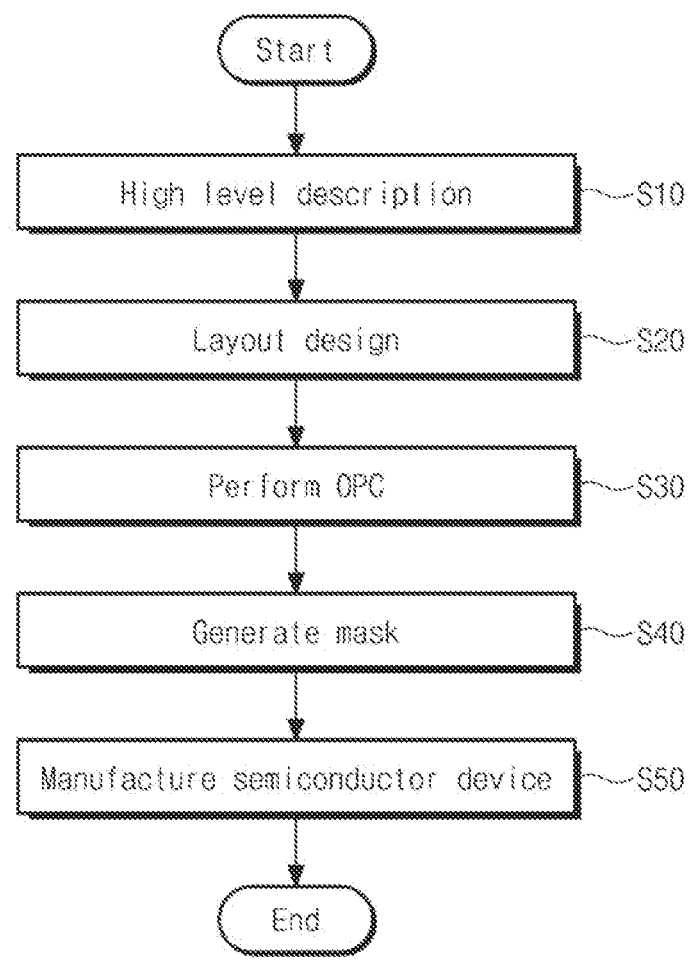
FIG. 2 is a flow chart illustrating a method of designing and fabricating a semiconductor device, according to an example embodiment.

FIG. 2 is a flow chart illustrating a method of designing and fabricating a semiconductor device, according to an example embodiment.

Referring to FIG. 2, a high-level design process for a semiconductor integrated circuit may be performed using the computer system described with reference to FIG. 1 (in S10). For example, in the high-level design process, an integrated circuit to be designed may be described in terms of high-level computer language (e.g., C language). Circuits designed by the high-level design process may be more concretely described by a register transfer level (RTL) coding or a simulation. Furthermore, codes generated by the RTL coding may be converted into a netlist, and the results may be combined with each other to wholly describe a semiconductor device. The combined schematic circuit may be verified by a simulation tool. In certain example embodiments, an adjusting step may be further performed, in consideration of a result of the verification step.

A layout design process may be performed to realize a logically complete form of the semiconductor integrated circuit on a silicon wafer (in S20). For example, the layout design process may be performed, based on the schematic circuit prepared in the high-level design process or the corresponding netlist. The layout design process may include a routing step of placing and connecting various standard cells that are provided from a cell library, based on a predetermined design rule.

The cell library may contain information on operation, speed, and power consumption of cells. In certain example embodiments, a cell library for representing a layout of a circuit in a gate level may be defined in or by the layout design tool. Here, the layout may be prepared to define or describe shapes, positions, or dimensions of patterns constituting transistors and metal interconnection lines, which will be actually formed on a silicon wafer. For example, in order to actually form an inverter circuit on a silicon wafer, it may be necessary to prepare or draw a layout for patterns (e.g., P-channel metal oxide semiconductor (PMOS), N-channel metal oxide semiconductor (NMOS), N-WELL, gate electrodes, and metal interconnection lines thereon). For this, at least one of inverters defined in the cell library may be selected.

Furthermore, a routing step of connecting the selected cells to each other may be performed. In detail, the routing step may be performed on the selected and disposed standard cells to connect them to upper interconnection lines. These steps may be automatically or manually performed in the layout design tool. In certain example embodiments, a step of placing the standard cells and establishing routing structures thereto may be automatically performed by a Place & Routing tool.

After the routing step, a verification step may be performed on the layout to check whether there is a portion violating the given design rule. In some example embodiments, the verification step may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step may be performed (in S30). The OPC step may be performed to correct optical proximity effects, which may occur when a photolithography process is performed on a silicon wafer using a photomask manufactured based on the layout. The optical proximity effect may be an unintended optical effect (such as refraction or diffraction) which may occur in the exposing process using the photomask manufactured based on the layout. In the OPC step, the layout may be modified to have a reduced difference in shape between designed patterns and actually-formed patterns, which may be caused by the optical proximity effects. As a result of the OPC step, the shapes and positions of patterns in the designed layout may be changed or biased. The OPC step will be described in more detail with reference to FIGS. 4 to 14.

A photomask may be manufactured, based on the layout modified by the OPC step (in S40). In general, the photomask may be manufactured by patterning a chromium layer provided on a glass substrate, using the layout pattern data.

The manufactured photomask may be used to manufacture a semiconductor device (in S50). In the actual fabricating process, the exposing and etching steps may be repeatedly performed, and thus, patterns defined in the layout design process may be sequentially formed on a semiconductor substrate.

Figure 3:
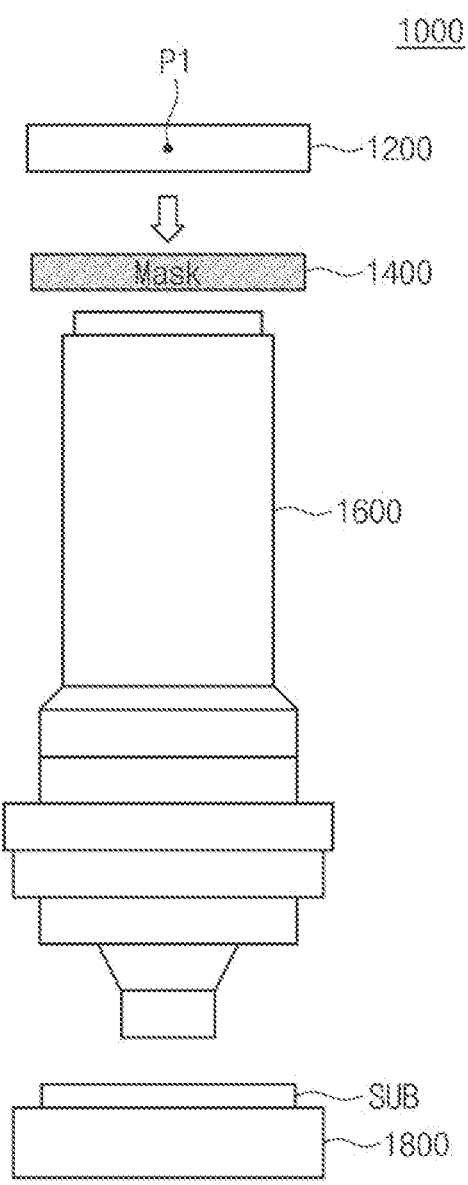
FIG. 3 is a conceptual diagram illustrating a photolithography system, in which a photomask according to an example embodiment is used.

FIG. 3 is a conceptual diagram illustrating a photolithography system, in which a photomask according to some example embodiments is used. A photolithography system 1000 may include a light source 1200, a photomask 1400, a reduction projection apparatus 1600, and a substrate stage 1800. Some additional elements may be provided in the photolithography system 1000. For example, the photolithography system 1000 may further include a sensor for measuring a height and a slope of a top surface of a substrate SUB.

The light source 1200 may be configured to emit light. The light emitted from the light source 1200 may be incident into the photomask 1400. To control a focal length, a lens may be provided between the light source 1200 and the photomask 1400. The light source 1200 may be configured to emit an ultraviolet light; for example, the light source 1200 may be a KrF light source (at 234 nm), an ArF light source (at 193 nm), or an extreme ultraviolet (EUV) light source. The light source 1200 according to an example embodiment may be the EUV light source. The light source 1200 may include a single point light source P1, but the disclosure may not be limited thereto. In certain example embodiments, the light source 1200 may be configured to have a plurality of point light sources.

The photomask 1400 may include image patterns, which are used to transcribe or print the designed layout onto the substrate SUB. The image patterns may be formed, based on layout patterns, which are prepared through layout design and OPC steps described above. The image patterns may be defined by transparent and opaque regions formed on the photomask 1400. The transparent region may be formed by etching the metal layer (e.g., the chromium layer) that is provided on the photomask 1400. The transparent region may be configured to allow light, which is incident from the light source 1200, to propagate toward the substrate SUB. By contrast, the opaque region may be configured to prevent the light from propagating toward the substrate SUB.

The light passing through the transparent region of the photomask 1400 may be incident into a photoresist layer, which is formed on the substrate SUB, through the reduction projection apparatus 1600, and as a result, photoresist patterns may be formed on the substrate SUB. The photoresist patterns may have shapes corresponding to the image patterns of the photomask 1400. That is, by using the reduction projection apparatus 1600, it may be possible to form the photoresist patterns, whose shapes are defined by the image patterns of the photomask 1400, on the substrate SUB.

The substrate stage 1800 may be configured to support the substrate SUB. The substrate SUB may include, for example, a silicon wafer. The reduction projection apparatus

1600 may include an aperture. The aperture may be used to control a depth of focus, when the ultraviolet light emitted from the light source 1200 is incident onto the substrate SUB. As an example, the aperture may include a dipole or quadruple aperture. The reduction projection apparatus 1600 may further include a lens for controlling a focal length.

As an integration density of a semiconductor device increases, a distance between the image patterns of the photomask 1400 may be reduced, thereby causing a proximity issue such as undesired interference and diffraction. As a result of the proximity issue, the photoresist patterns actually formed on the substrate SUB may have distorted shapes (i.e., different from those of the image patterns of the photomask 1400). The distortion of the photoresist patterns may lead to malfunction of an electronic device or circuit to be formed on the substrate SUB.

A resolution enhancement technology may be used to prevent the distortion of the photoresist patterns. An OPC technology, which is used in the step S30 of FIG. 2, may be an example of the resolution enhancement technology. According to the OPC technology, the optical distortion issue, which is caused by interference and diffraction, may be quantitatively predicted by a simulation process using an OPC model. The designed layout may be corrected or biased, based on the predicted result. Based on the corrected layout, image patterns may be formed on the photomask 1400, and in the case where the photomask 1400 is manufactured by this method, the photoresist patterns may be formed in desired shapes on the substrate SUB.

A layout of a semiconductor device may include a plurality of layers. In some example embodiments, the OPC step may be performed to correct a layout for each of the layers. In other words, the OPC step may be independently performed on each of the plurality of layers. A semiconductor device may be fabricated by forming the plurality of layers on a substrate through a semiconductor process. As an example, a semiconductor device may include a plurality of metal layers, which are stacked to realize a specific circuit.

Figure 4:
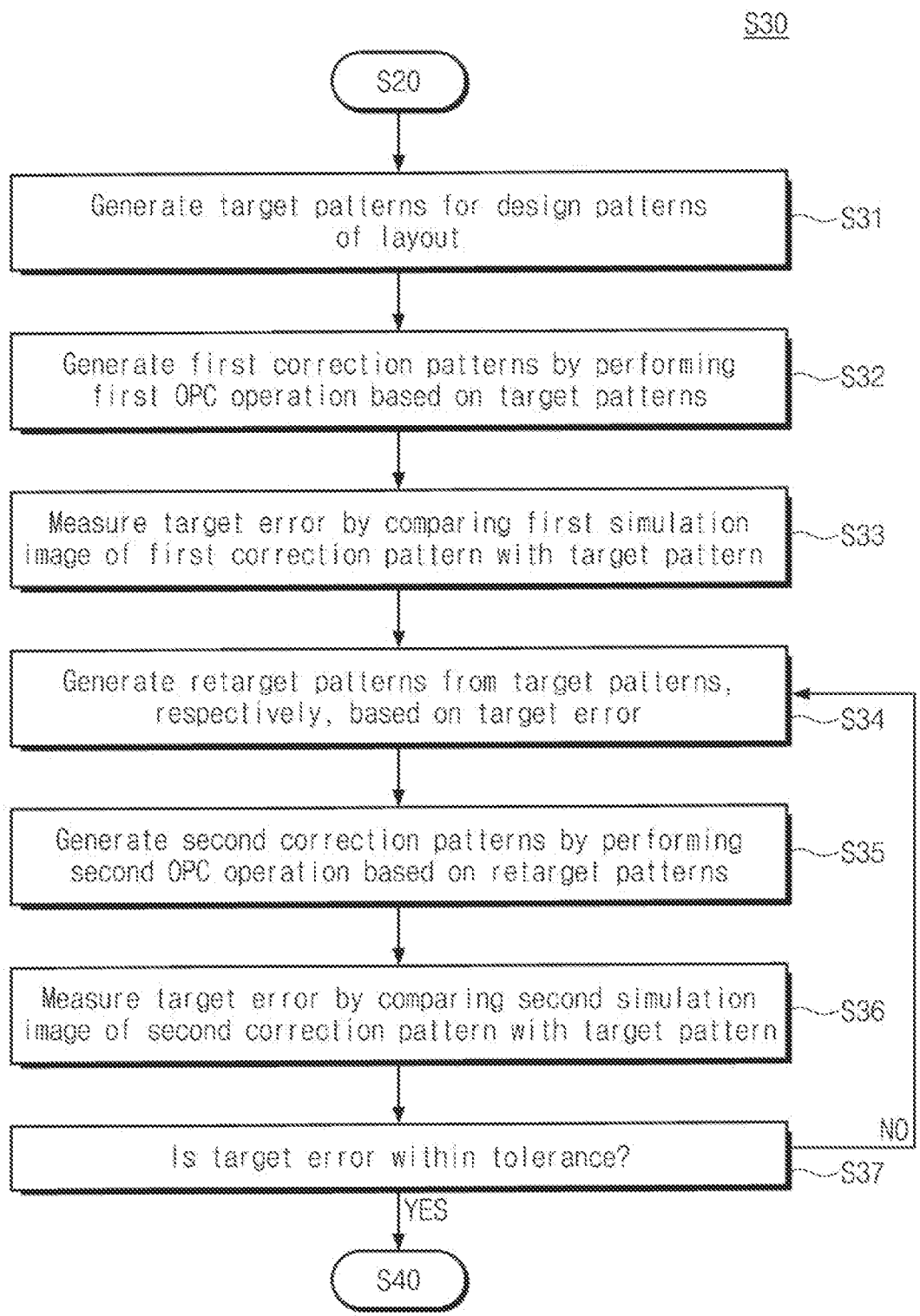
FIG. 4 is a flow chart schematically illustrating some steps in an optical proximity correction process according to an example embodiment.

FIG. 4 is a flow chart schematically illustrating some steps in an optical proximity correction process according to an example embodiment. FIGS. 5, 6, 7, 9, 11, and 13 are layout diagrams illustrating the optical proximity correction process of FIG. 4. FIGS. 8, 10, 12, and 14 are enlarged plan views illustrating regions M of FIGS. 7, 9, 11 and 13, respectively.

Figure 5:
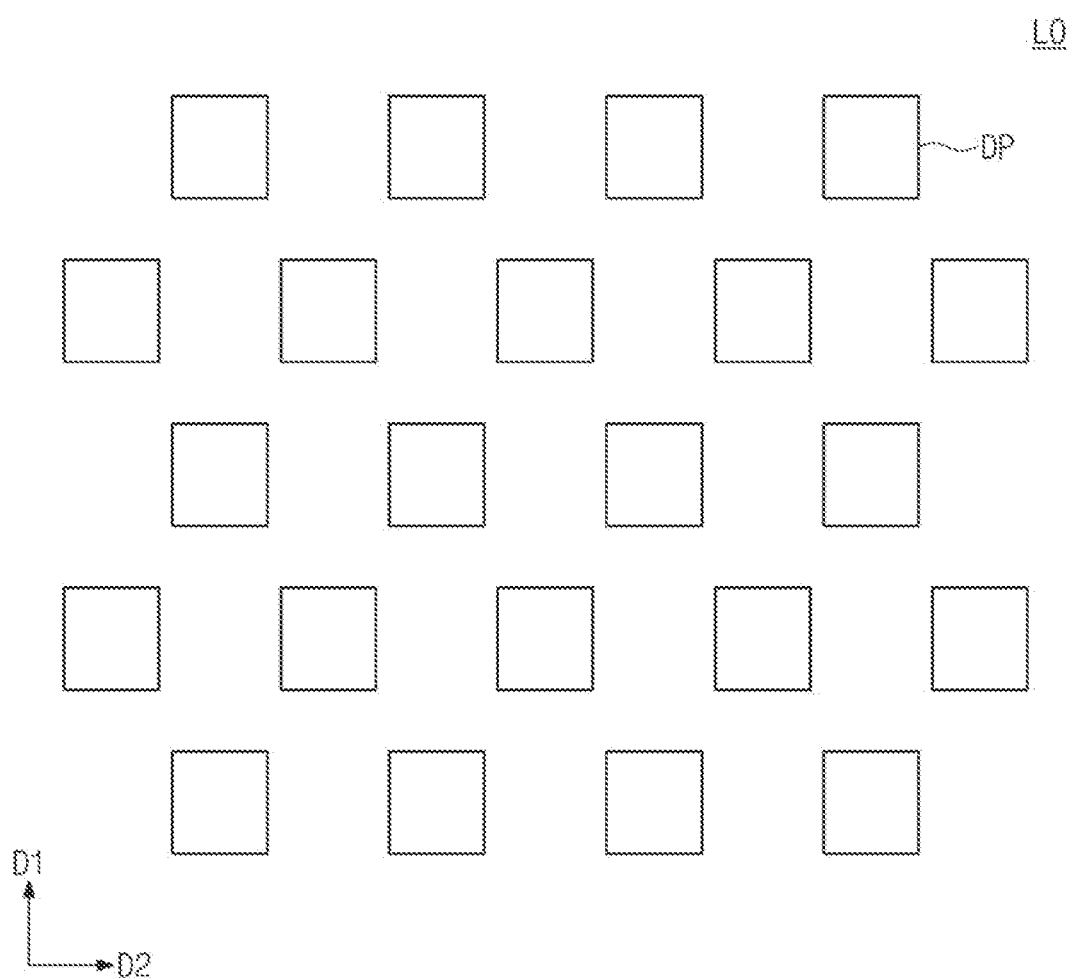
FIGS. 5, 6, 7, 9, 11, and 13 are layout diagrams illustrating the optical proximity correction process of FIG. 4.

Referring to FIGS. 4 and 5, a layout LO may be generated by the layout design process S20 previously described with reference to FIG. 2. The layout LO may be a layout for a single layer. For example, the layout LO of FIG. 5 may be a layout defining channel holes, which will be formed in a three-dimensional semiconductor memory device (e.g., a vertical NAND (VNAND) device).

The layout LO may include a plurality of design patterns DP. In an example embodiment, the design patterns DP may have the same shape and the same size. Alternatively, the design patterns DP may have shapes and sizes that are different from each other.

Figure 6:
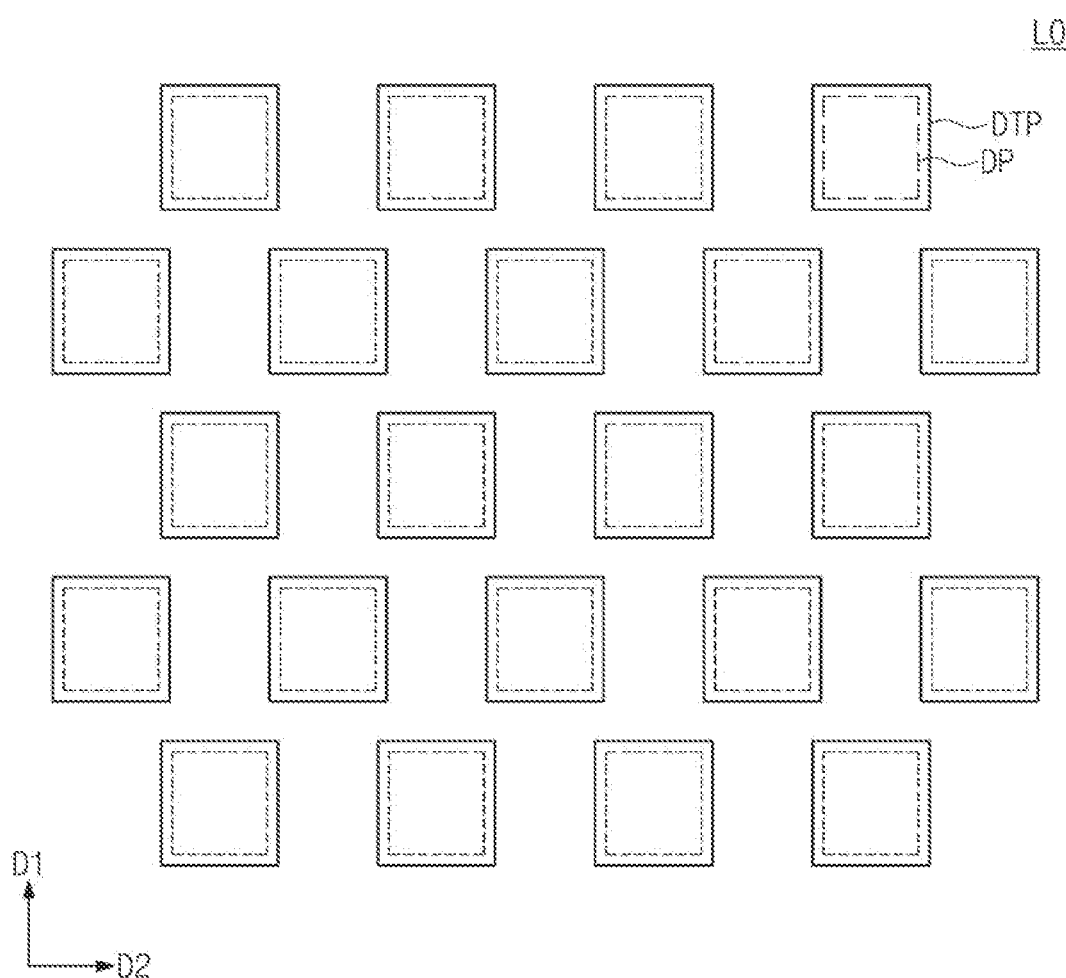

Referring to FIGS. 4 and 6, target patterns DTP may be generated for each of the design patterns DP, respectively (in S31). The target pattern DTP may be generated from (i.e., based on) a corresponding design pattern DP through a table-driven layout operation (TDLO). The target pattern DTP may be generated to define a size of a photoresist pattern, which will be formed by developing a photoresist layer during a photolithography process. That is, the target pattern DTP may be generated to define a desired size of the photoresist pattern which will be actually formed by the developing step.

According to an example embodiment, the design pattern DP may define a size of a final pattern, which will be formed in an etching target layer below the photoresist pattern. The final pattern, which will be formed in the etching target layer, may have a size that is smaller than the size of the photoresist pattern formed by the photolithography process. This is because the etching target layer is formed to have an inclined etching profile when it is etched using the photoresist pattern as an etch mask. In sum, the generation of the target pattern DTP (in S31) may be a process that is performed to correct a difference in size between a photoresist pattern formed by developing a photoresist layer and a final pattern formed in an etching target layer.

Figure 7:
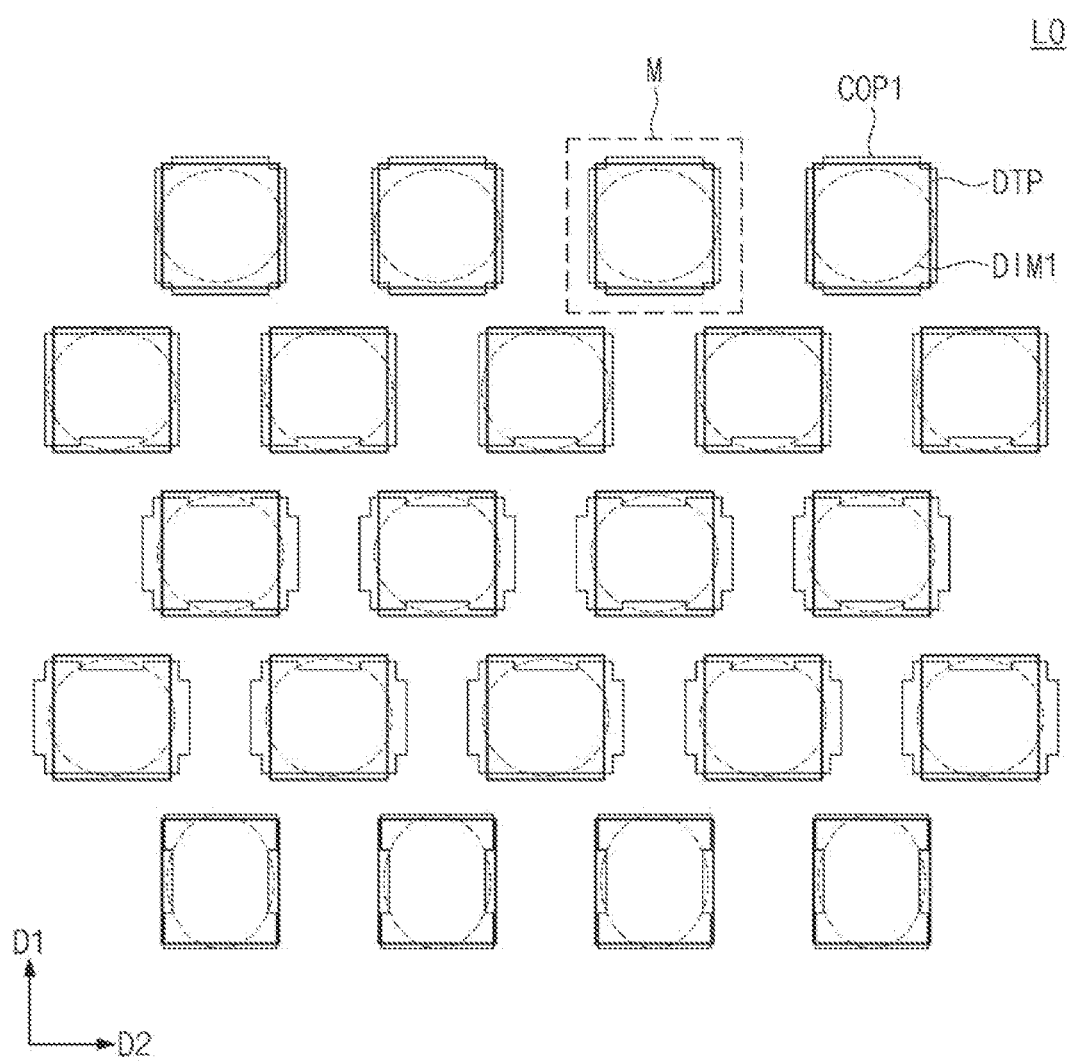

Referring to FIGS. 4 and 7, a first OPC operation may be performed on the design patterns DP to generate first correction patterns COP1 (in S32). The first OPC operation may be performed under a mask rule. The mask rule may be prepared to define the minimum distance between image patterns, which will be formed in the photomask 1400 of FIG. 3.

In detail, the first correction pattern COP1 may be generated for each of the design patterns DP, based on the previously-generated target pattern DTP. The first correction pattern COP1 may have a first simulation image DIM1, which is generated through a simulation process using an OPC model. In the OPC simulation process, the first correction pattern COP1 may be generated to obtain the first simulation image DIM1 maximally conforming to the target pattern DTP in its size and position. During the first OPC operation, the first correction patterns COP1 may be generated to meet the mask rule defining the minimum distance between the first correction patterns COP1.

A target error may be measured by comparing the first simulation image DIM1 of each of the first correction patterns COP1 with the target pattern DTP corresponding thereto (in S33). In detail, referring to FIG. 8, the target pattern DTP may include a first edge ED1, a second edge ED2, a third edge ED3, and a fourth edge ED4. The first edge ED1 and the second edge ED2 may be opposite to each other in a second direction D2, and the third edge ED3 and the fourth edge ED4 may be opposite to each other in a first direction D1. The first to fourth edges ED1, ED2, ED3, and ED4 may be connected to each other, such that the target pattern DTP has a rectangular shape.

The target error may be measured on each of the first to fourth edges ED1, ED2, ED3, and ED4. For example, considering distances between adjacent ones of the target patterns DTP and between the target pattern DTP and a line end adjacent thereto, the first OPC operation may be performed under the mask rule. Thus, under the condition satisfying the mask rule, the first simulation image DIM1 may be generated to be offset from a center of the target pattern DTP corresponding thereto according to the mask rule. In addition, the first simulation image DIM1 may be generated to be larger or smaller than the target pattern DTP corresponding thereto according to the mask rule.

In such a case where the first simulation image DIM1 is offset from the target pattern DTP or is larger or smaller than the target pattern DTP, there may be a target error on each of the first to fourth edges ED1, ED2, ED3, and ED4. The target error may be an edge placement error. The target error may include first to fourth target errors EPE1, EPE2, EPE3, and EPE4, which occur on the first to fourth edges ED1, ED2, ED3, and ED4, respectively.

Figure 8:
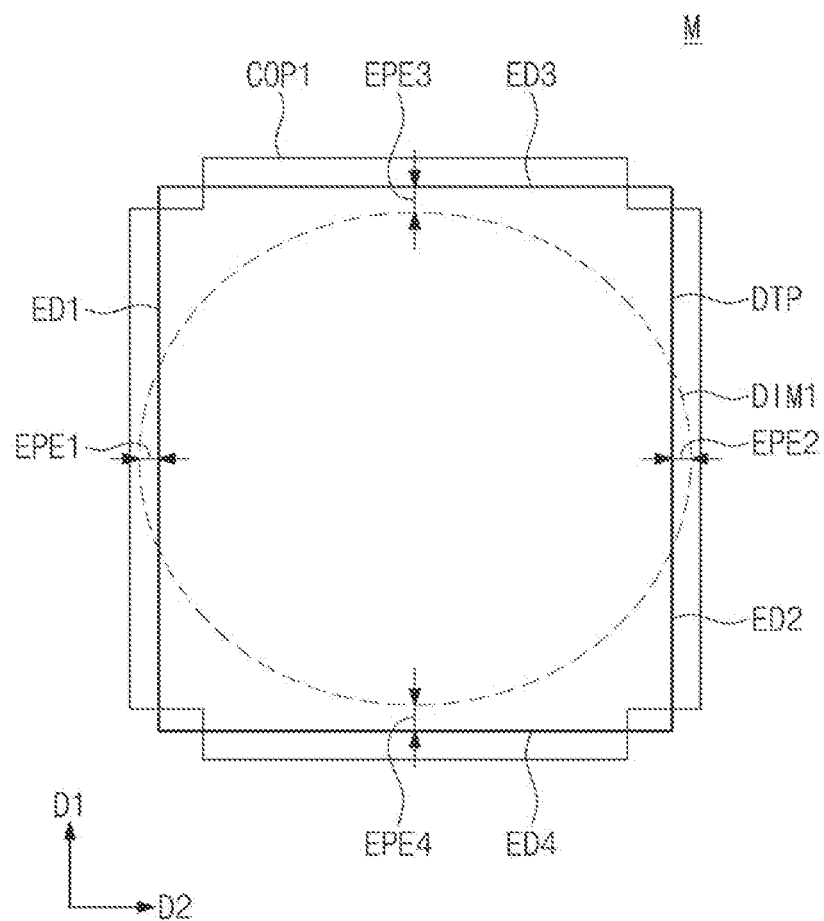
FIGS. 8, 10, 12, and 14 are enlarged plan views illustrating regions M of FIGS. 7, 9, 11 and 13, respectively.

As shown in FIG. 8 for example, the first target error EPE1 may mean the minimum distance between the first edge ED1 of the target pattern DTP and the first simulation image DIM1. The second target error EPE2 may mean the minimum distance between the second edge ED2 of the target pattern DTP and the first simulation image DIM1. The third target error EPE3 may mean the minimum distance between the third edge ED3 of the target pattern DTP and the first simulation image DIM1. The fourth target error EPE4 may mean the minimum distance between the fourth edge ED4 of the target pattern DTP and the first simulation image DIM1.

The target error EPE1, EPE2, EPE3, or EPE4 may have a positive value or a negative value. In the case where at least a portion of the first simulation image DIM1 is located in a region beyond the edge (i.e., outside) of the target pattern DTP, the target error may have a positive value. In the case where the first simulation image DIM1 is confined within the target pattern DTP, the target error may have a negative value. For example, the first target error EPE1 may be 1.7 nm, the second target error EPE2 may be 1.4 nm, the third target error EPE3 may be −1.4 nm, and the fourth target error EPE4 may be −1.5 nm.

Figure 9:
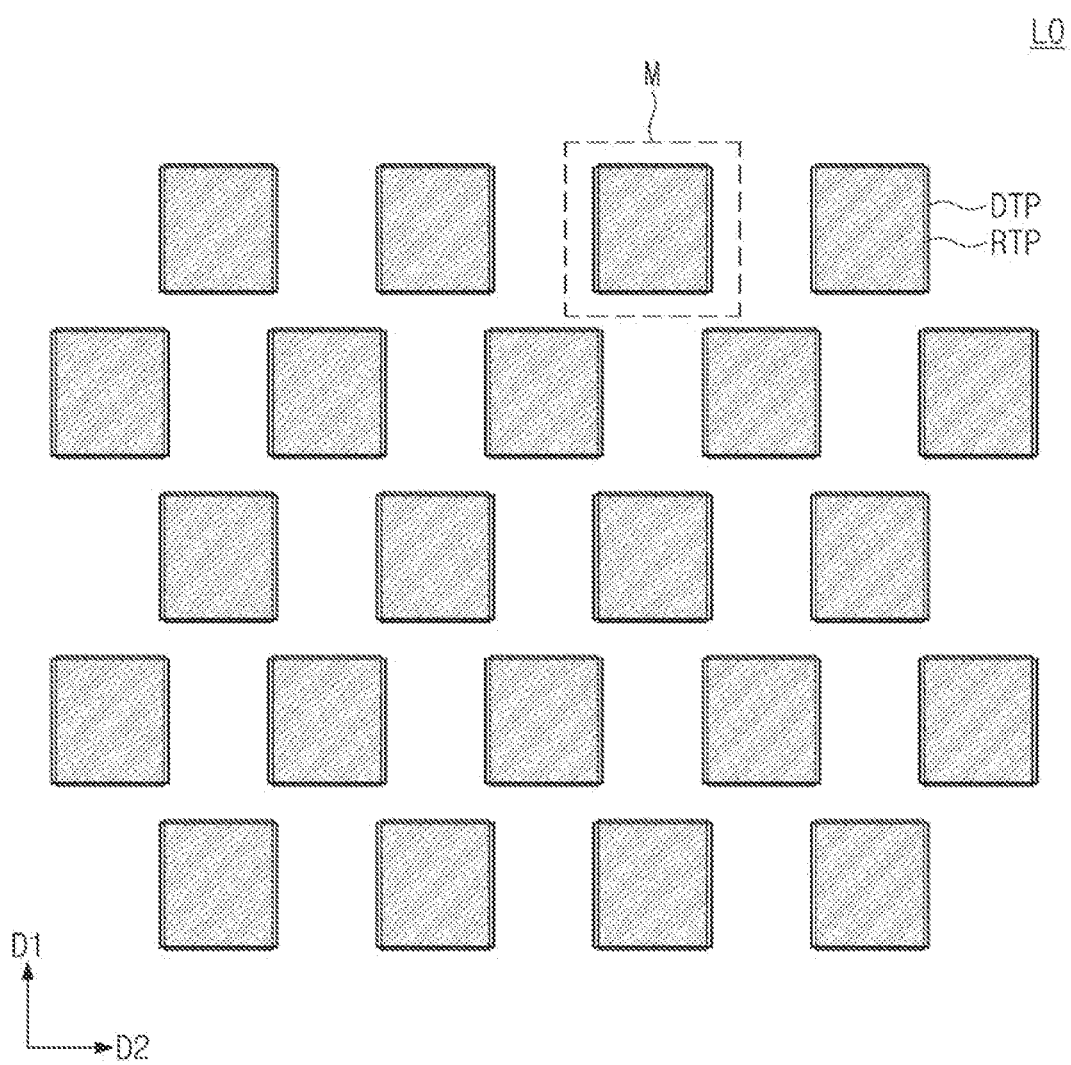

Referring to FIGS. 4 and 9, retarget patterns RTP may be generated from the target patterns DTP, based on the measured target error (in S34). The retarget pattern RTP may be new target pattern which is corrected in consideration of the above measured target error.

Figure 10:
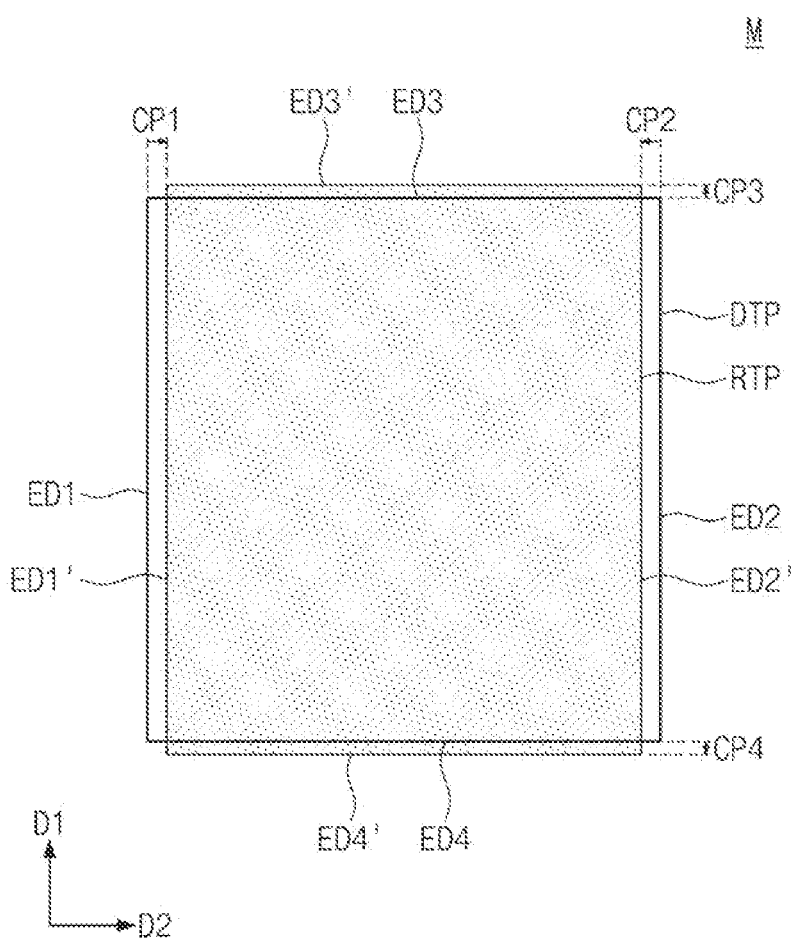

In detail, referring to FIG. 10, the first to fourth edges ED1, ED2, ED3, and ED4 of each target pattern DTP may be biased to generate the retarget pattern RTP. A first retarget edge EDF of the retarget pattern RTP may be generated by compensating the first edge ED1 of the target pattern DTP by the first target error EPE1. The first retarget edge ED1' may be spaced apart from the first edge ED1 by a first compensation value CP1, which is the opposite value of the first target error EPE1. In the case where the first target error EPE1 is 1.7 nm as described above, the first compensation value CP1 may be −1.7 nm, and thus, the first retarget edge EDF may be spaced apart from the first edge ED1 by −1.7 nm.

Similar to the first edge ED1 and the first retarget edge ED1', a second retarget edge ED2' may be generated by compensating the second edge ED2 by a second compensation value CP2. The second compensation value CP2 may be −1.4 nm that is the opposite value of the second target error EPE2.

A third retarget edge ED3' may be generated by compensating the third edge ED3 by a third compensation value CP3. The third compensation value CP3 may be 1.4 nm that is the opposite value of the third target error EPE3.

A fourth retarget edge ED4' may be generated by compensating the fourth edge ED4 by a fourth compensation value CP4. The fourth compensation value CP4 may be 1.5 nm that is the opposite value of the fourth target error EPE4.

The first to fourth retarget edges ED1', ED2', ED3', and ED4' may be connected to constitute the retarget pattern RTP. The retarget pattern RTP may have a rectangular shape. The retarget pattern RTP may be offset from the center of the target pattern DTP. The retarget pattern RTP may have a different size from the target pattern DTP.

Figure 11:
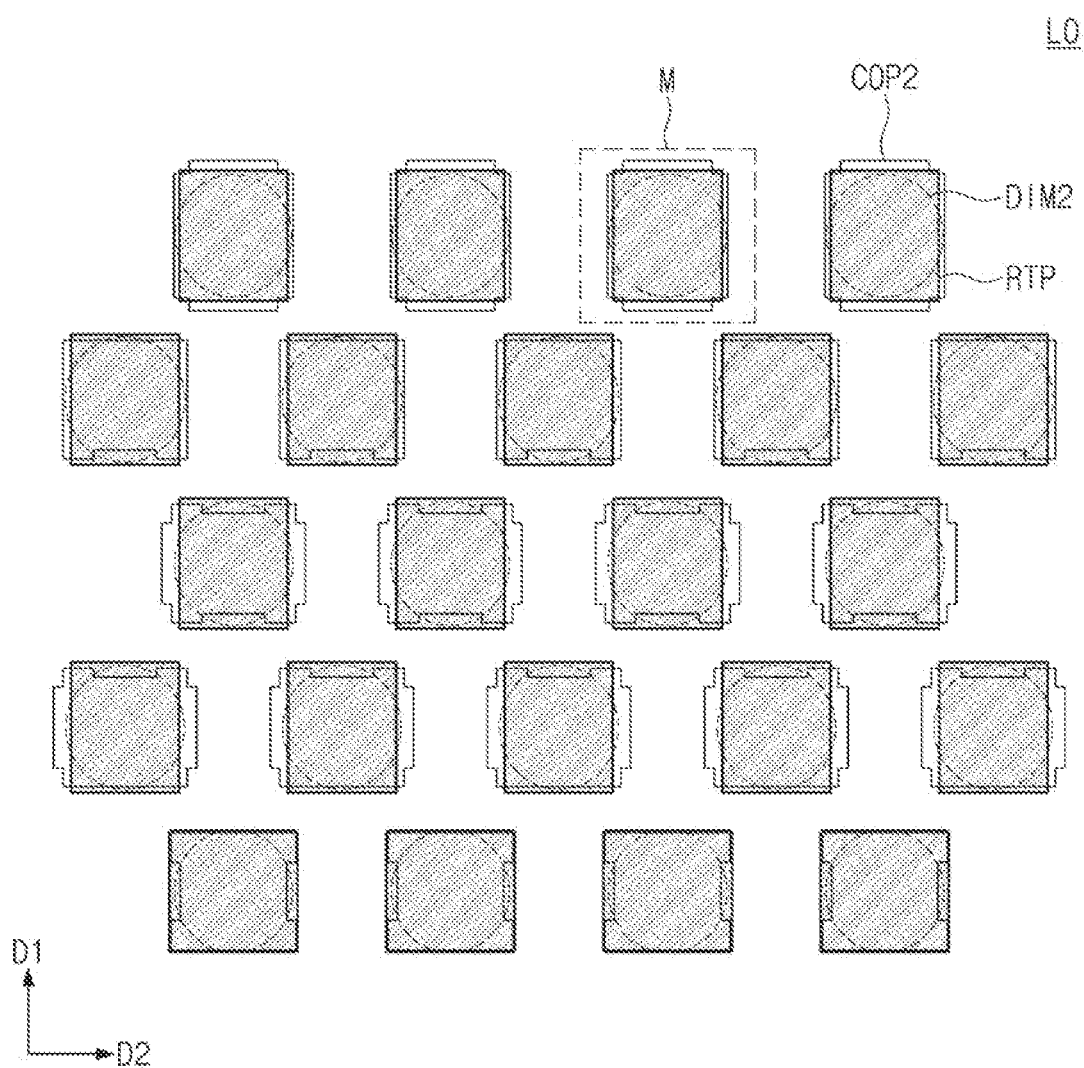

Referring to FIGS. 4 and 11, a second OPC operation may be performed on the design patterns DP to generate second correction patterns COP2 (in S35). However, unlike the first OPC operation described above, the second OPC operation may generate the second correction pattern COP2, based on the retarget pattern RTP, not the target pattern DTP.

Figure 12:
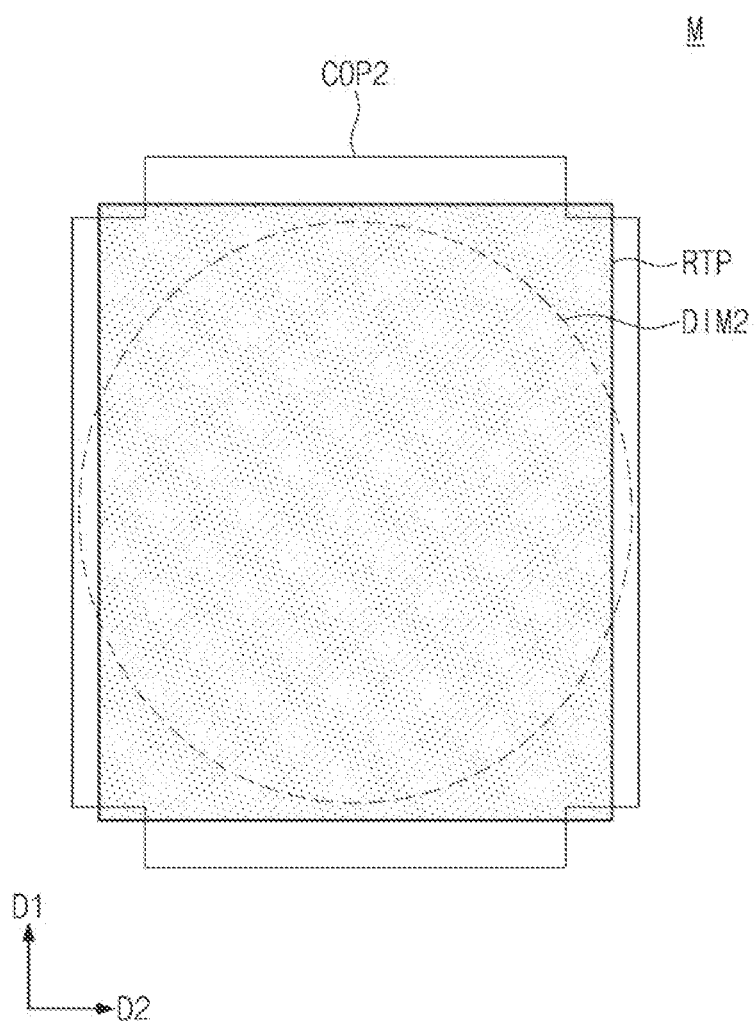

In detail, referring to FIG. 12, the second correction pattern COP2 may have a second simulation image DIM2, which is generated through a simulation process using an OPC model. In the OPC simulation process, the second correction pattern COP2 may be generated to obtain the second simulation image DIM2 maximally conforming to the retarget pattern RTP in its size and position. During the second OPC operation, the second correction patterns COP2 may be generated to meet the mask rule defining the minimum distance between the second correction patterns COP2.

Figure 13:
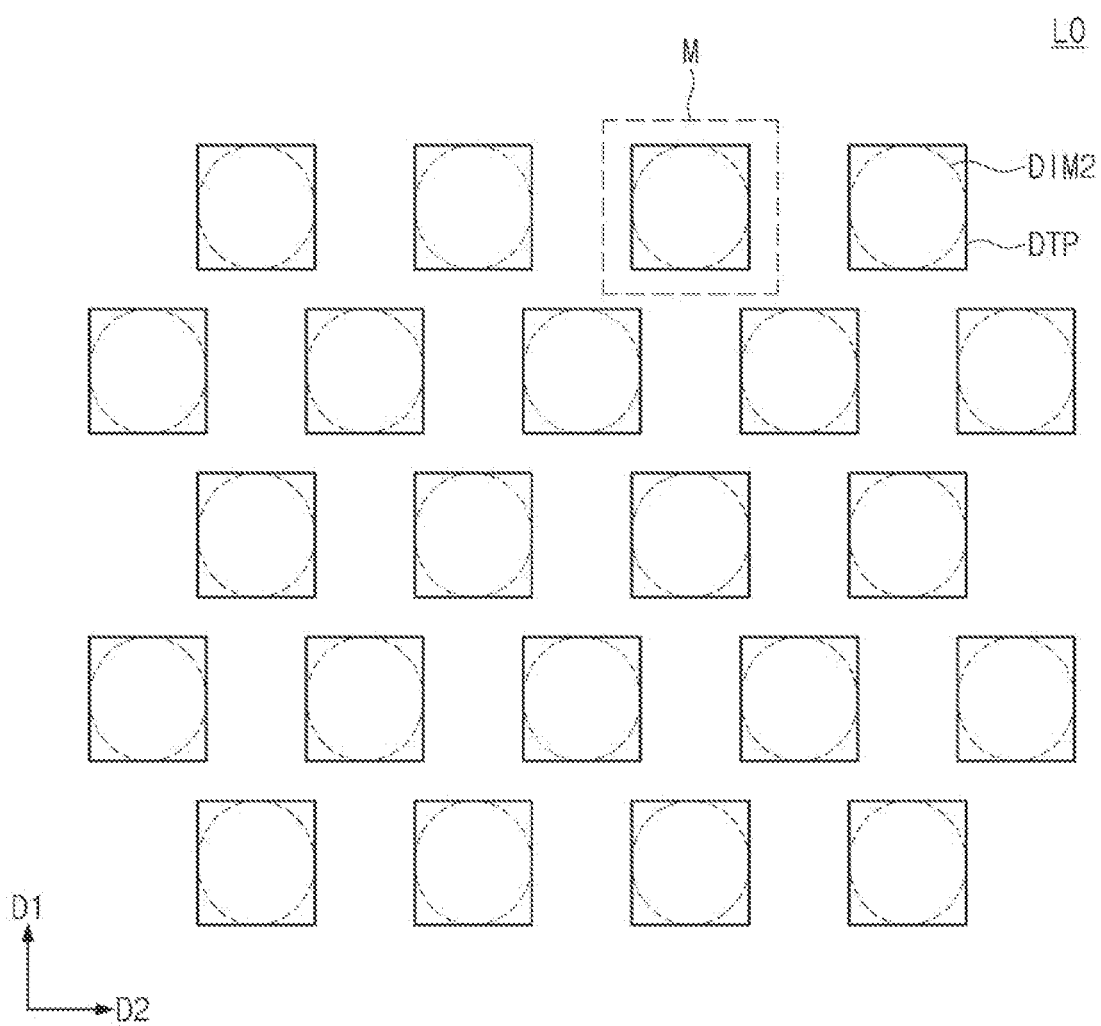

Referring to FIGS. 4 and 13, a target error may be measured by comparing the second simulation image DIM2 of each of the second correction patterns COP2 with the target pattern DTP corresponding thereto (in S36).

Figure 14:
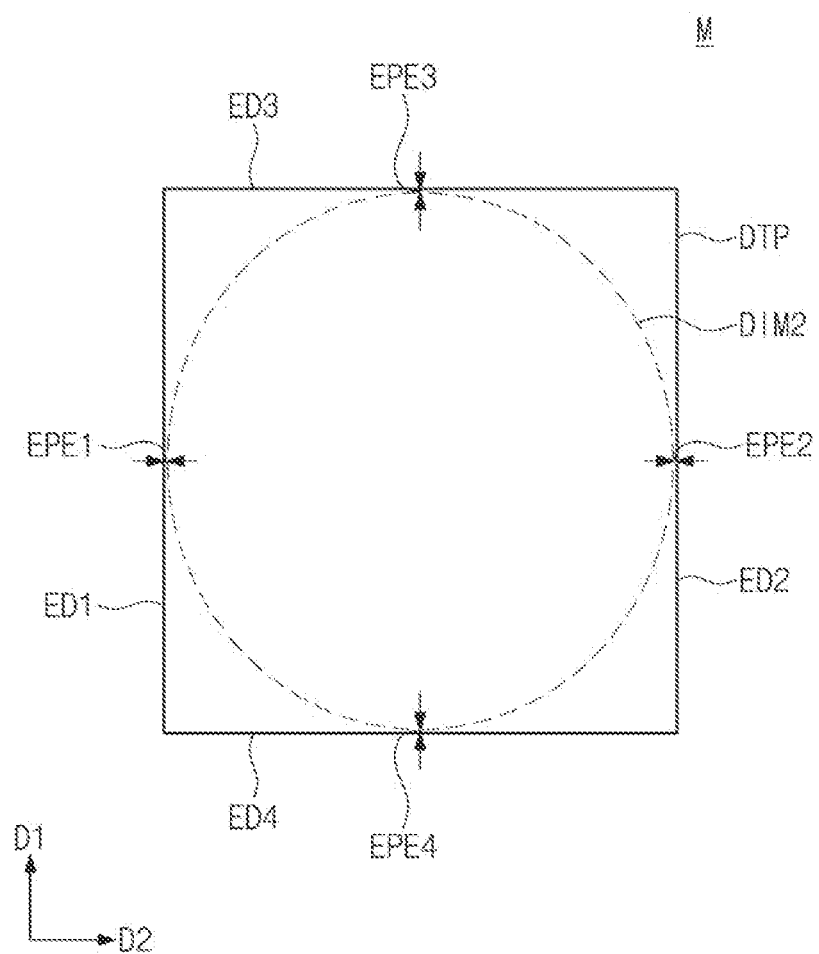

In detail, referring to FIG. 14, first to fourth target errors EPE1, EPE2, EPE3, and EPE4 may be respectively measured on the first to fourth edges ED1, ED2, ED3, and ED4 of the target pattern DTP. The target error may be measured as the minimum distance between the edge ED1, ED2, ED3, or ED4 and the second simulation image DIM2. For example, the first target error EPE1 may be 0.015 nm, the second target error EPE2 may be 0.015 nm, the third target error EPE3 may be −0.020 nm, and the fourth target error EPE4 may be −0.008 nm.

It may be examined whether the measured value of each of the first to fourth target errors EPE1 to EPE4 is within an error tolerance (in S37). This may be achieved by examining whether a value of the target error is less than a layout database unit (dbu) which is the minimum unit of the OPC tool (e.g., see 34 of FIG. 1).

For example, in the case where the minimum unit (dbu) of the OPC tool in use is 0.05 nm, each of the measured values of the first to fourth target errors EPE1-EPE4 mentioned above may be smaller than 0.05 nm. Thus, all of the first to fourth target errors EPE1-EPE4 may be determined to be within the error tolerance. If the edges of all of the second simulation images DIM2 shown in FIG. 13 meet the requirement for the error tolerance, the OPC process may be terminated, and the second correction patterns COP2 at that point in time may be determined as final OPC patterns.

As another example, in the case where the minimum unit (dbu) of the OPC tool in use is 0.01 nm, among the measured values of the first to fourth target errors EPE1-EPE4 mentioned above, the first to third target errors EPE1, EPE2, and EPE3 may be larger than the minimum unit of 0.01 nm. In this case, an additional retarget pattern may be generated from the retarget pattern RTP, based on the measured target error (in S34). Thereafter, steps of generating a third (i.e., additional) correction pattern (in S35) and measuring an additional target error (in S36) may be performed again through a third OPC operation. The above steps may be repeated until target errors for all of the edges is smaller than the layout database unit (dbu). In other words, the aforedescribed steps of S34 to S36 may be iteratively performed until the target errors for all of the edges is smaller than the layout database unit (dbu). A result, in which the target errors are smaller than the layout database unit (dbu) and are the smallest values, may be chosen as 'Best EPE RMS' and may be extracted as a 'Cell retarget DB'.

Figure 15:
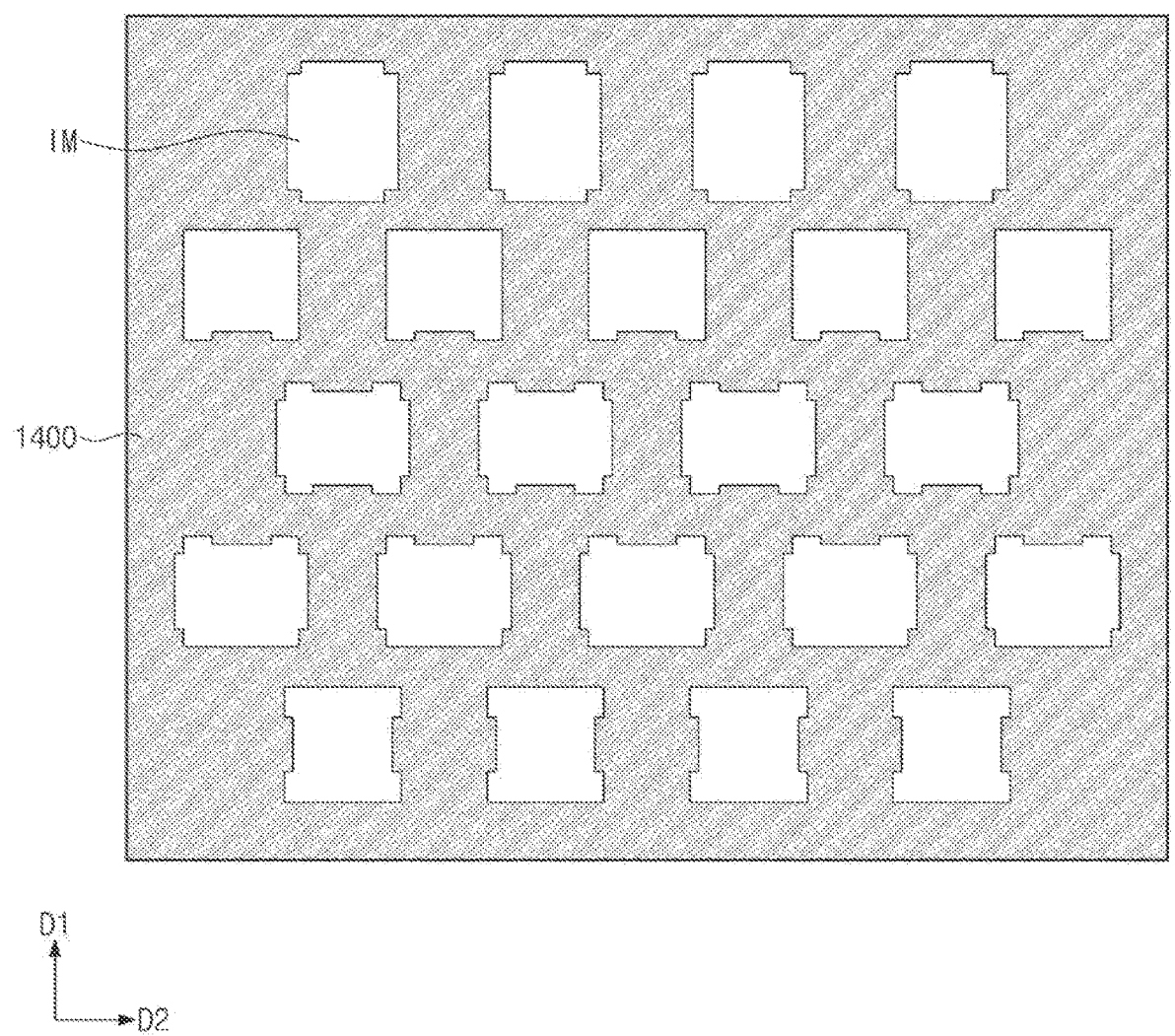
FIG. 15 is a plan view illustrating a photomask according to an example embodiment.

FIG. 15 is a plan view illustrating a photomask according to an example embodiment. Referring to FIGS. 2 and 15, the photomask 1400 may be manufactured based on the final OPC patterns (e.g., the second correction patterns COP2 of FIG. 11) (in S40). The photomask 1400 may include image patterns IM. The image patterns IM may be image patterns that are formed according to the second correction patterns COP2 previously described with reference to FIG. 11.

The photomask 1400 may include a transparent region and an opaque region. The opaque region may be configured to prevent the light from passing therethrough. By contrast, the transparent region may be configured to allow light, which is incident from the light source 1200 of FIG. 3, to pass therethrough. Light passing through the photomask 1400 may be irradiated onto the substrate SUB of FIG. 3. For example, when the photolithography process is performed using a negative-type photoresist, the image patterns IM may be the transparent region of the photomask 1400.

Figure 16:
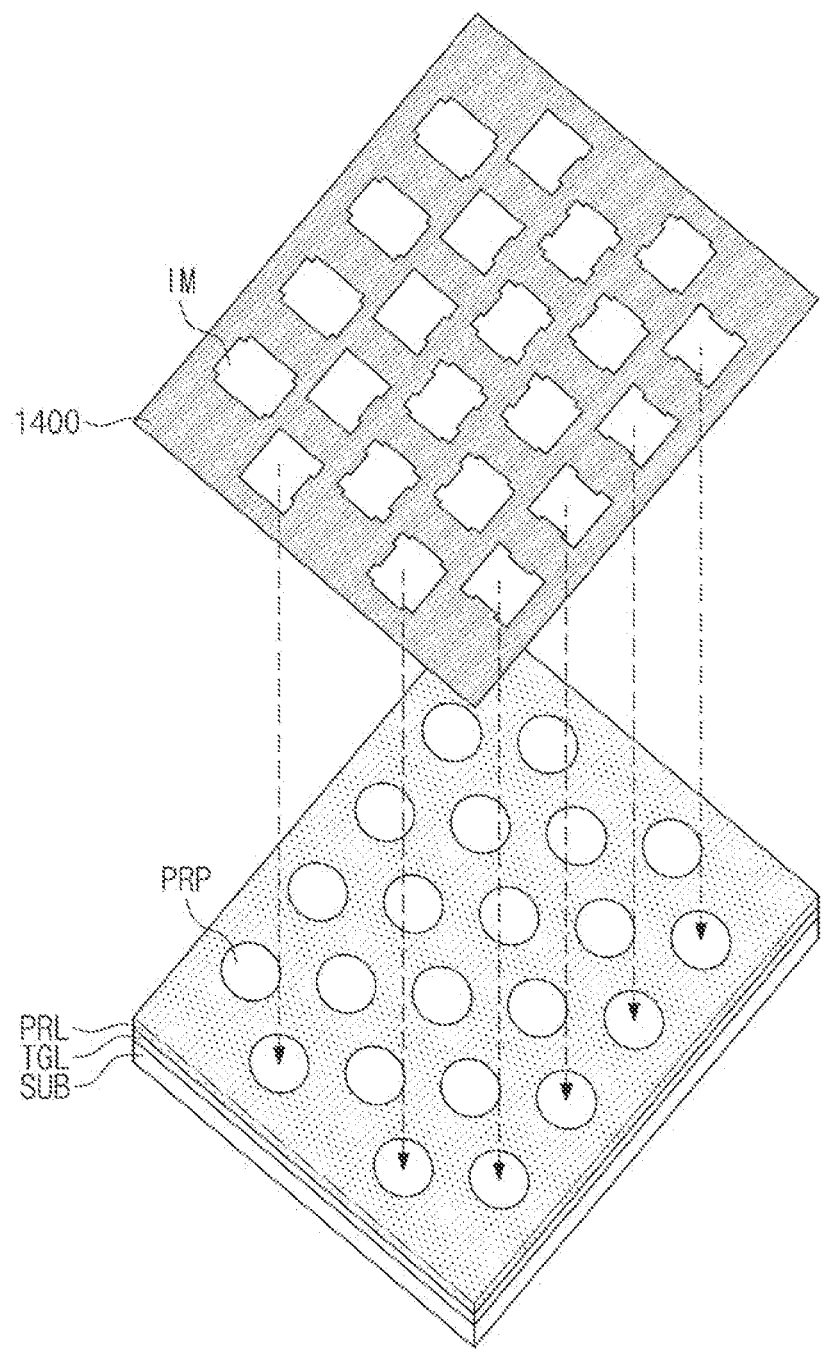
FIG. 16 is a conceptual diagram schematically illustrating a method of forming photoresist patterns on a substrate using the photomask of FIG. 15.

FIG. 16 is a conceptual diagram schematically illustrating a method of forming photoresist patterns on a substrate using the photomask of FIG. 15. Referring to FIG. 16, the light source 1200 of FIG. 3 may emit light toward the photomask 1400. The emitted light may pass through the transparent region of the image patterns IM and may be irradiated onto a photoresist layer PRL on the substrate SUB (e.g., through an exposure process). A region of the photoresist layer PRL, onto which the light is irradiated, may become a photoresist pattern PRP. The photoresist patterns PRP may be formed to have the same shapes and sizes as those of the second simulation images DIM2 previously described with reference to FIGS. 11 and 13.

In a subsequent developing process, all regions of the photoresist layer PRL other than the photoresist patterns PRP may be removed, and the photoresist patterns PRP may be left. An etching target layer TGL on the substrate SUB may be patterned using the photoresist patterns PRP as an etch mask. Thus, desired target patterns may be formed on the substrate SUB. As a result, a semiconductor device may be fabricated by forming target patterns in each layer using this method (in S50 of FIG. 2).

In the OPC method according to an example embodiment, the OPC process may be repeated until any target error does not substantially occur between all target patterns and all simulation patterns corresponding thereto (i.e., the target error is smaller than the layout database unit (dbu)). Accordingly, it may be possible to obtain OPC results with extremely high precision.

As an integration density of a semiconductor device increases, patterns on a cell region of a substrate may be formed to have an extremely fine pitch. Thus, if there is a small target error in an OPC process, the patterns may be abnormally formed on the cell region and this may lead to severe process defect. According to an example embodiment, the afore-described OPC method may make it possible to more precisely realize the fine patterns on the cell region of the substrate through a photolithography process, and thus, it may be possible to improve an integration density and a reliability property of a semiconductor device.

FIGS. 17, 19, 21, 23, 25, 27, 29, and 31 are plan views illustrating a method of fabricating a semiconductor device, according to an example embodiment. FIGS. 18A, 20A, 22A, 24A, 26A, 28A, 30A, and 32A are sectional views taken along lines A-A' of FIGS. 17, 19, 21, 23, 25, 27, 29, and 31, respectively. FIGS. 18B, 20B, 22B, 24B, 26B, 28B, 30B, and 32B are sectional views taken along lines B-B' of FIGS. 17, 19, 21, 23, 25, 27, 29, and 31, respectively. FIGS. 18C, 20C, 22C, 24C, 26C, 28C, 30C, and 32C are sectional views taken along lines C-C' of FIGS. 17, 19, 21, 23, 25, 27, 29, and 31, respectively. FIGS. 18D, 20D, 22D, 24D, 26D, 28D, 30D, and 32D are sectional views taken along lines D-D' of FIGS. 17, 19, 21, 23, 25, 27, 29, and 31, respectively.

Figure 17:
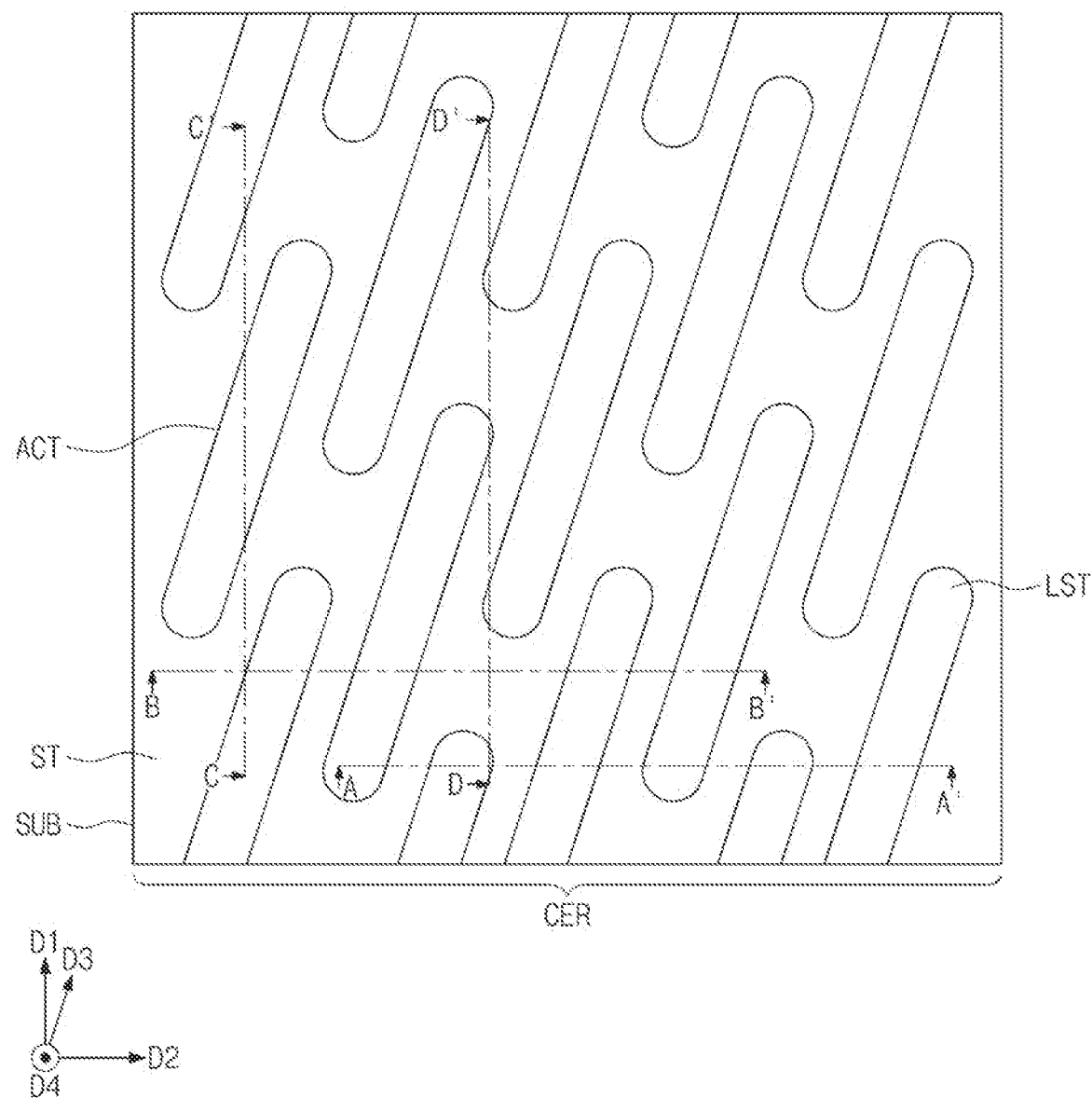
FIGS. 17, 19, 21, 23, 25, 27, 29, and 31 are plan views illustrating a method of fabricating a semiconductor device, according to an example embodiment.
Figure 18A:
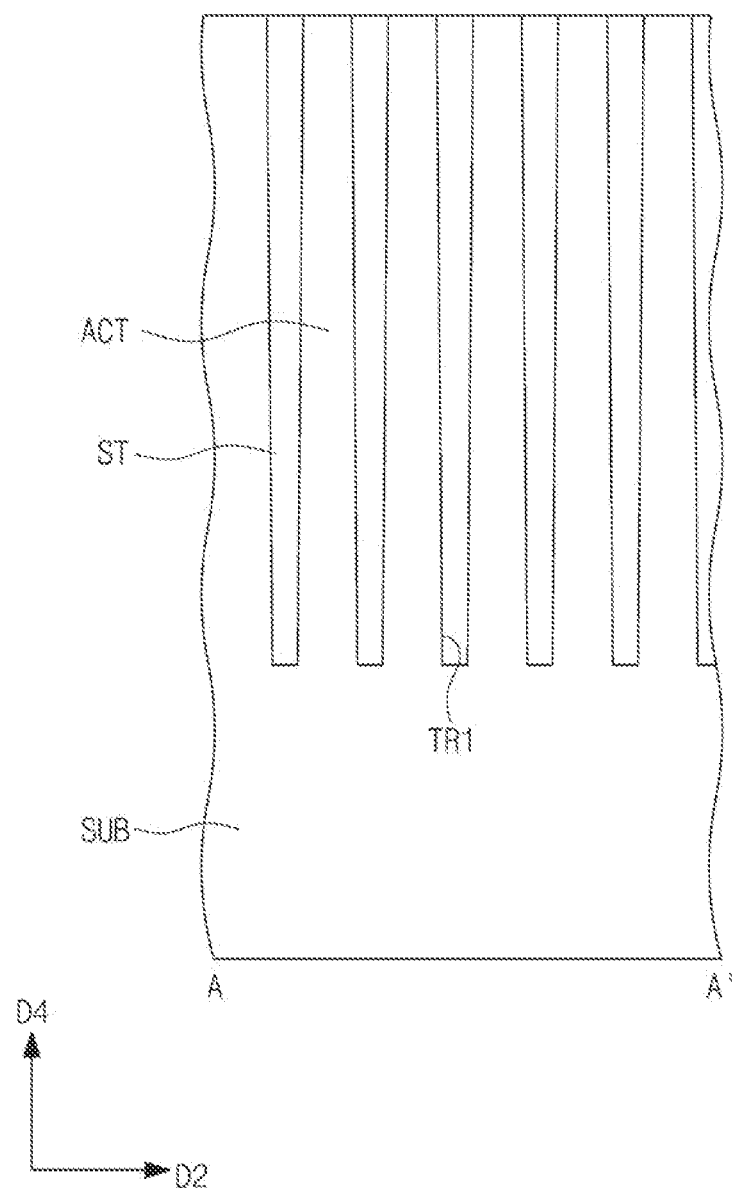
FIGS. 18A, 20A, 22A, 24A, 26A, 28A, 30A, and 32A are sectional views taken along lines A-A' of FIGS. 17, 19, 21, 23, 25, 27, 29, and 31, respectively.
Figure 18B:
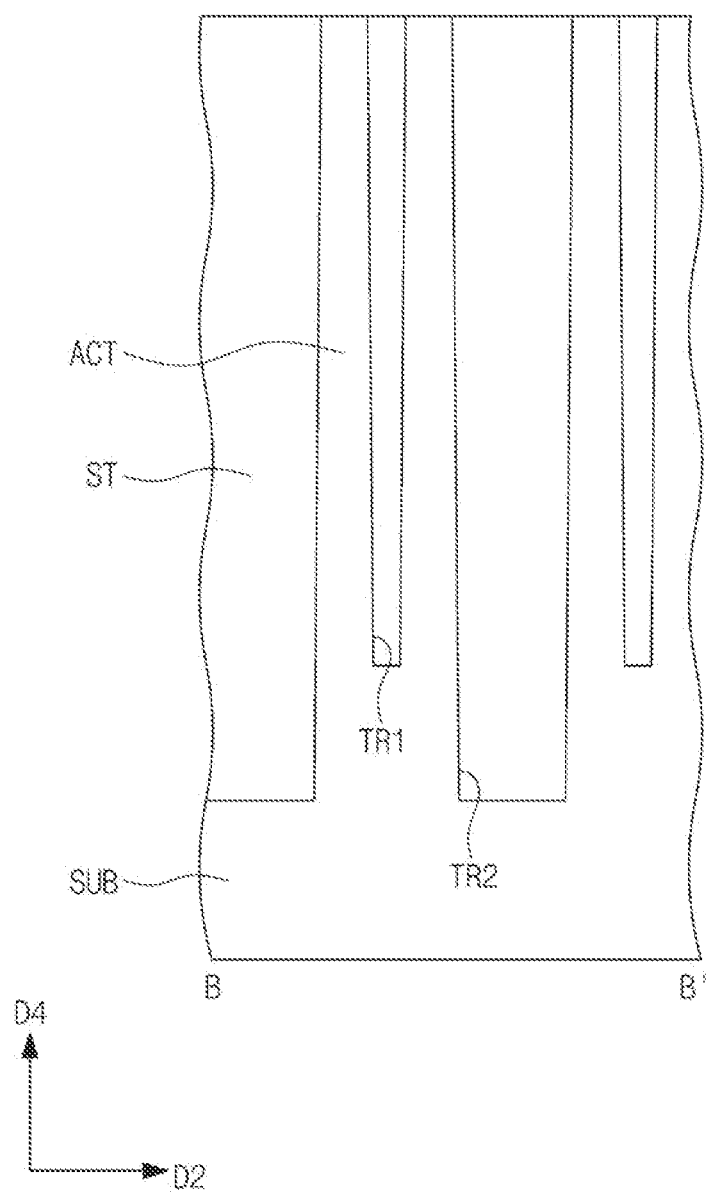
FIGS. 18B, 20B, 22B, 24B, 26B, 28B, 30B, and 32B are sectional views taken along lines B-B' of FIGS. 17, 19, 21, 23, 25, 27, 29, and 31, respectively.
Figure 18C:
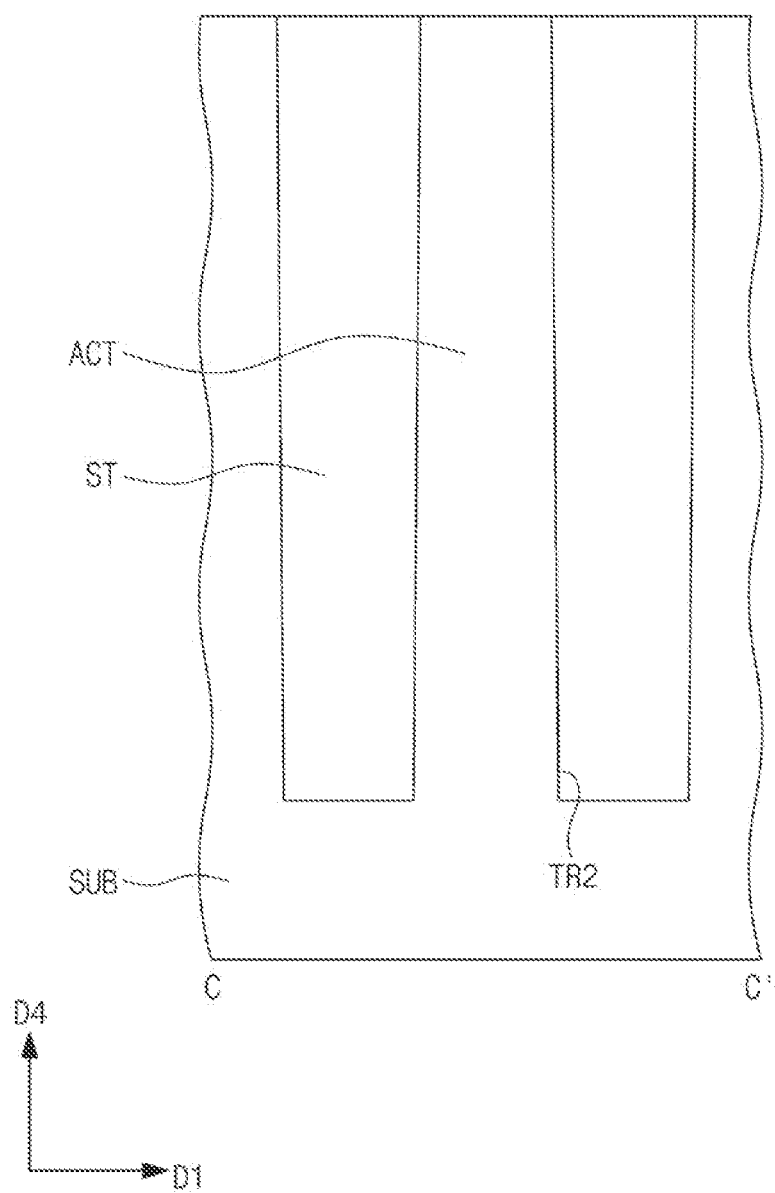
FIGS. 18C, 20C, 22C, 24C, 26C, 28C, 30C, and 32C are sectional views taken along lines C-C' of FIGS. 17, 19, 21, 23, 25, 27, 29, and 31, respectively.
Figure 18D:
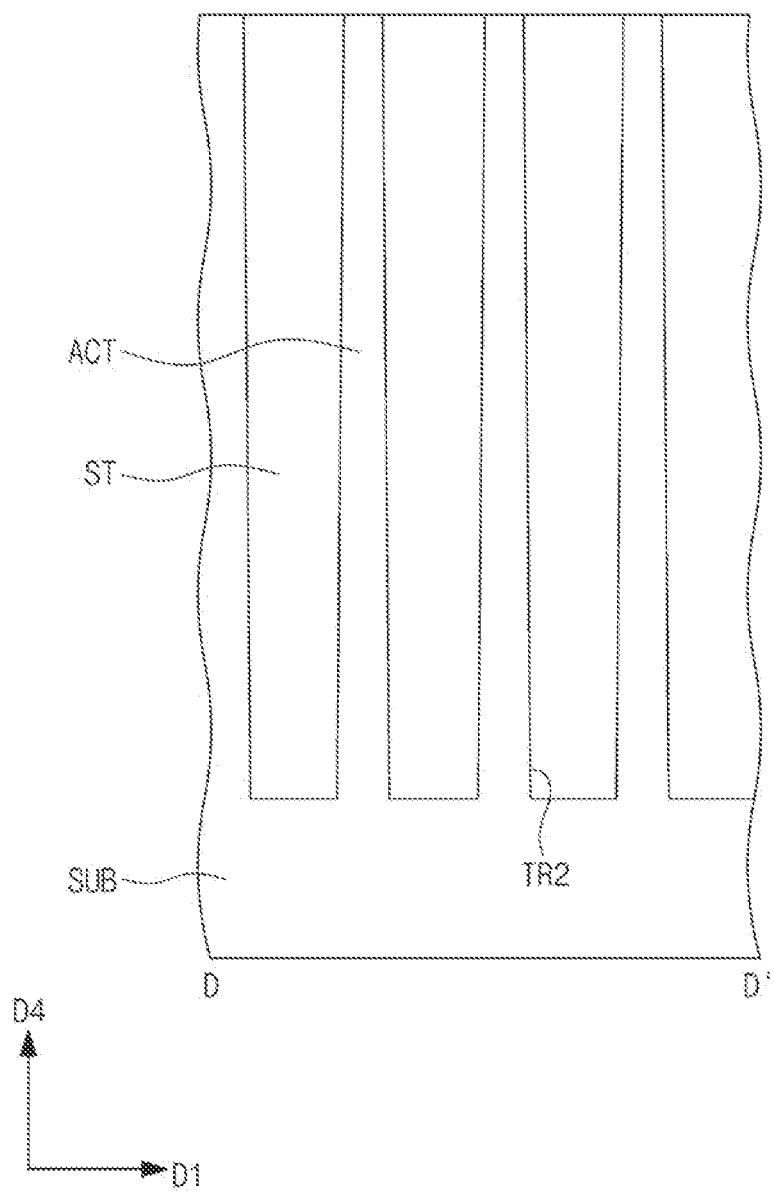
FIGS. 18D, 20D, 22D, 24D, 26D, 28D, 30D, and 32D are sectional views taken along lines D-D' of FIGS. 17, 19, 21, 23, 25, 27, 29, and 31, respectively.
Figure 19:
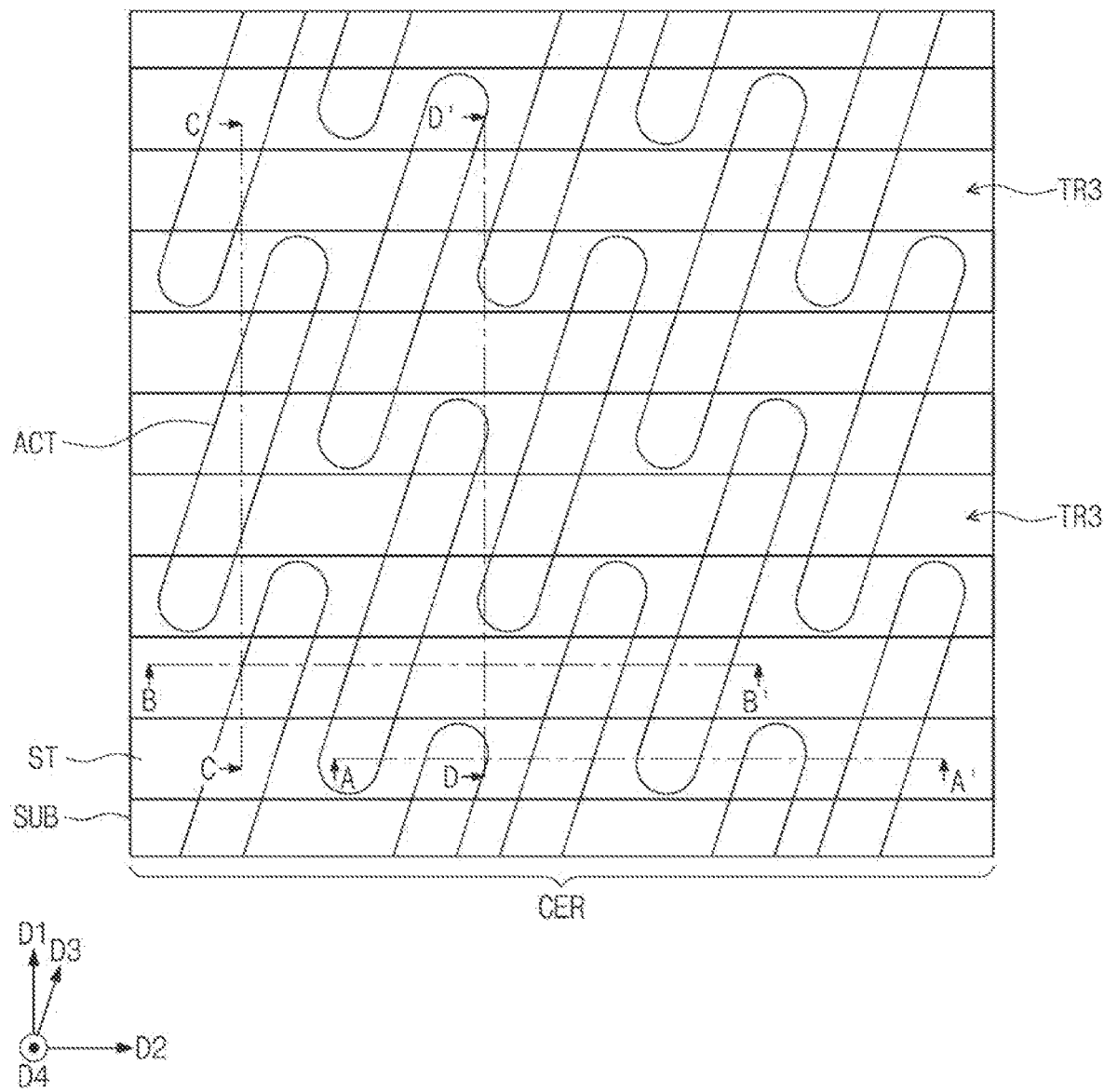
Figure 20A:
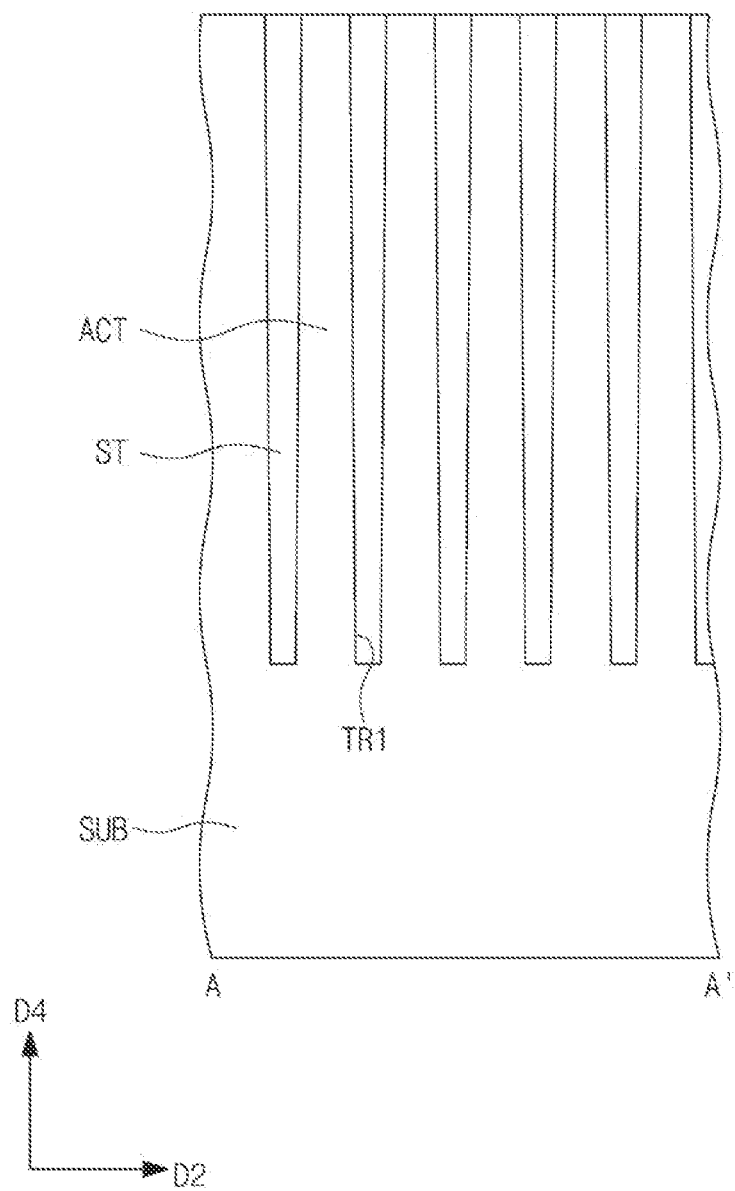
Figure 20B:
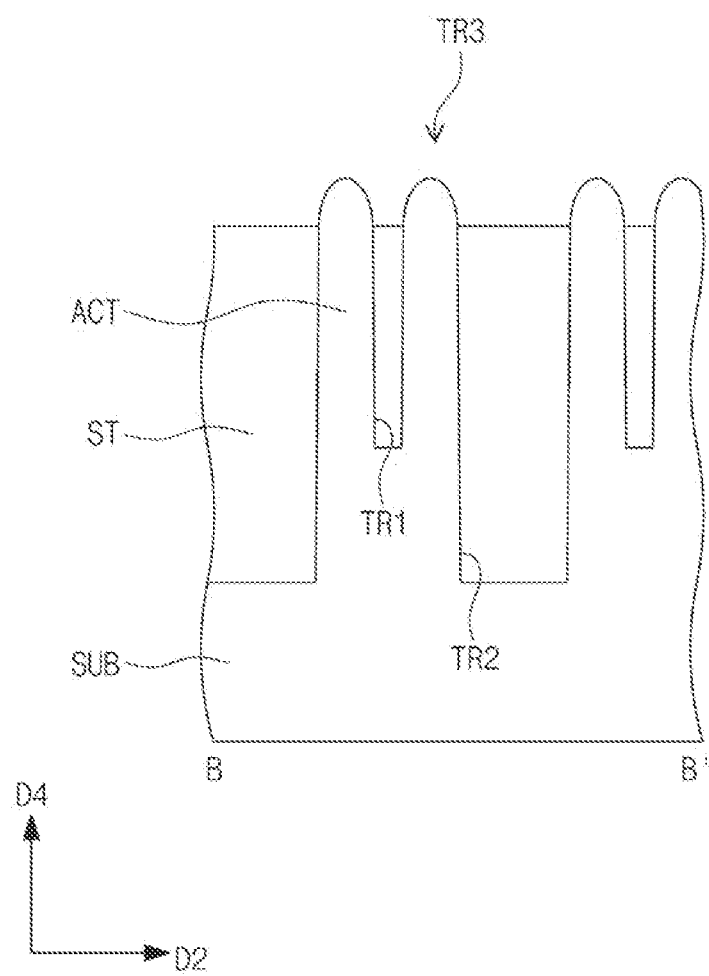
Figure 20C:
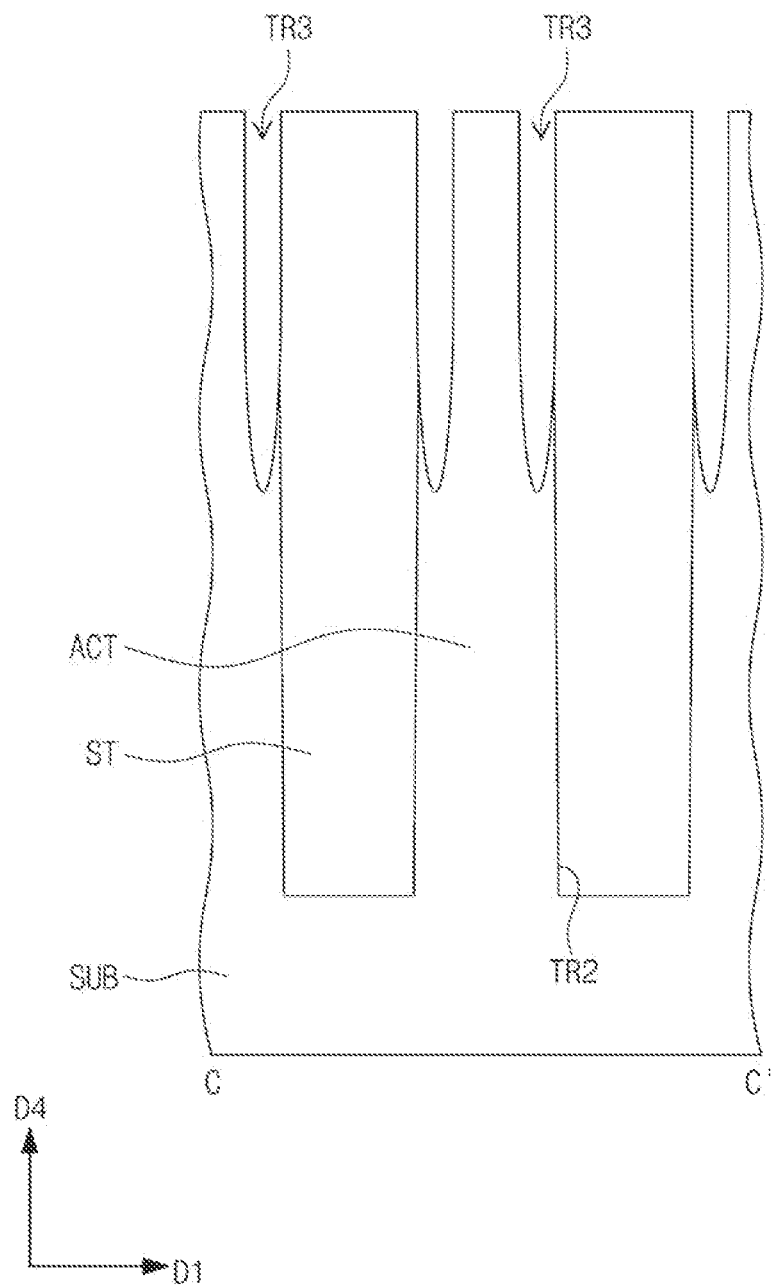
Figure 20D:
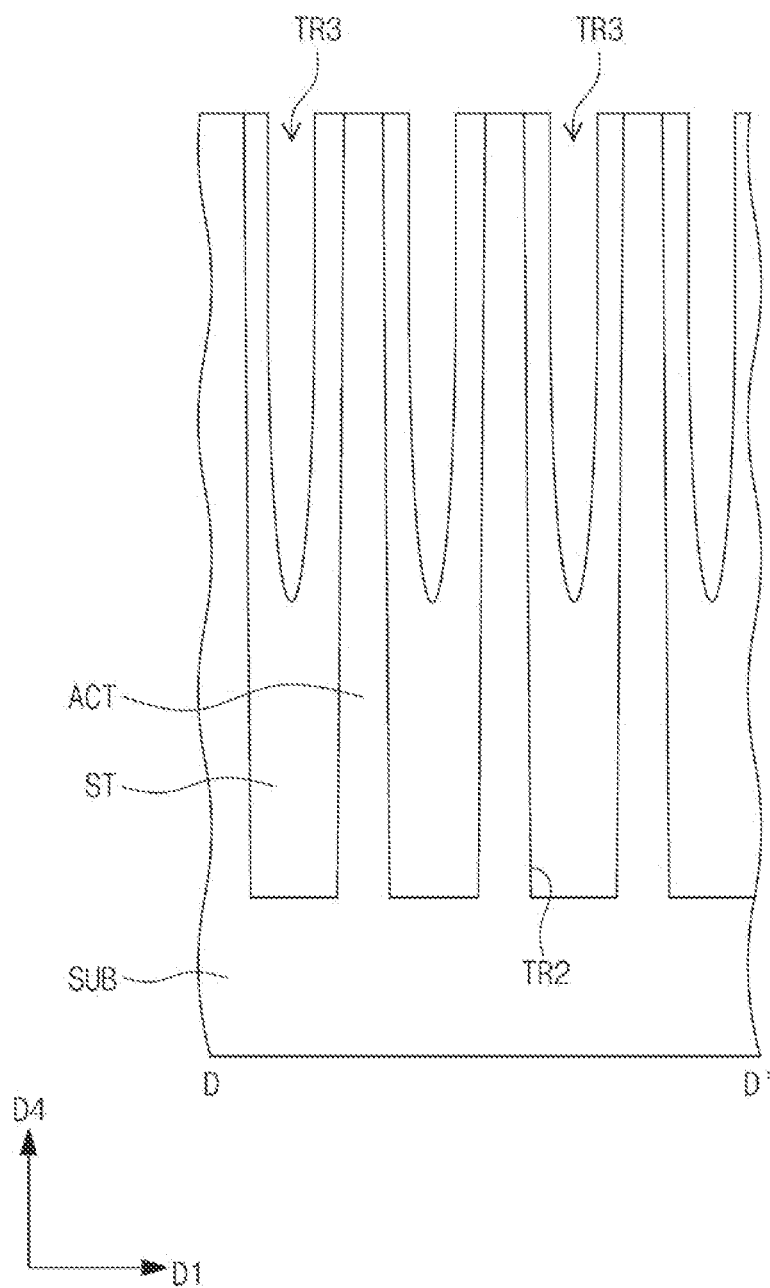
Figure 21:
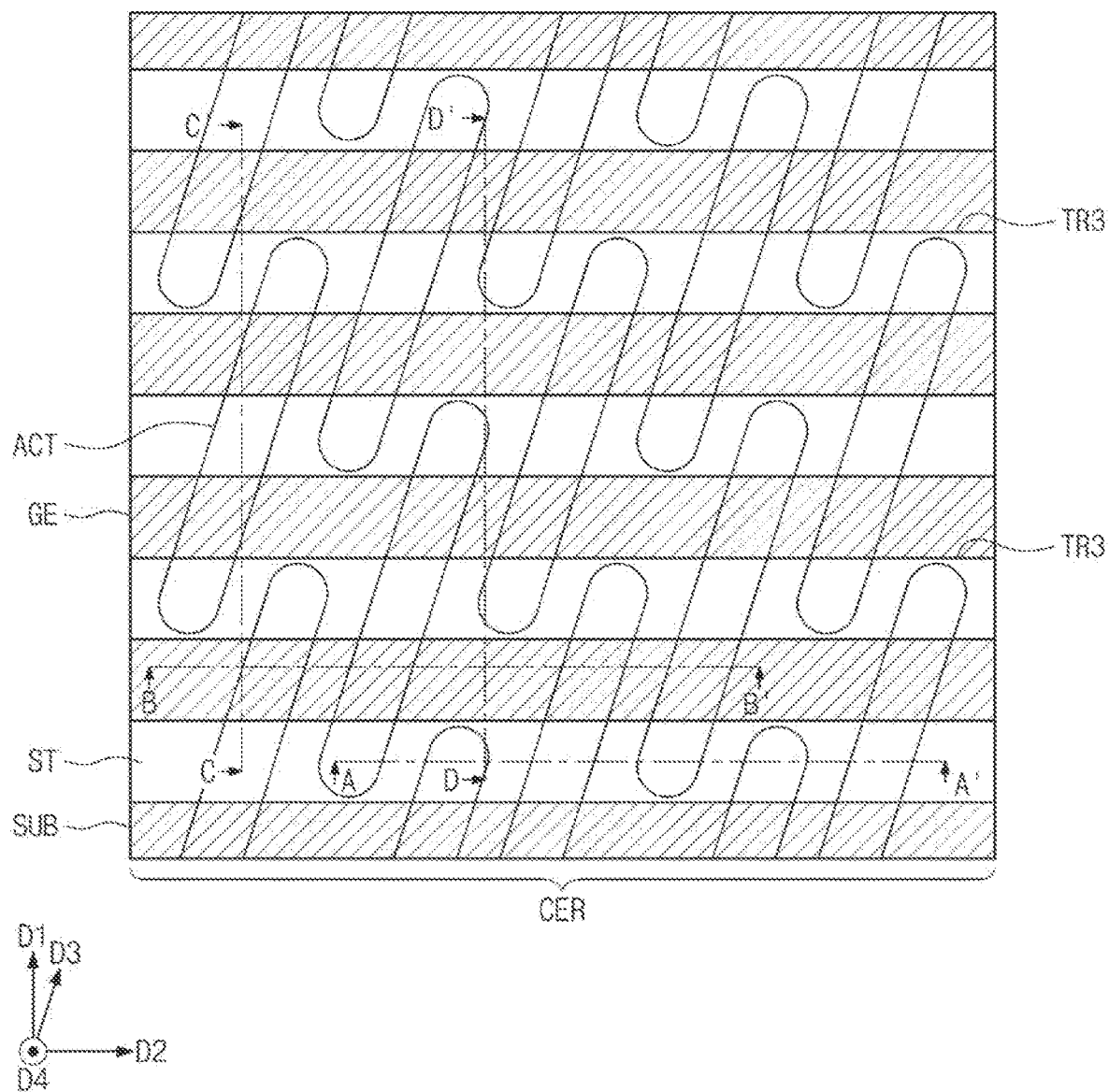
Figure 22A:
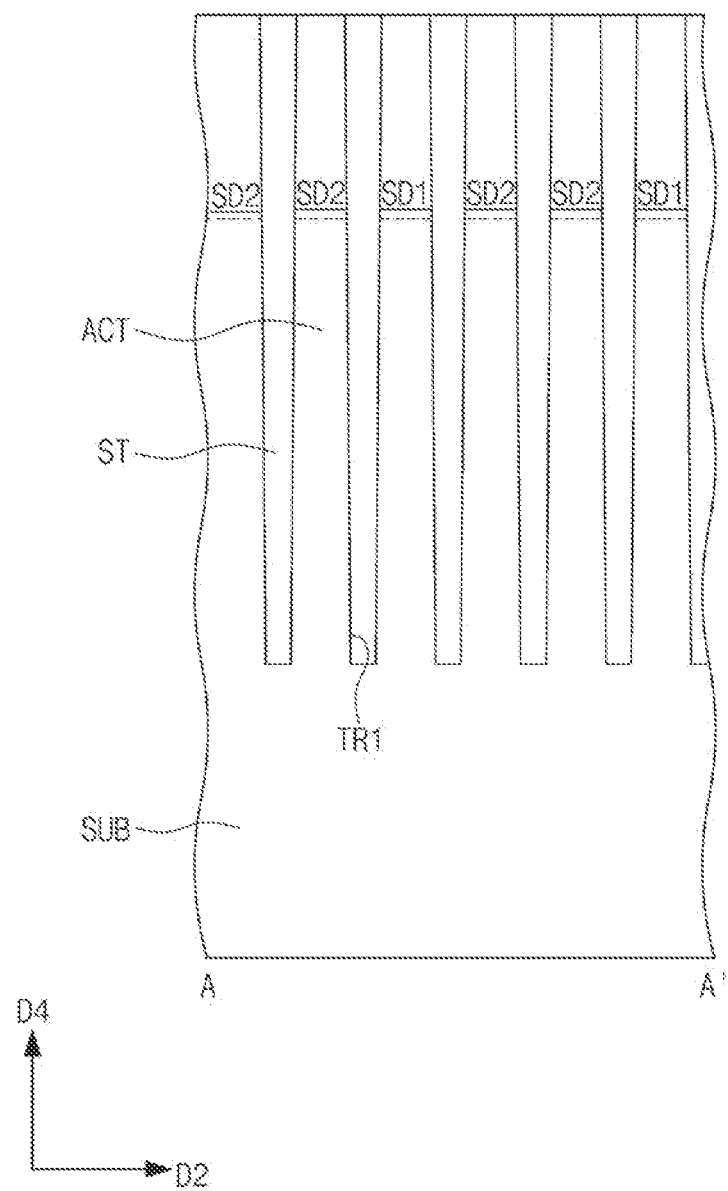
Figure 22B:
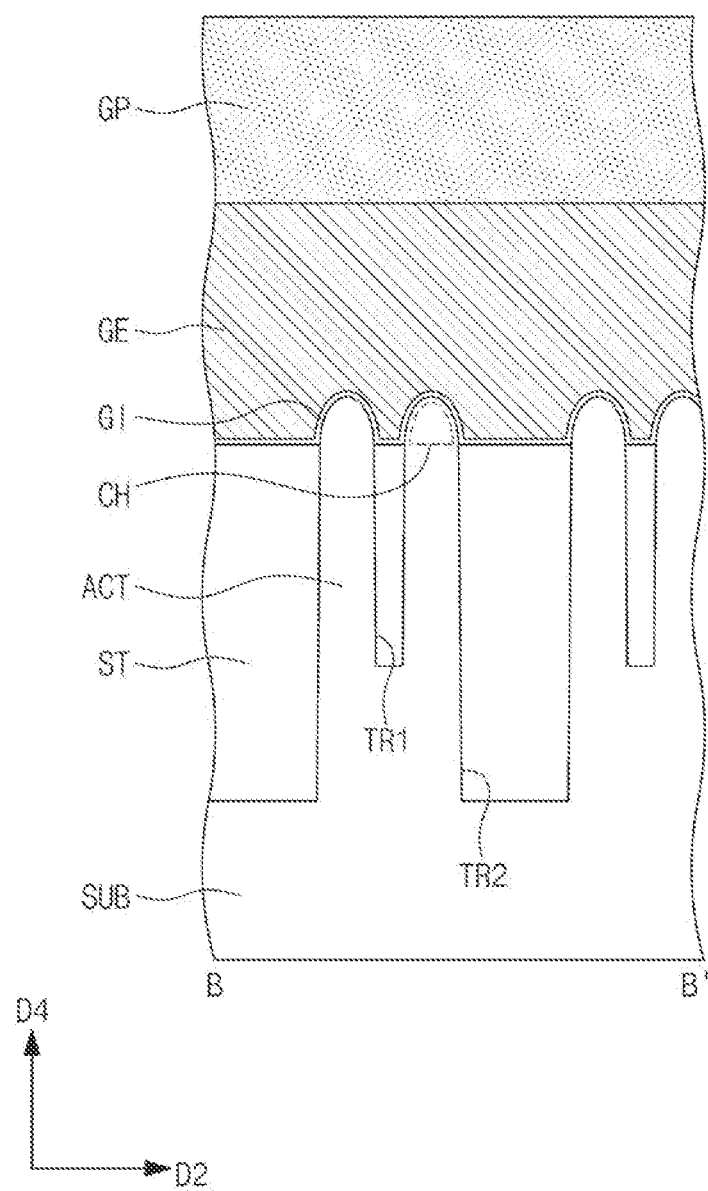
Figure 22C:
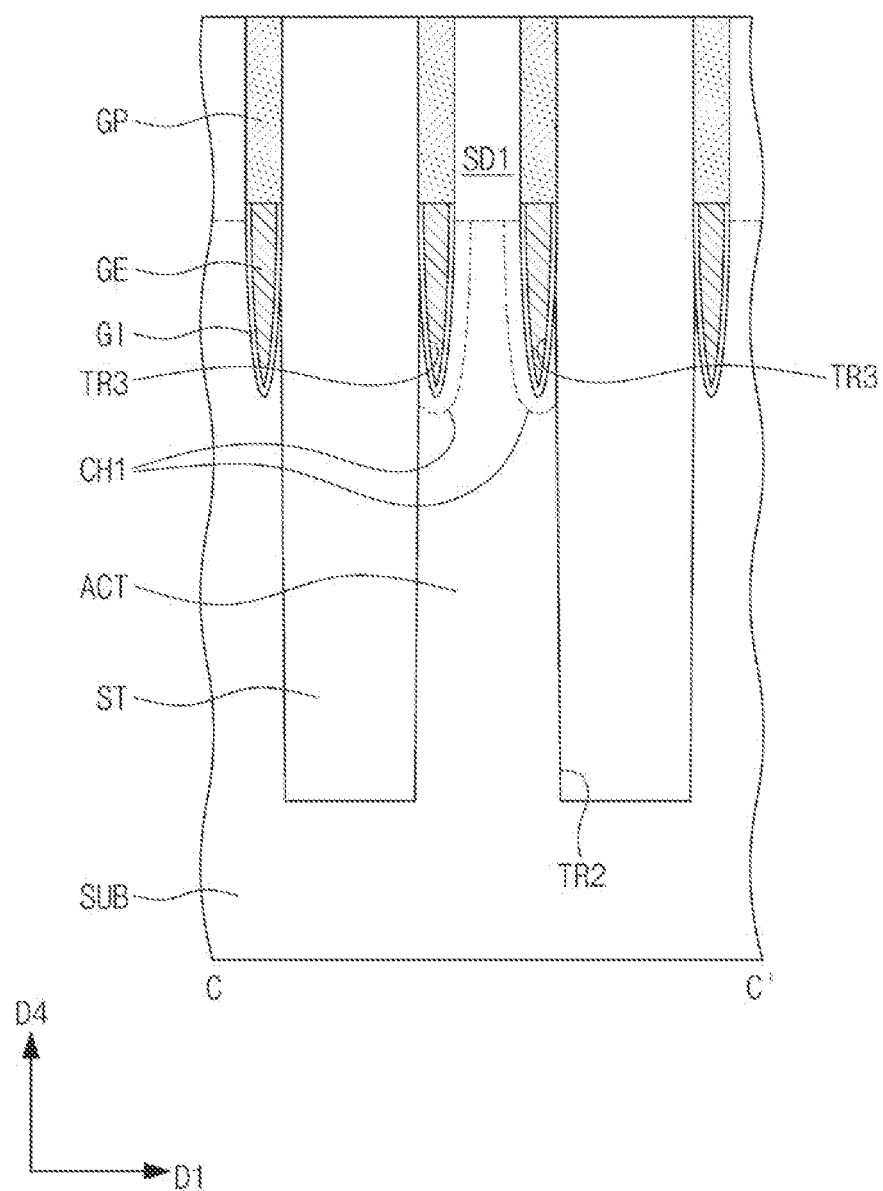
Figure 22D:
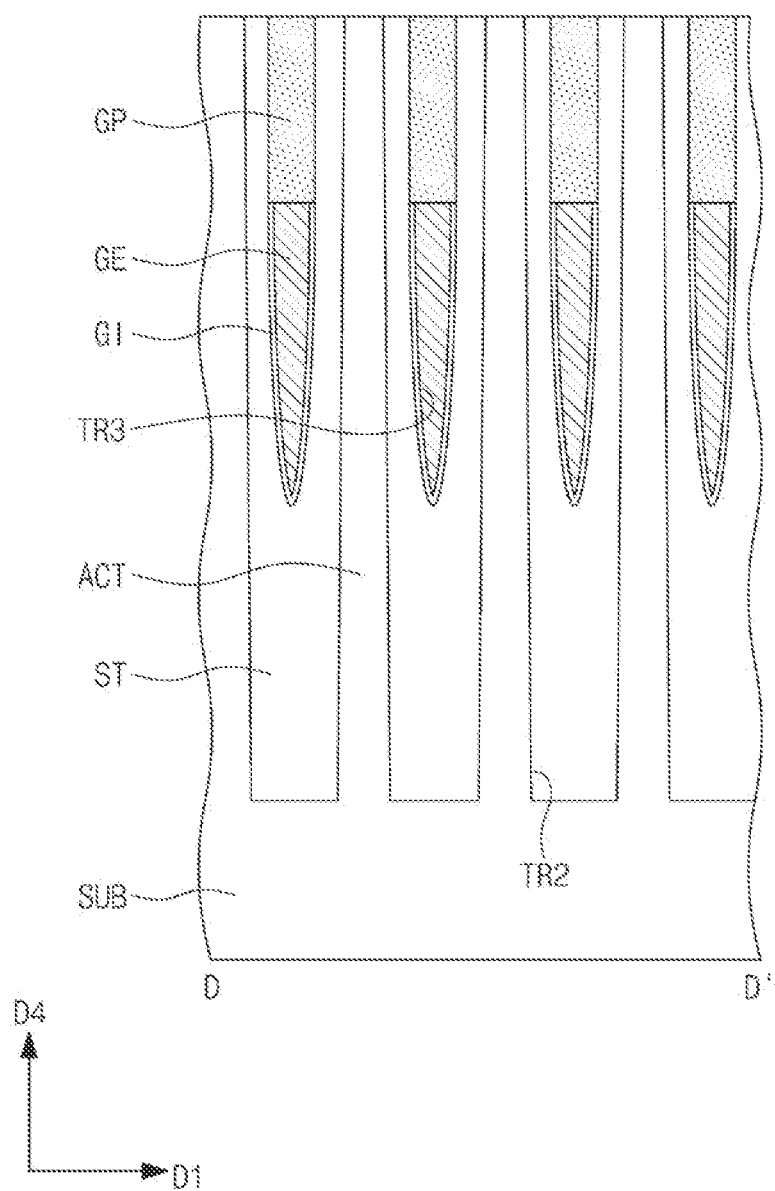
Figure 23:
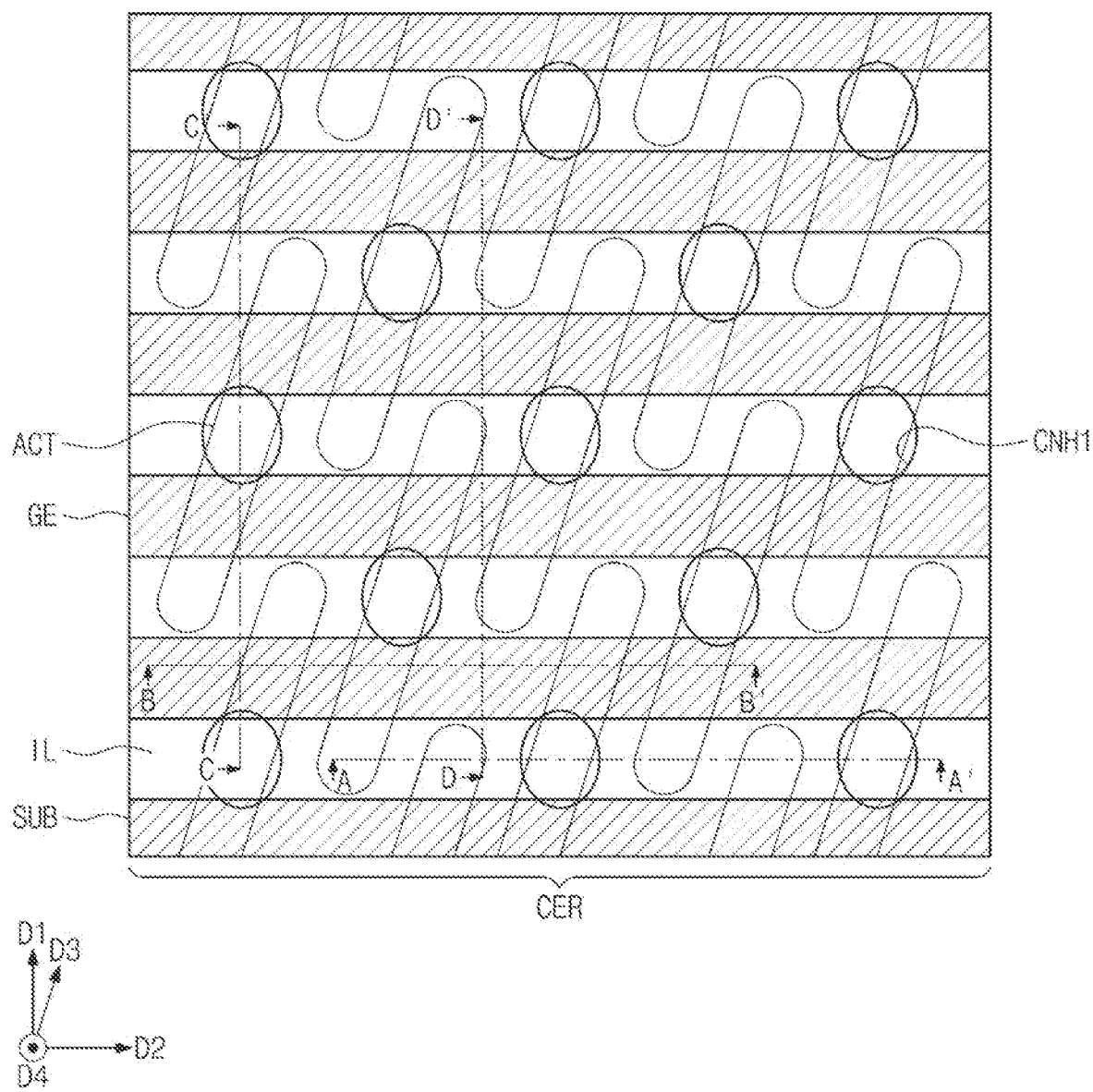
Figure 24A:
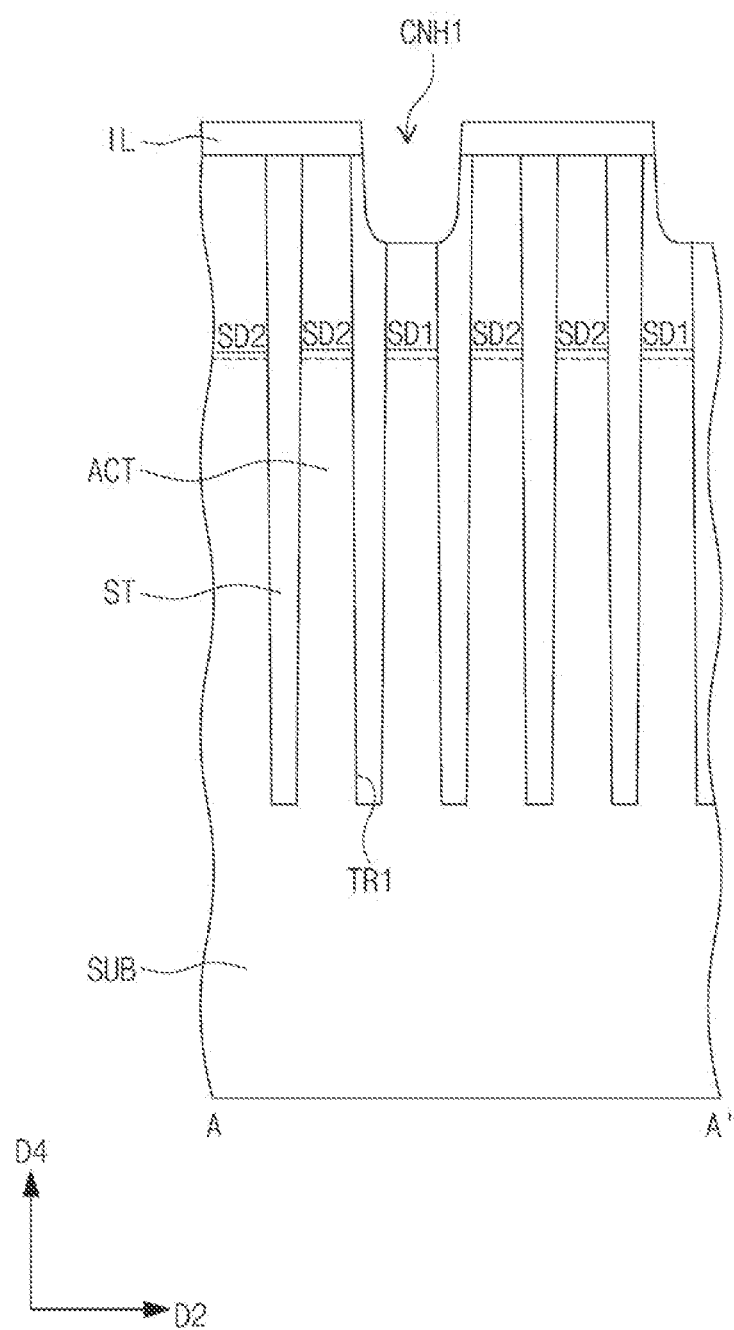
Figure 24B:
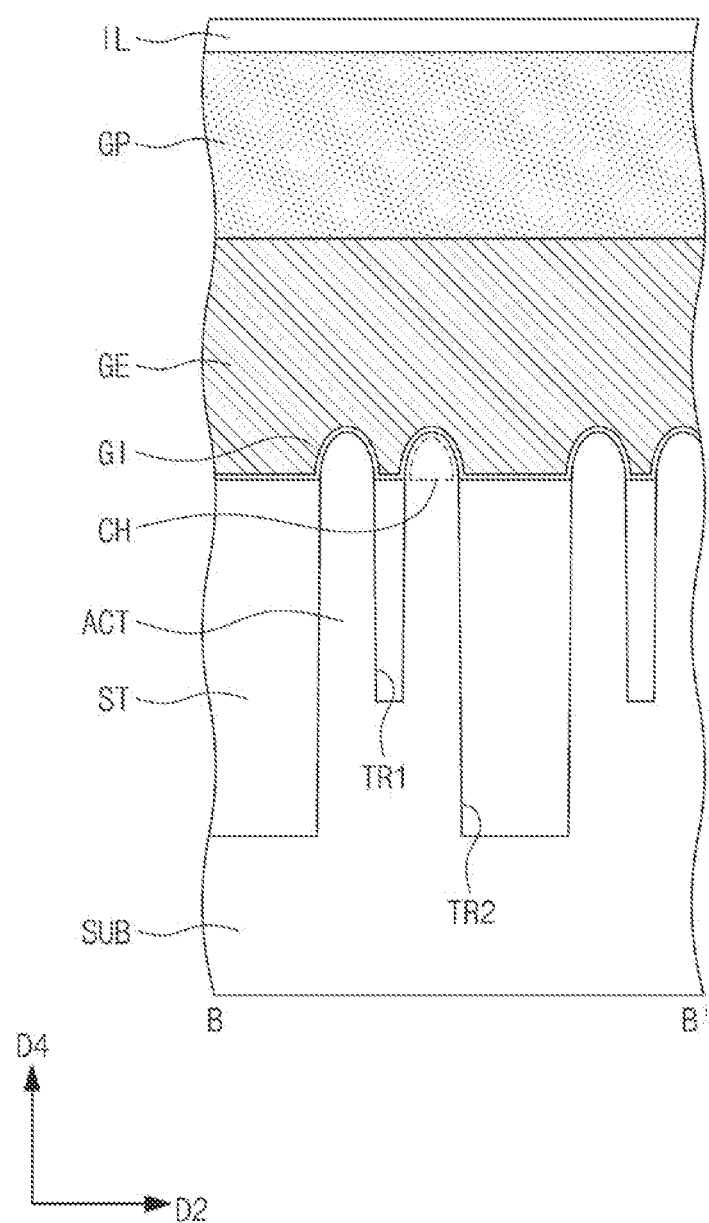
Figure 24C:
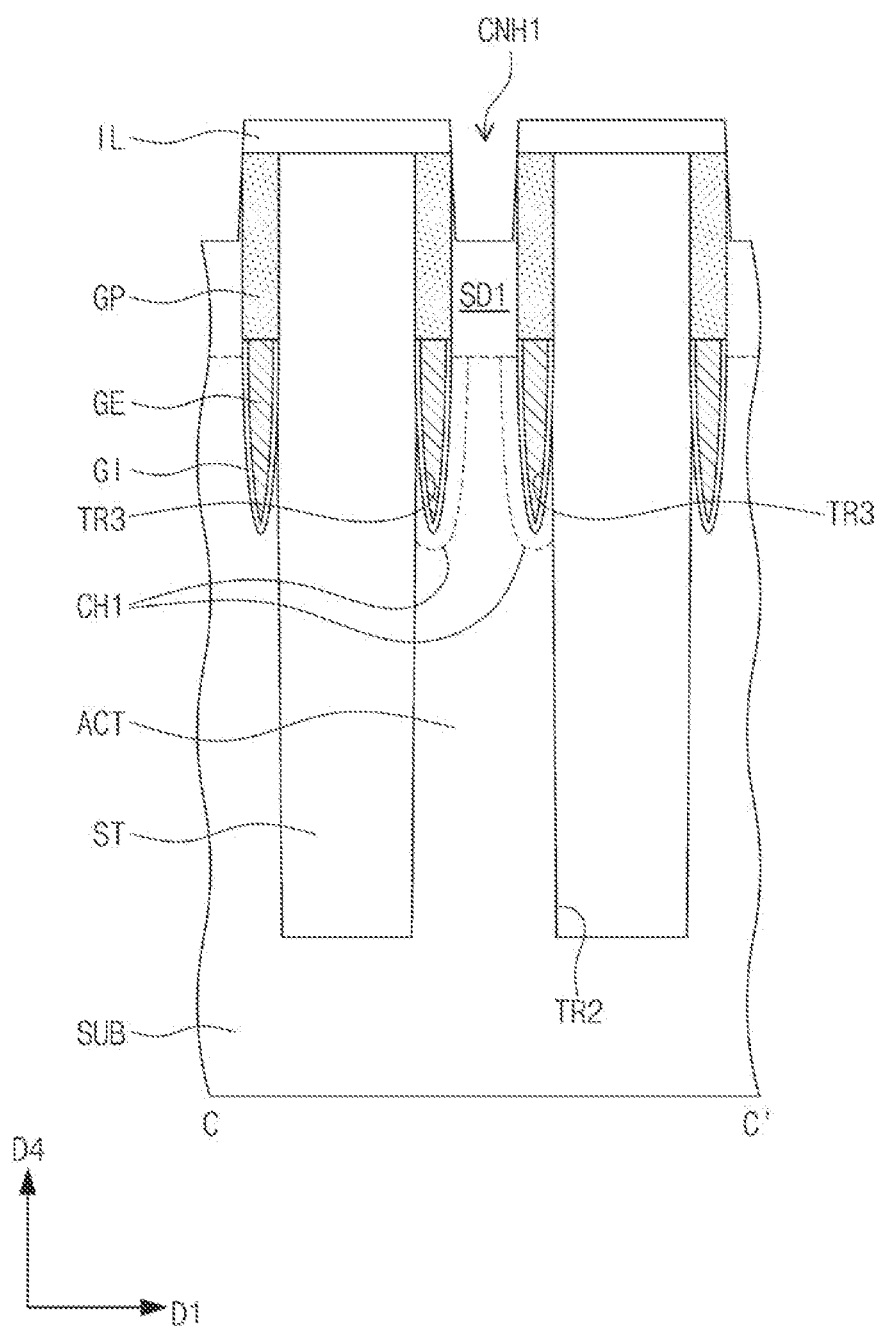
Figure 24D:
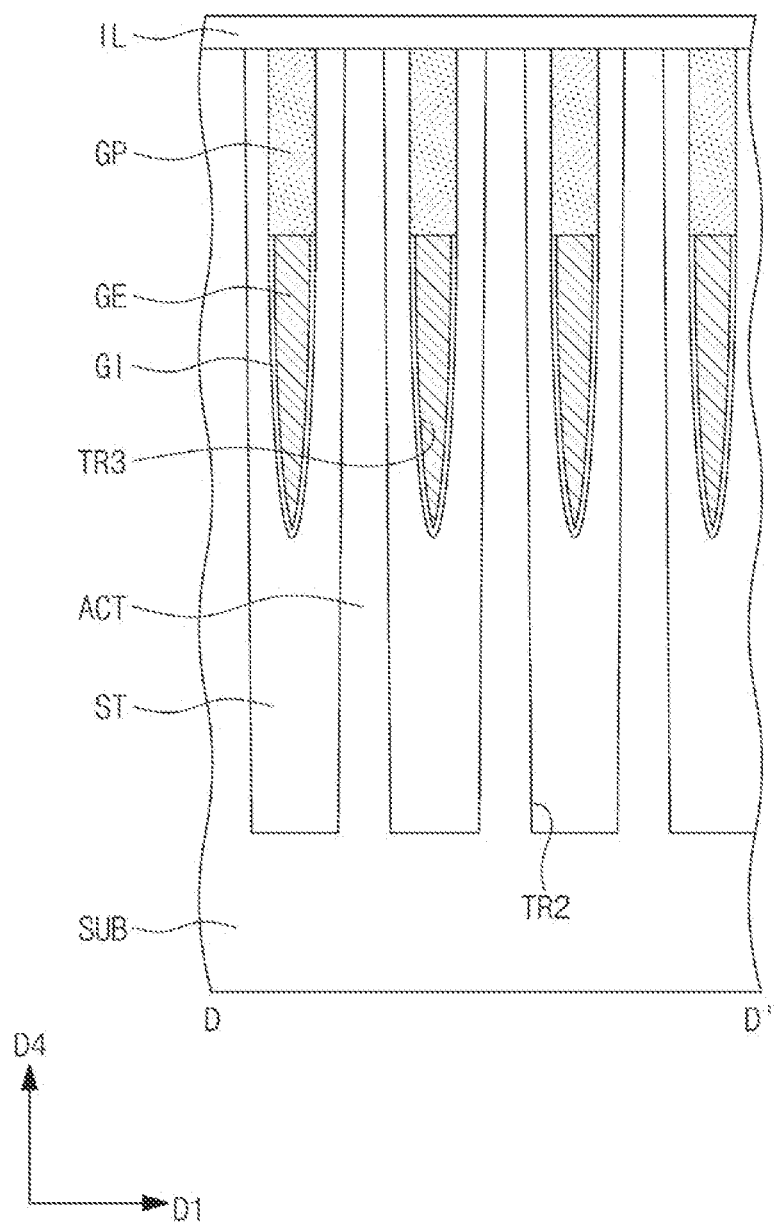
Figure 25:
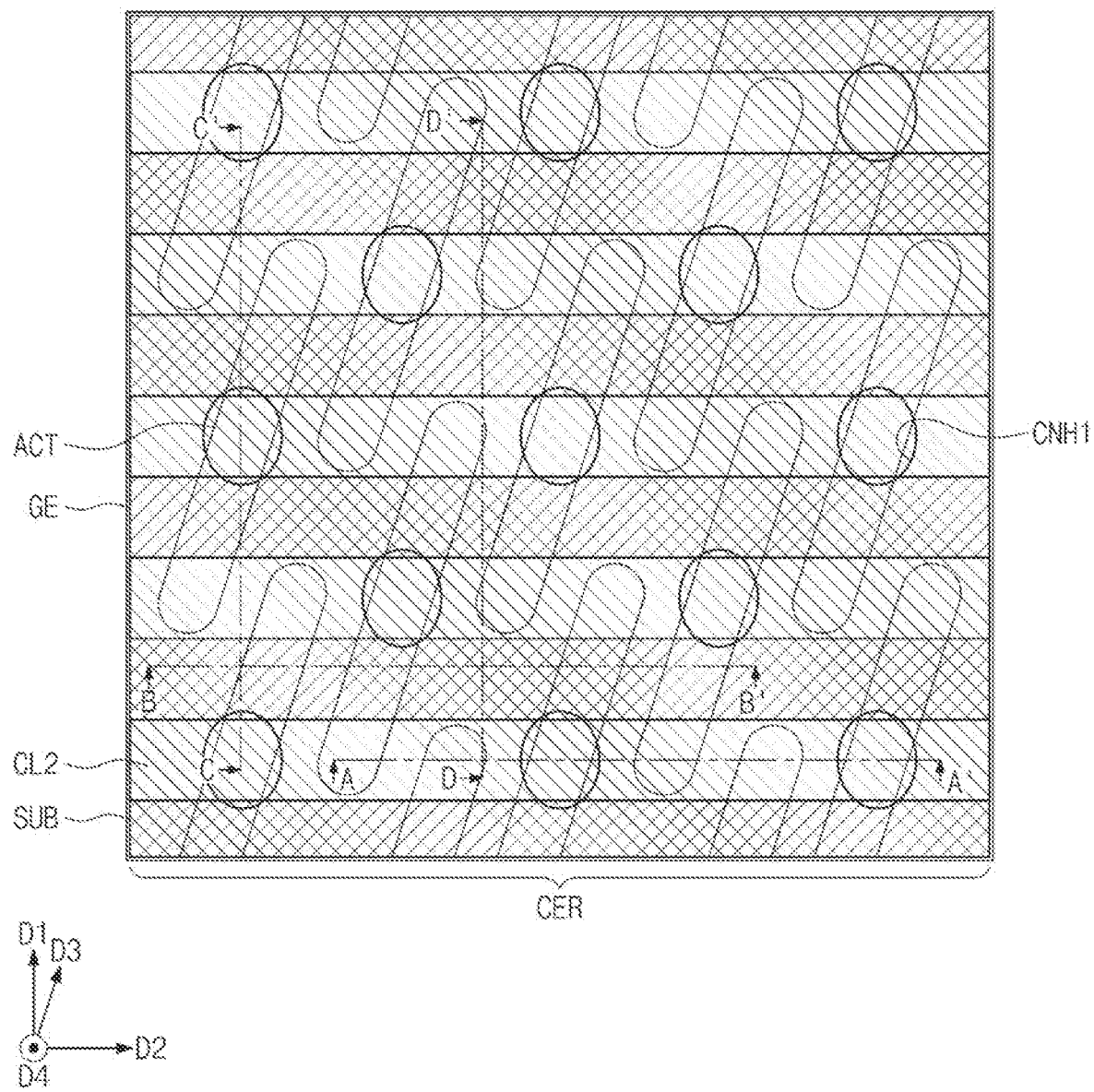
Figure 26A:
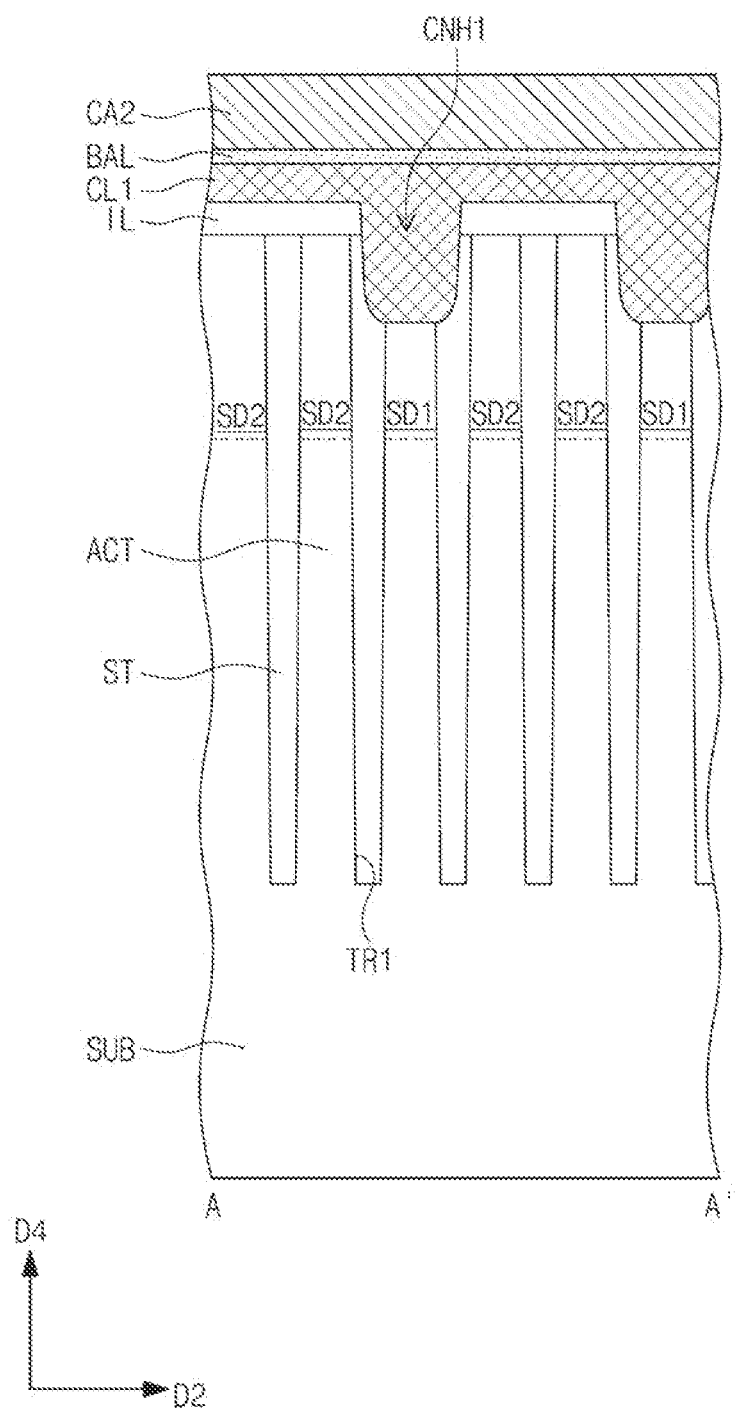
Figure 26B:
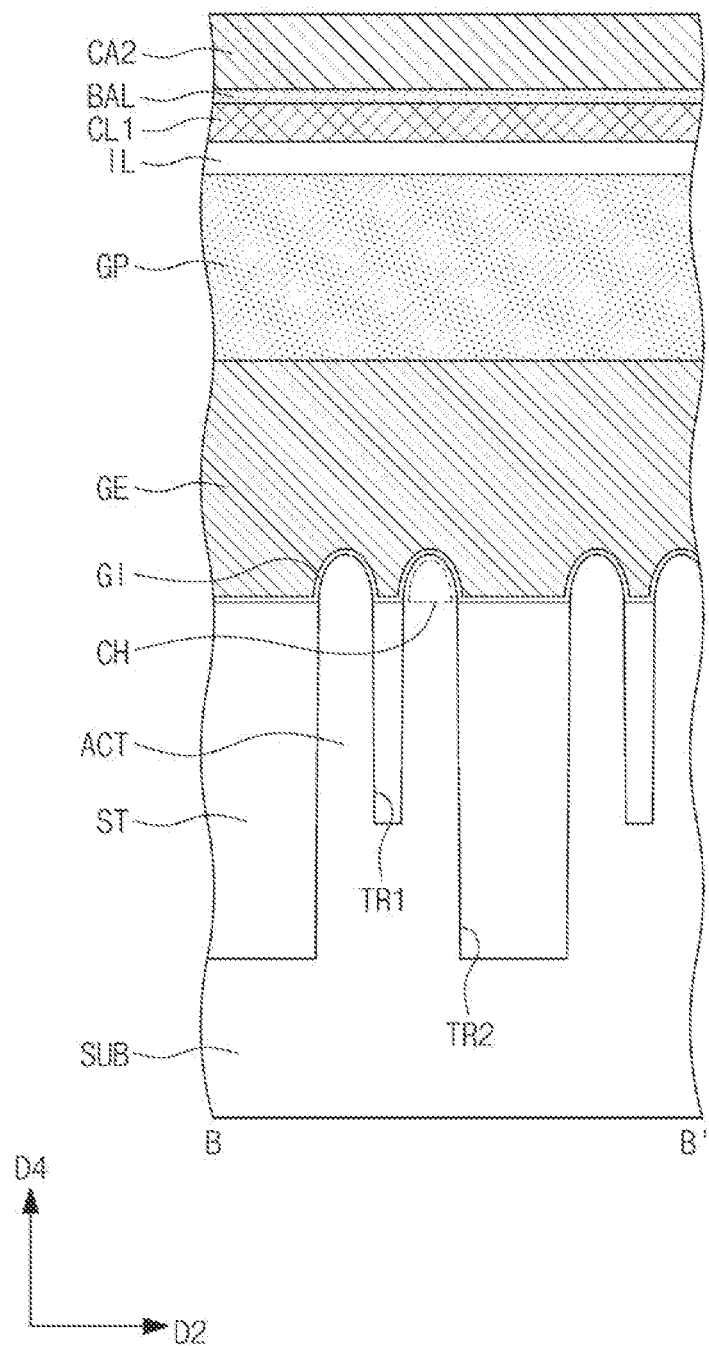
Figure 26C:
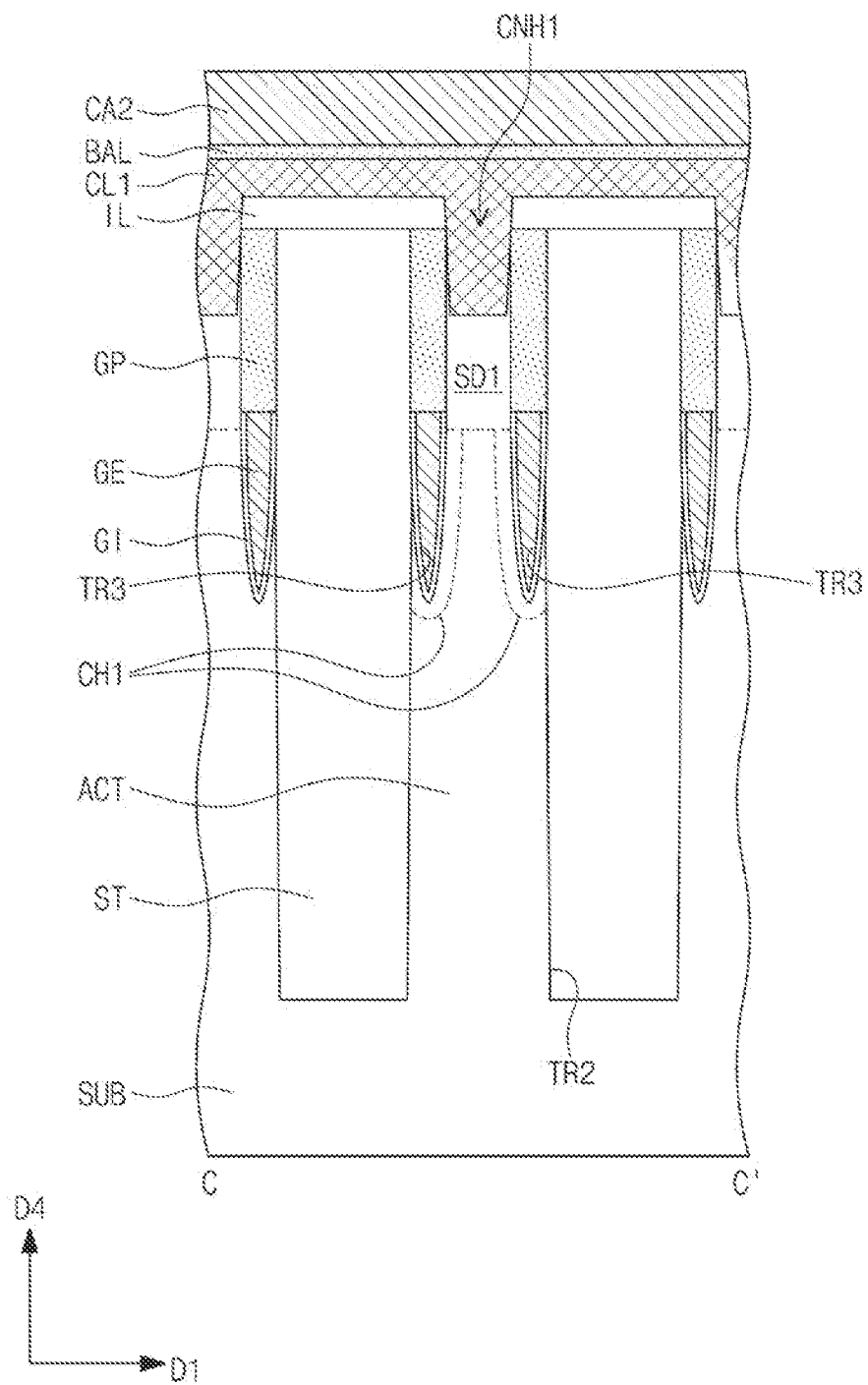
Figure 26D:
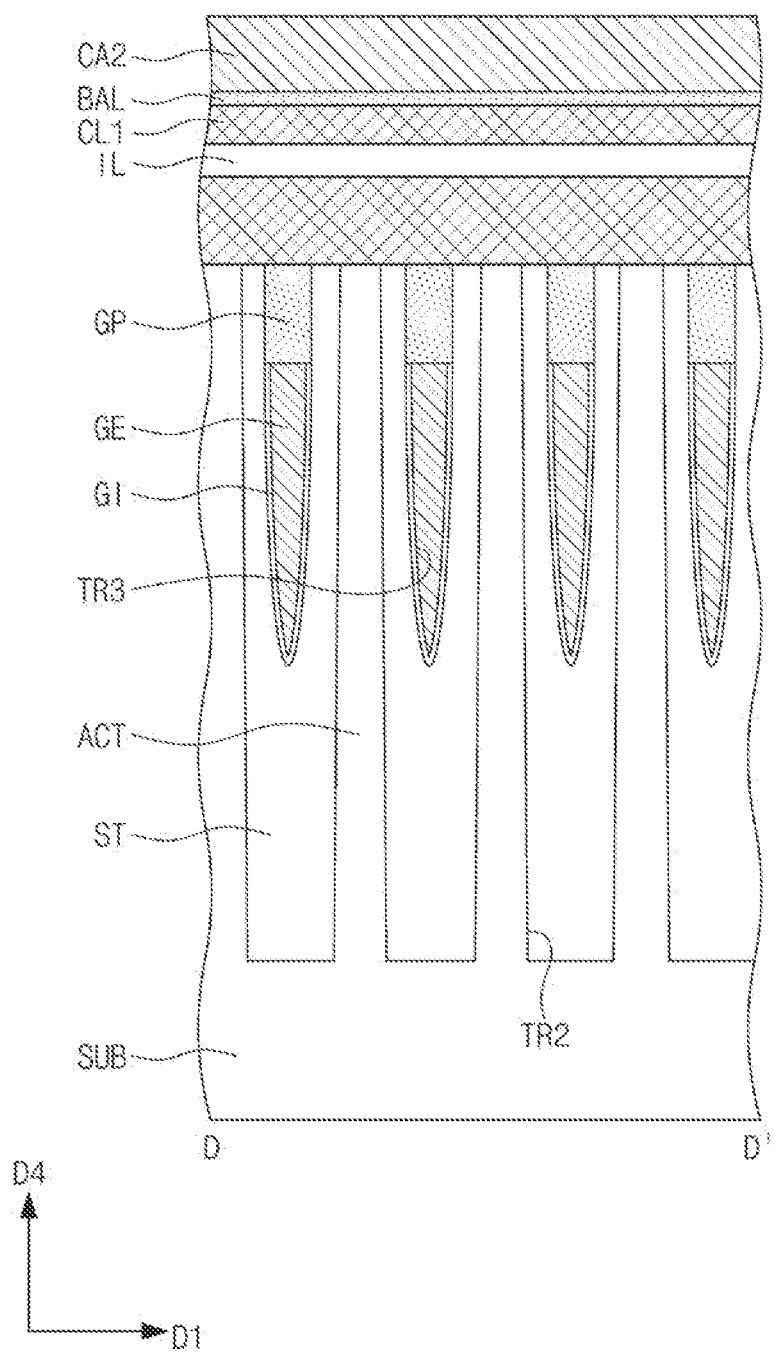
Figure 27:
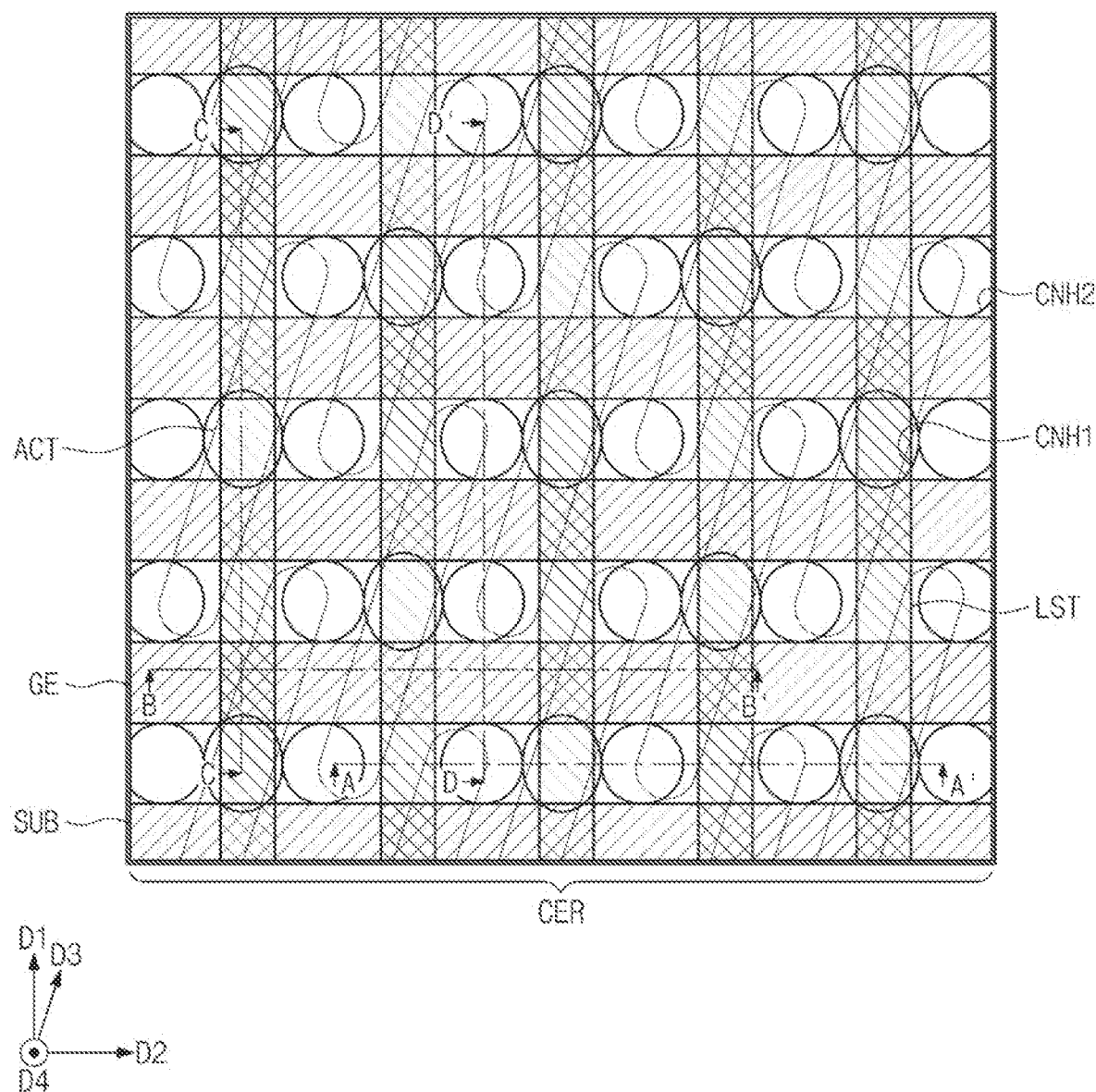
Figure 28A:
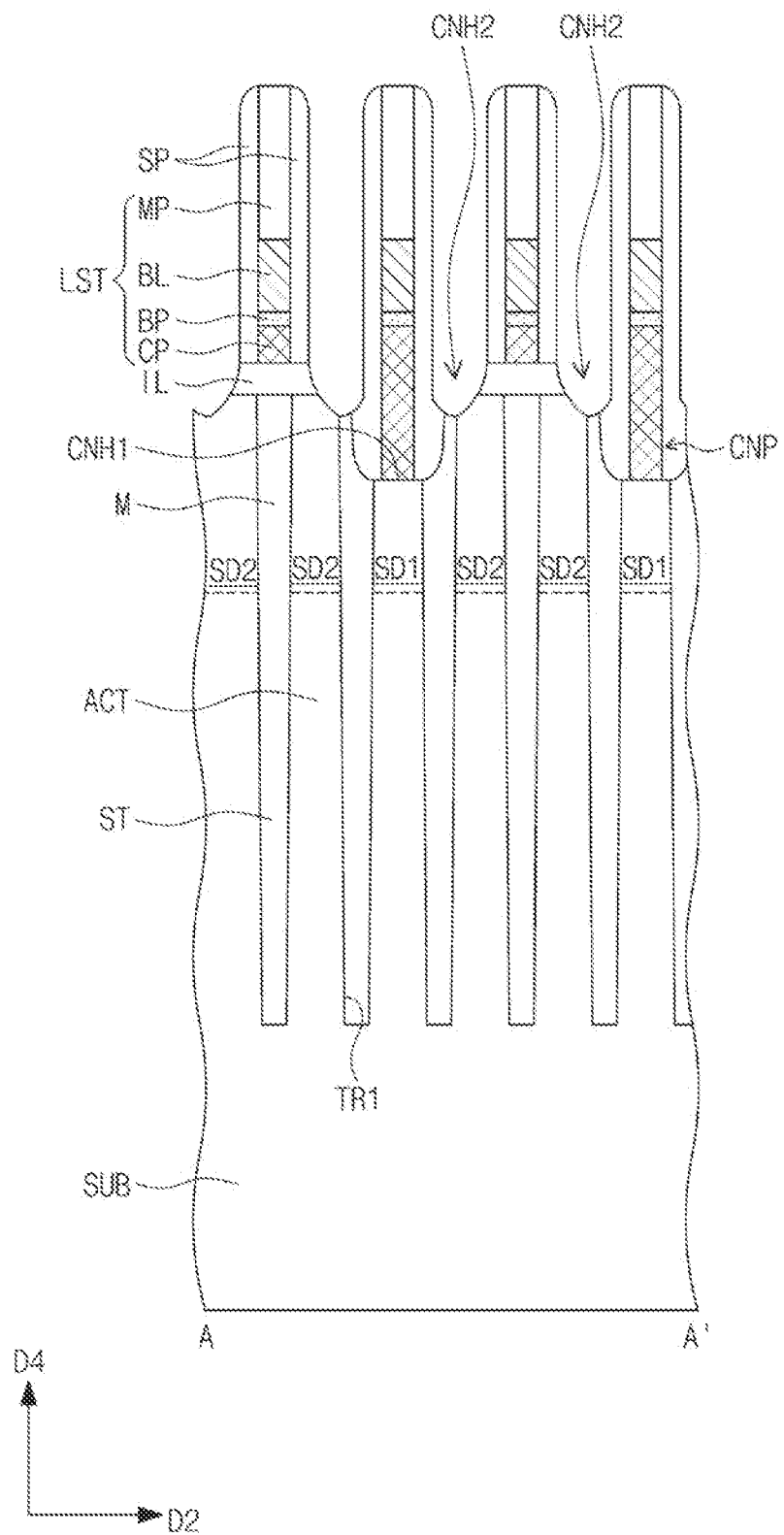
Figure 28B:
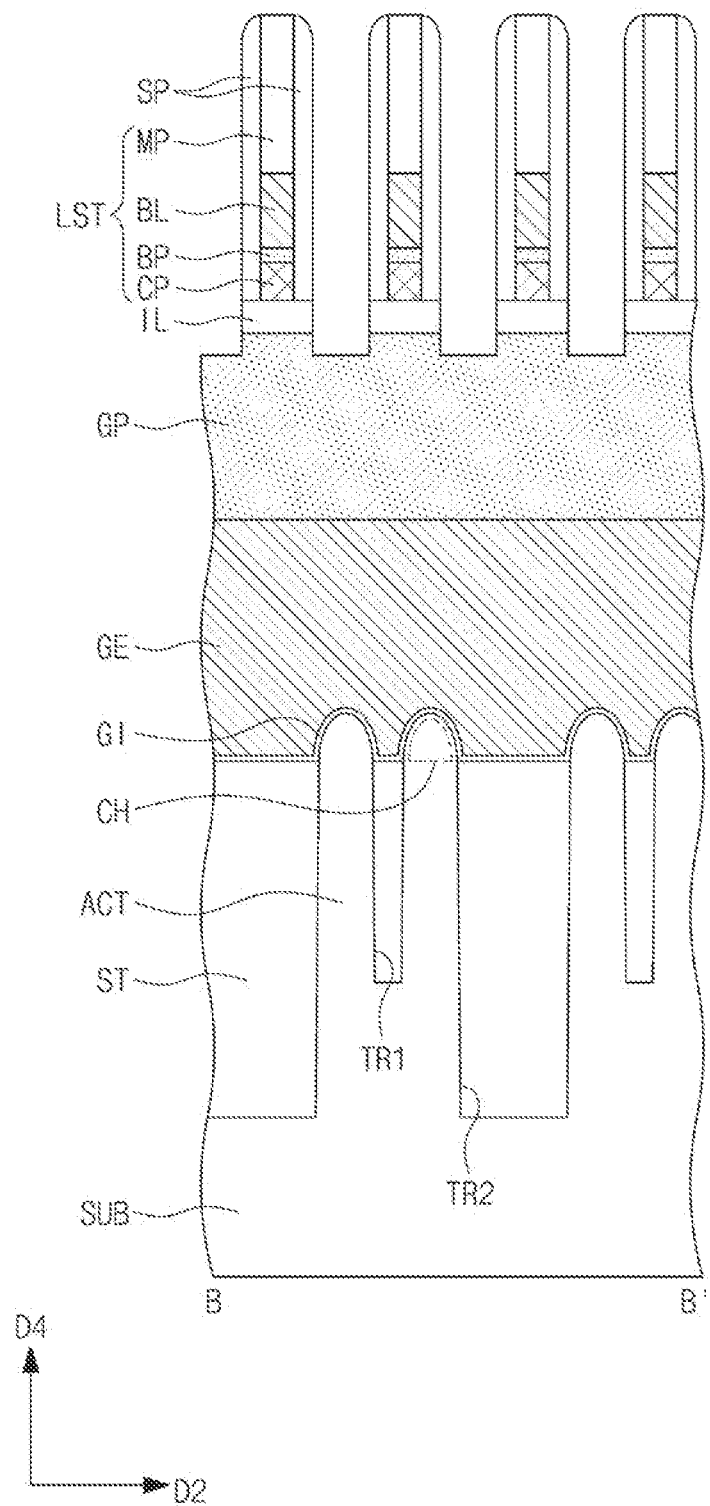
Figure 28C:
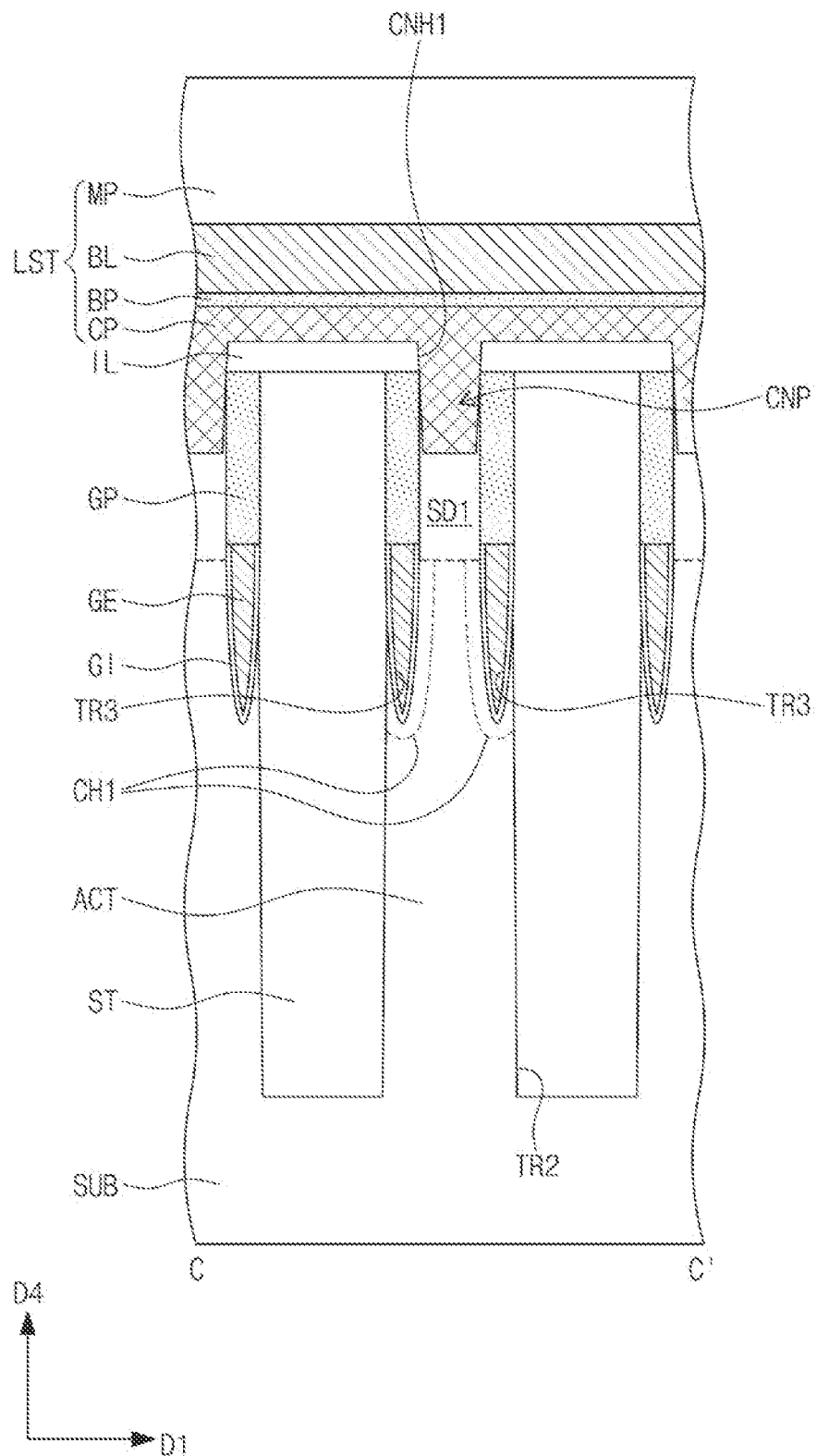
Figure 28D:
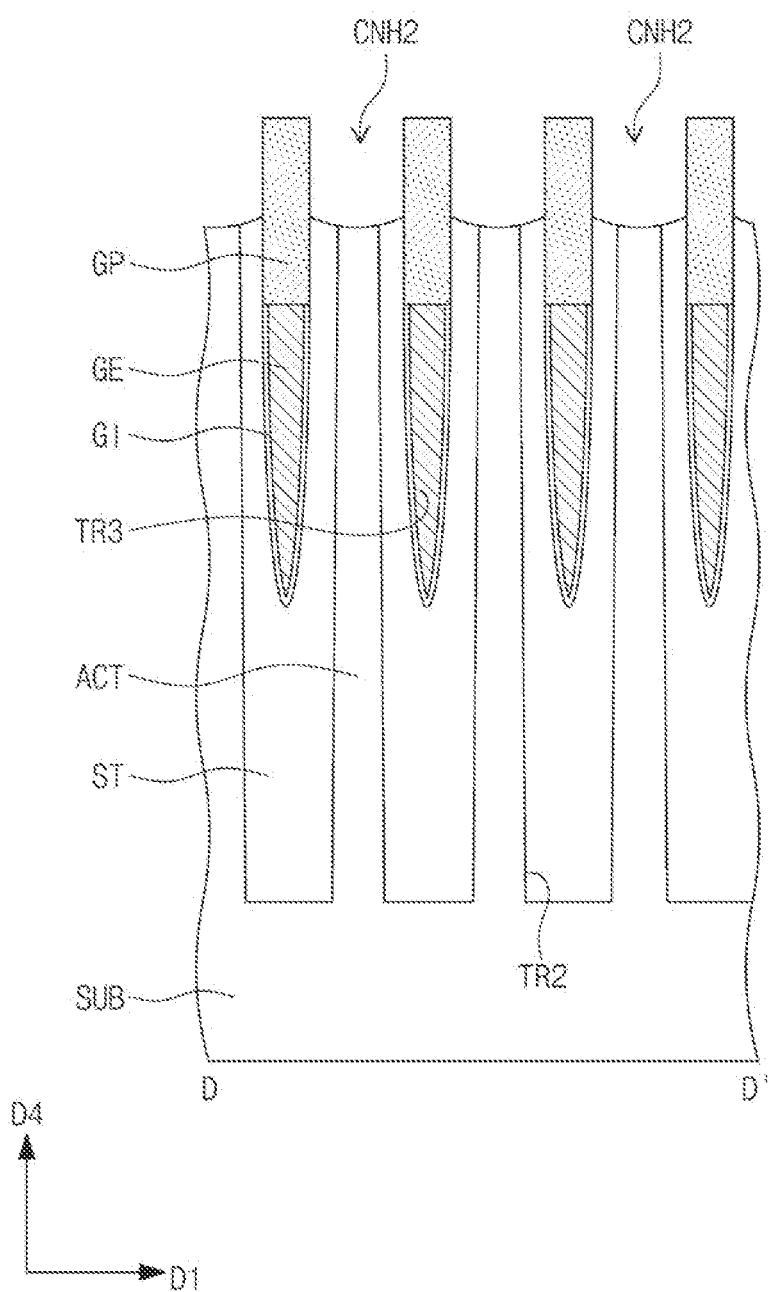
Figure 29:
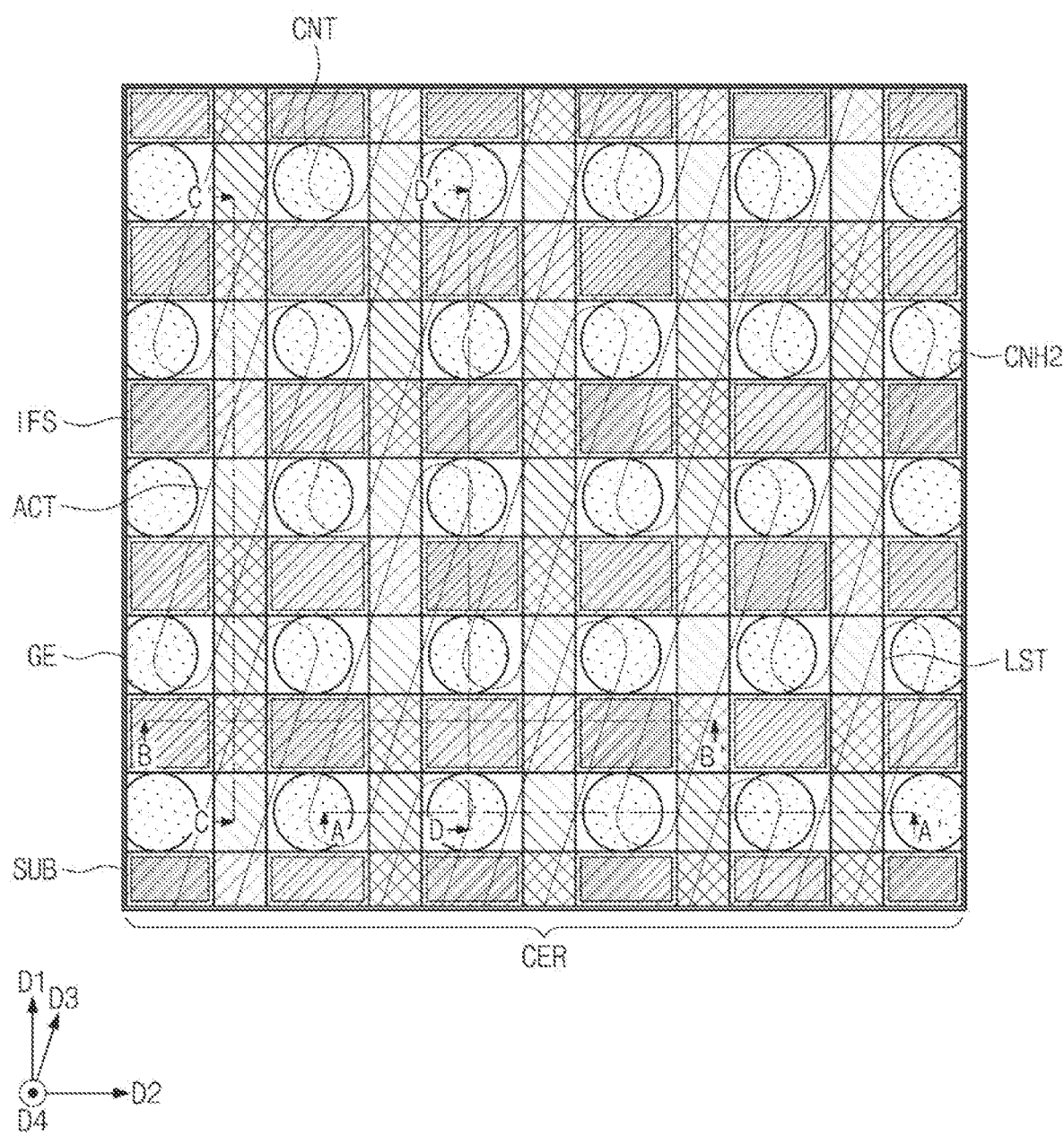
Figure 30A:
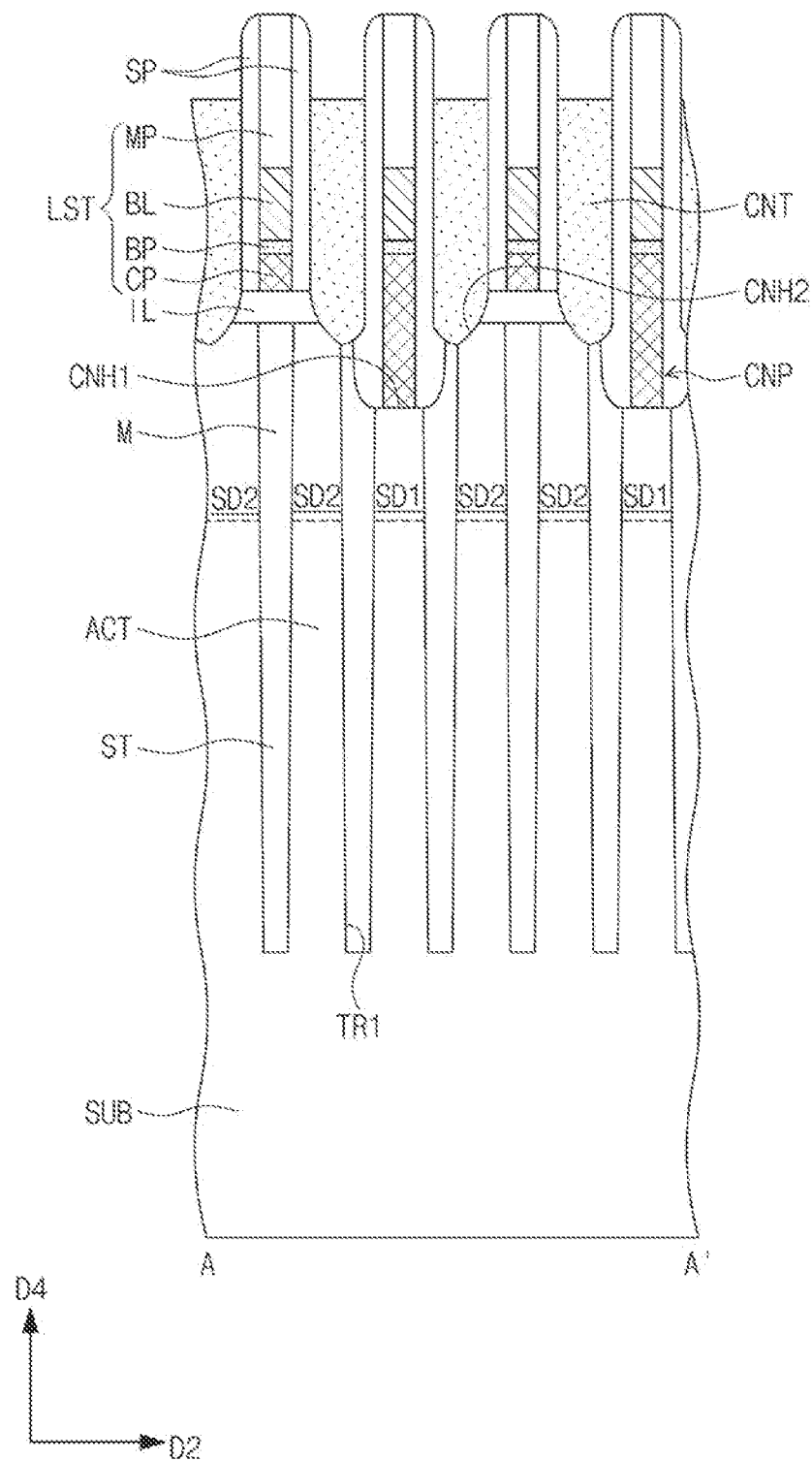
Figure 30B:
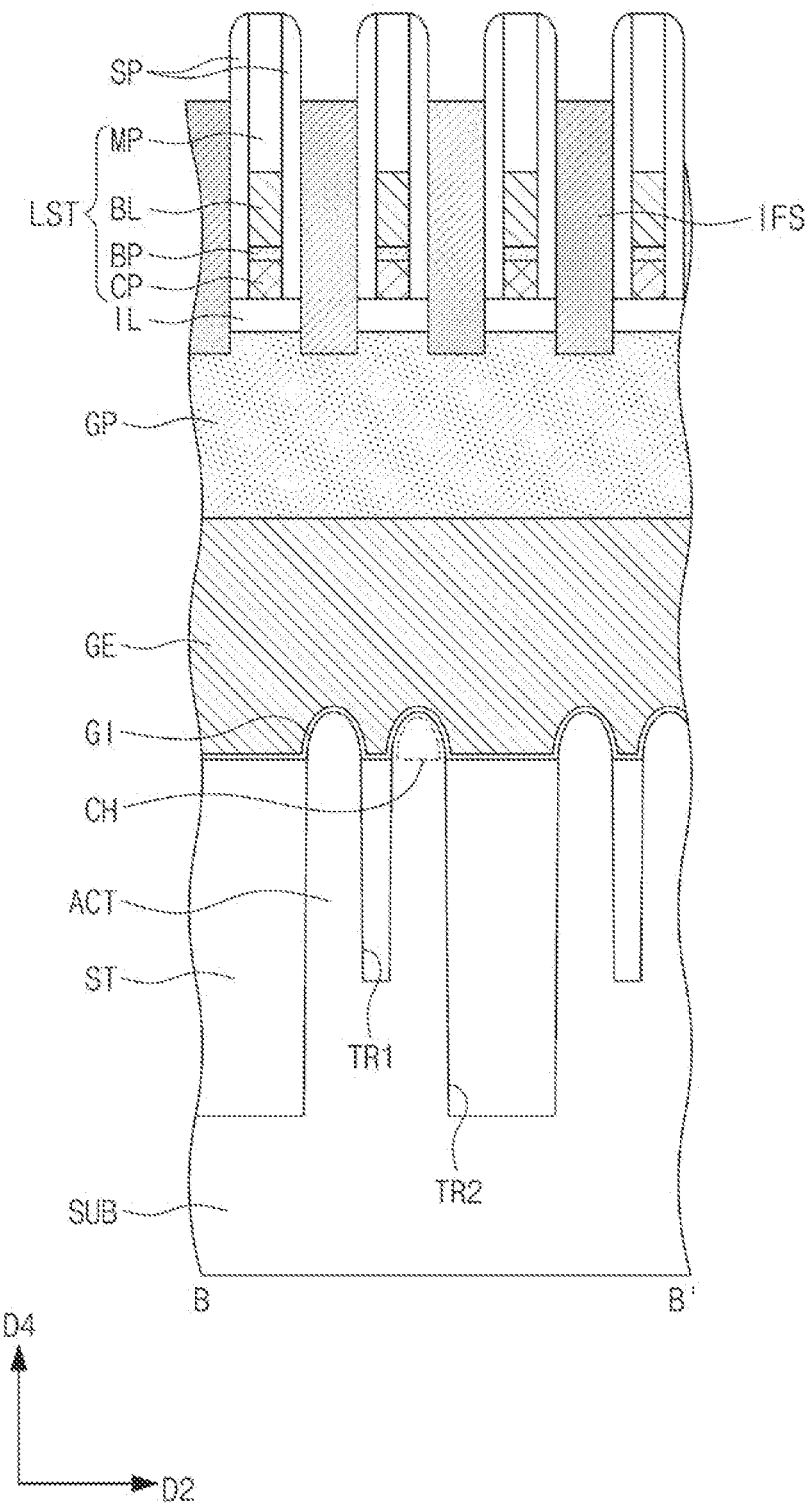
Figure 30C:
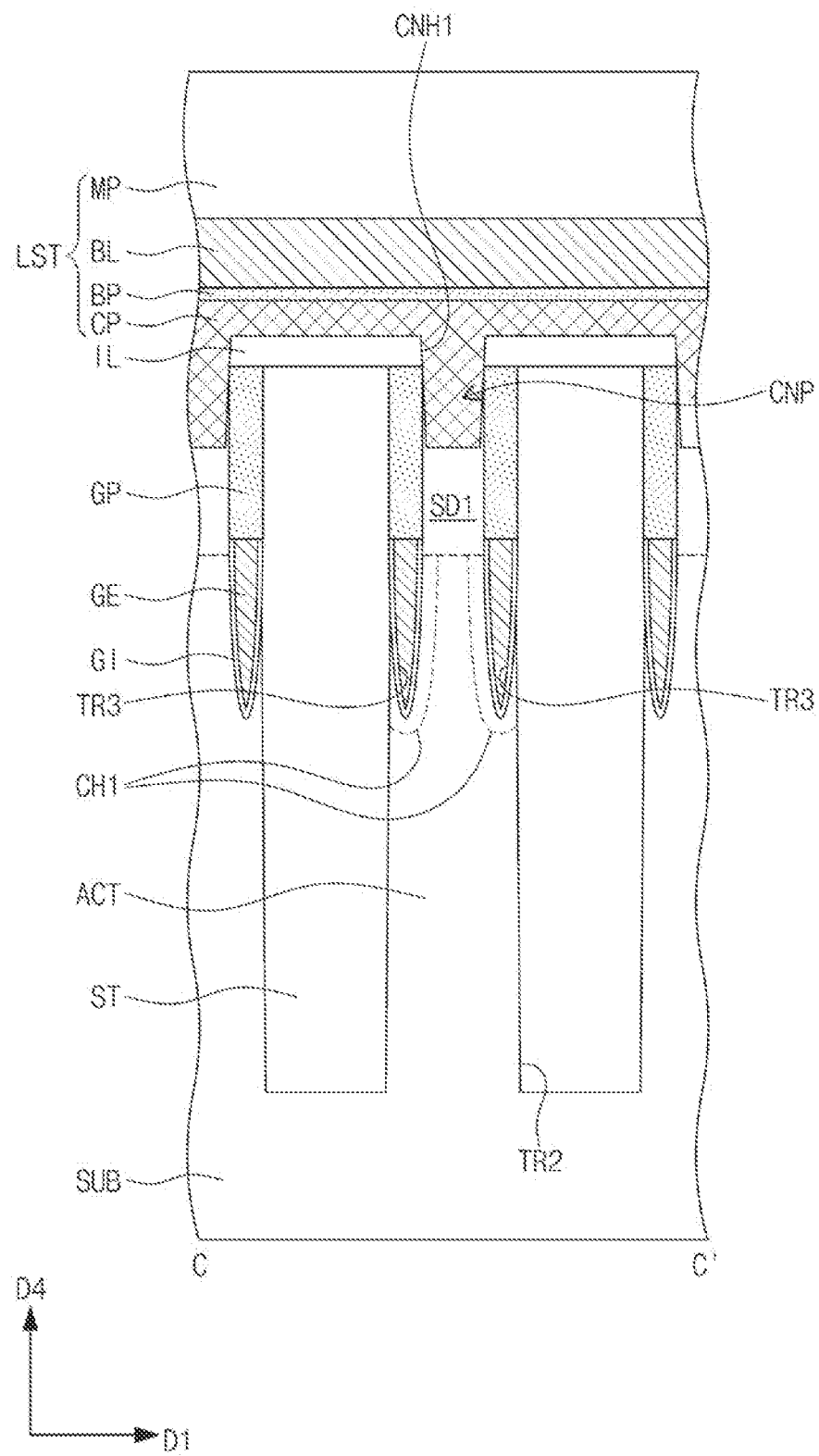
Figure 30D:
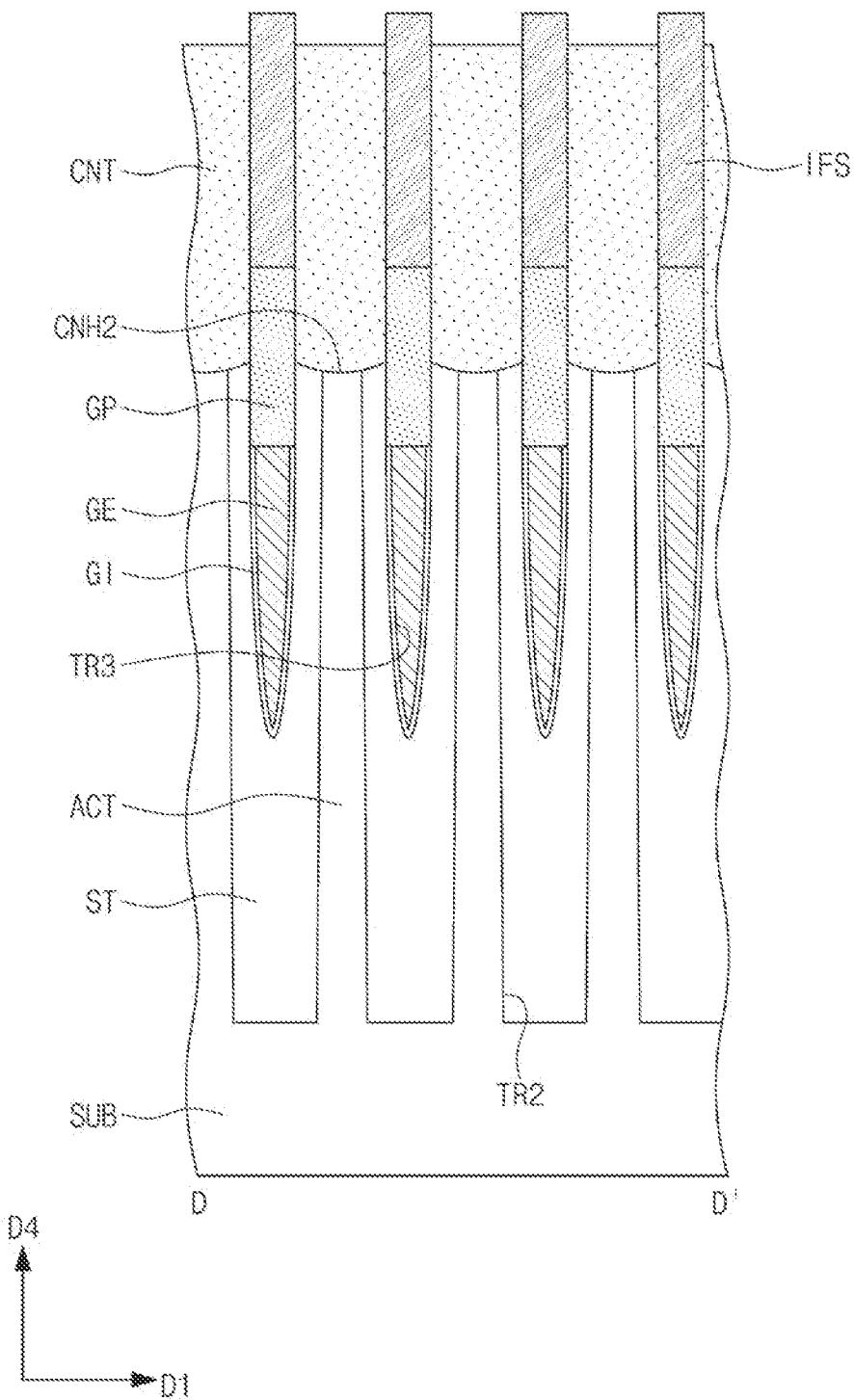

Referring to FIGS. 17 and 18A to 18D, active patterns ACT may be formed by patterning an upper portion of a substrate SUB. Each of the active patterns ACT may be extended in a third direction D3, which is parallel to a top surface of the substrate SUB. The active patterns ACT may be two-dimensionally arranged in a first direction D1 and a second direction D2. The active patterns ACT may be spaced apart from each other in the third direction D3 as shown in FIG. 17.

The active patterns ACT may be realized using a photolithography process. A photomask, which is used in the photolithography process for realizing the active patterns ACT, may be manufactured through the OPC method described with reference to FIGS. 4 to 15.

In an example embodiment, the patterning process to form the active patterns ACT may include an EUV lithography process. The EUV lithography process may include performing an exposing process of irradiating the EUV light onto a photoresist layer and performing a developing process of developing the photoresist layer. As an example, the photoresist layer may be an organic photoresist layer containing an organic polymer (e.g., polyhydroxystyrene). The organic photoresist layer may further include a photosensitive compound which reacts with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but the disclosure is not limited to these examples.

Mask patterns may be formed by patterning at least one layer, which is disposed below the photoresist patterns, using the photoresist patterns as an etch mask. Desired patterns may be formed on a wafer by patterning a target layer using the mask patterns as an etch mask.

For example, the minimum pitch between the active patterns ACT, which are realized by the EUV lithography process according to an example embodiment, may be less than or equal to 45 nm. In other words, by using the EUV lithography process, it may be possible to precisely and finely form the active patterns ACT, using just one photomask.

First and second trenches TR1 and TR2 may be defined between the active patterns ACT. The first trench TR1 may be defined between a pair of active patterns ACT, which are adjacent to each other in the second direction D2. The second trench TR2 may be defined between a pair of active patterns ACT, which are adjacent to each other in the third direction D3.

A device isolation layer ST may be formed to fill the first and second trenches TR1 and TR2. The device isolation layer ST may be formed to completely fill the first and second trenches TR1 and TR2 and to cover the active patterns ACT. A planarization process may be performed on the device isolation layer ST to expose the top surfaces of the active patterns ACT.

Referring to FIGS. 19 and 20A to 20D, third trenches TR3 may be formed by patterning the active patterns ACT and the device isolation layer ST. When viewed in a plan view, each of the third trenches TR3 may have a line shape extending in the second direction D2.

The formation of the third trenches TR3 may include forming a hard mask pattern with openings and etching the exposed portions of the active patterns ACT and the device isolation layer ST using the hard mask pattern as an etch mask. The third trench TR3 may be formed to be shallower than the first trench TR1.

Referring to FIGS. 21 and 22A to 22D, a gate insulating layer GI, a gate electrode GE, and a gate capping layer GP may be sequentially formed in each of the third trenches TR3. In detail, the gate insulating layer GI may be formed to conformally cover each third trench TR3. The gate insulating layer GI may include a silicon oxide layer, a silicon nitride layer, a silicon oxynitride layer, and/or a high-k dielectric layer.

The gate electrode GE may be formed on the gate insulating layer GI by forming a conductive layer to fill the third trench TR3. The conductive layer may be formed of or include at least one of conductive metal nitrides and/or metallic materials.

The gate insulating layer GI and the gate electrode GE may be recessed to form an empty region and then, the gate capping layer GP may be formed in the empty region or on the recessed gate electrode GE. The gate capping layer GP may be formed to have a top surface that is coplanar with the top surface of the active pattern ACT.

An ion implantation process may be performed on the active patterns ACT to form a first source/drain region SD1 and a pair of second source/drain regions SD2 in an upper portion of the active pattern ACT. The pair of second source/drain regions SD2 may be spaced apart from each other in the third direction D3, with the first source/drain region SD1 interposed therebetween. In an example embodiment, the first and second source/drain regions SD1 and SD2 may be doped with the same impurities.

A channel region CH may be defined in a portion of the active pattern ACT located below and/or adjacent to the gate electrode GE. When viewed in a plan view, the channel region CH may be interposed between the first source/drain region SD1 and the second source/drain region SD2. The gate electrode GE may be provided on the top surface and opposite side surfaces of the channel region CH (e.g., see FIG. 22B).

Referring to FIGS. 23 and 24A to 24D, an insulating layer IL may be formed on the substrate SUB. As an example, the insulating layer IL may be a multi-layered structure, in which a silicon oxide layer and a silicon oxynitride layer are stacked. The insulating layer IL may be patterned to form first contact holes CNH1, each of which exposes a corresponding one of the first source/drain regions SD1 of the active patterns ACT. When the first contact hole CNH1 is formed, an upper portion of the first source/drain region SD1 may be partially recessed. Similarly, when the first contact hole CNH1 is formed, an upper portion of the device isolation layer ST around the first source/drain region SD1 may be partially recessed.

Referring to FIGS. 25 and 26A to 26D, a first conductive layer CL1, a barrier layer BAL, and a second conductive layer CL2 may be sequentially formed on the insulating layer IL. The first conductive layer CL1 may fill the first contact holes CNH1. In other words, the first conductive layer CL1 may be in contact with the first source/drain regions SD1 of the active patterns ACT. The first conductive layer CL1 may be vertically spaced apart from the second source/drain regions SD2 of the active patterns ACT with the insulating layer IL positioned therebetween. The first conductive layer CL1 may be formed of or include at least one of doped semiconductor materials.

The barrier layer BAL may be formed to be interposed between the first conductive layer CL1 and the second conductive layer CL2. The barrier layer BAL may be formed of or include at least one of conductive metal nitrides. The second conductive layer CL2 may be formed of or include at least one of metallic materials. The barrier layer BAL may prevent or suppress a metallic material in the second conductive layer CL2 from being diffused into the first conductive layer CL1.

Referring to FIGS. 27 and 28A to 28D, line structures LST may be formed on the insulating layer IL to be extended in the first direction D1 and parallel to each other. The line structures LST may be arranged in the second direction D2.

In detail, mask patterns MP may be formed on the second conductive layer CL2. The mask patterns MP may be formed in a line shape extending in the first direction D1. As an example, the mask patterns MP may be formed of or include at least one of silicon nitride or silicon oxynitride.

A bit line BL, a barrier pattern BP, and a conductive pattern CP may be formed by sequentially patterning the second conductive layer CL2, the barrier layer BAL, and the first conductive layer CL1 using the mask patterns MP as a mask. The mask pattern MP, the bit line BL, the barrier pattern BP, and the conductive pattern CP may be vertically overlapped with each other. The mask pattern MP, the bit line BL, the barrier pattern BP, and the conductive pattern CP may constitute the line structure LST. When viewed in a plan view, the bit lines BL may be extended to cross the gate electrodes GE.

The conductive pattern CP may include contact portions CNP filling the first contact holes CNH1, respectively. The conductive pattern CP may be connected to the first source/drain region SD1 through the contact portion CNP. In other words, the bit line BL may be electrically connected to the first source/drain region SD1 through the conductive pattern CP.

A pair of spacers SP may be formed on opposite side surfaces of each of the line structures LST. The formation of the spacers SP may include conformally forming a spacer layer on the entire top surface of the substrate SUB and anisotropically etching the spacer layer.

An etching process using the spacers SP and the mask patterns MP as a mask may be performed on the entire top surface of the substrate 100 to form second contact holes CNH2 exposing the second source/drain regions SD2, respectively. In detail, the second contact hole CNH2 may be formed to penetrate the insulating layer IL and may be extended to a level lower than the top surface of the substrate SUB. When the second contact hole CNH2 is formed, an upper portion of the second source/drain region SD2 may be partially recessed. When the second contact hole CNH2 is formed, an upper portion of the device isolation layer ST around the second source/drain region SD2 may be partially recessed.

Referring to FIGS. 29 and 30A to 30D, a plurality of insulating fences IFS may be formed on the gate capping layer GP. The insulating fences IFS may not be overlapped with the second contact holes CNH2 and may expose the second contact holes CNH2.

Contacts CNT may be respectively formed in the second contact holes CNH2 by filling the second contact holes CNH2 with a conductive material. The contacts CNT may be connected to the second source/drain regions SD2. In detail, the conductive material may be formed on the entire top surface of the substrate SUB and then may be recessed until a top surface of the conductive material is lower than top surfaces of the insulating fences IFS. In this case, the conductive material may be cut or separated by the insulating fences IFS, and as a result, the contacts CNT may be formed in the second contact holes CNH2, respectively. The contacts CNT and the insulating fences IFS may be alternately arranged in the first direction D1.

The conductive material filling the second contact holes CNH2 may be formed of or include at least one of doped semiconductor materials. In an example embodiment, the second contact holes CNH2 may be filled with a doped semiconductor material, and then, impurities in the semiconductor material may be diffused into the second source/drain regions SD2.

Referring to FIGS. 31 and 32A to 32D, landing pads LP may be formed on the contacts CNT, respectively. In detail, a metal layer may be formed on the contacts CNT and the insulating fences IFS. The landing pads LP may be formed by patterning the metal layer.

The patterning of the metal layer may be performed using the photolithography process previously described with reference to FIGS. 15 and 16. The photomask 1400 previously described with reference to FIG. 15 may be used as a photomask for forming the landing pads LP. In other words, the photomask for forming the landing pads LP may be manufactured through the OPC method described with reference to FIGS. 4 to 15.

Since the photomask manufactured through the afore-described OPC method is used to form the landing pads LP, the landing pads LP may be precisely formed, even when the landing pads LP have fine sizes and fine pitches. Thus, it may be possible to form the landing pads LP on the contacts CNT, respectively, without a process defect issue.

An insulating pattern INP may be formed by filling a space between the landing pads LP with an insulating material. First electrodes LEL may be formed on the landing pads LP, respectively. The afore-described photolithography process may be used as a part of a patterning process to form the first electrodes LEL.

A dielectric layer HDL may be conformally formed on the first electrodes LEL. A second electrode TEL may be formed on the dielectric layer HDL. The first electrode LEL, the dielectric layer HDL, and the second electrode TEL may constitute a data storing element DS (e.g., a capacitor). Metal layers (e.g., M1, M2, M3, M4, and so forth) may be further formed on the second electrode TEL.

Figure 33:
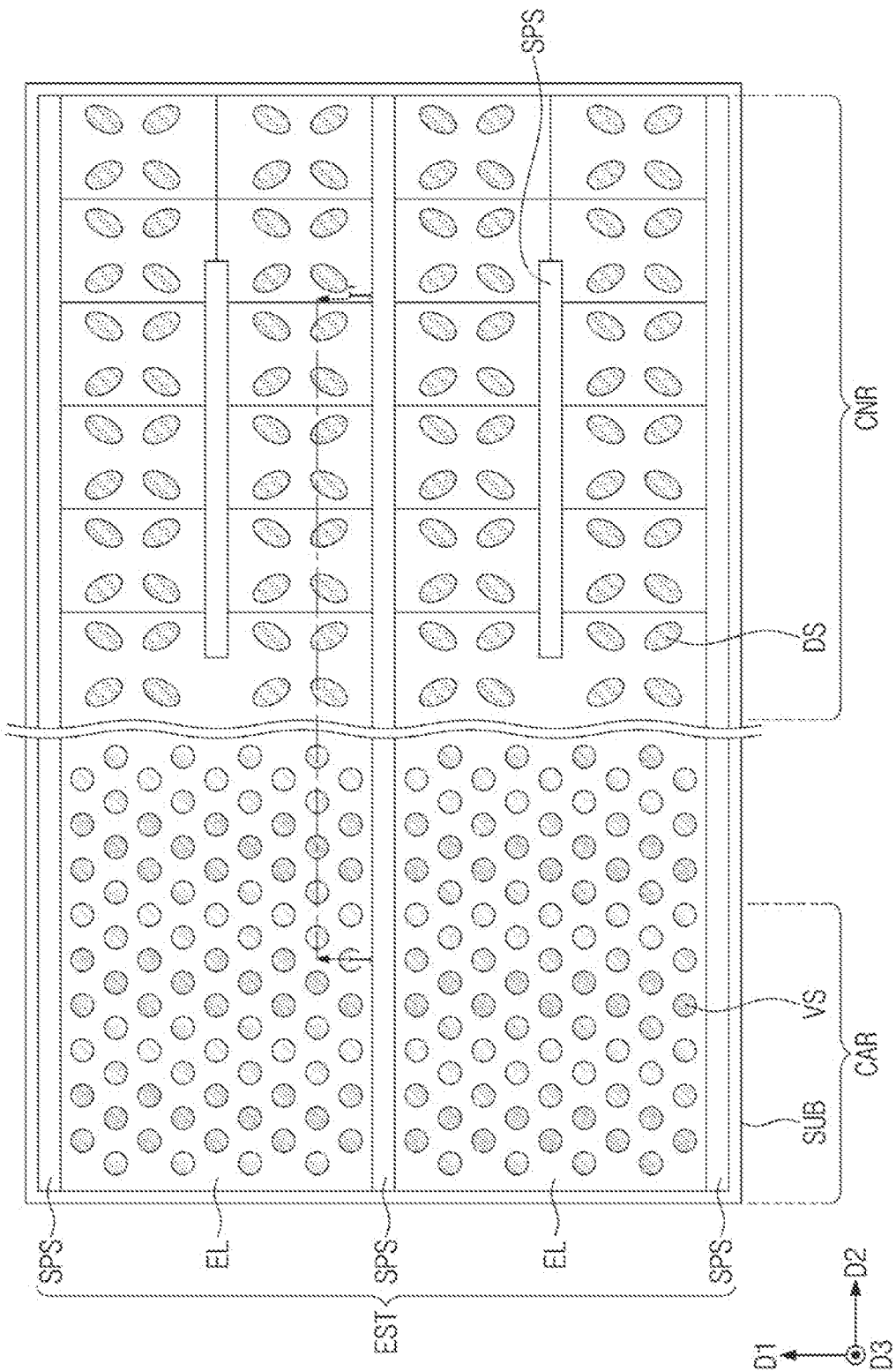
FIG. 33 is a plan view illustrating a method of fabricating a three-dimensional semiconductor memory device, according to an example embodiment.

FIG. 33 is a plan view illustrating a method of fabricating a three-dimensional semiconductor memory device, according to an example embodiment. FIGS. 34 to 39 are sectional views, which are taken along a line I-I' of FIG. 33 to illustrate a method of fabricating a three-dimensional semiconductor memory device, according to an example embodiment.

Figure 34:
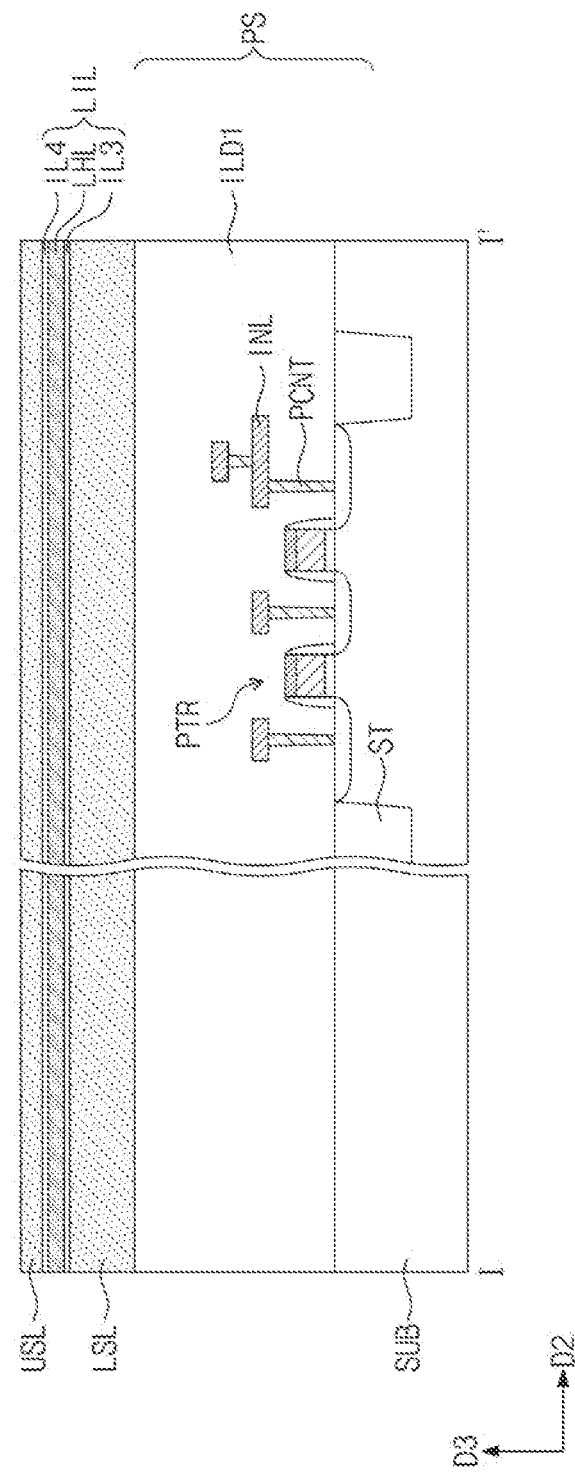
FIGS. 34 to 39 are sectional views, which are taken along a line I-I' of FIG. 33 to illustrate a method of fabricating a three-dimensional semiconductor memory device, according to an example embodiment.

Referring to FIGS. 33 and 34, a peripheral circuit structure PS may be formed on a substrate SUB. The formation of the peripheral circuit structure PS may include forming peripheral transistors PTR on the substrate SUB and forming lower interconnection lines INL on the peripheral transistors PTR. For example, the formation of the peripheral transistors PTR may include forming a device isolation layer ST on the substrate SUB to define active regions, forming a gate insulating layer and a gate electrode on the active regions, and doping upper portions of the active regions with impurities to form source/drain regions. A first interlayer insulating layer ILD1 may be formed to cover the peripheral transistors PTR and the lower interconnection lines INL.

A lower semiconductor layer LSL may be formed on the first interlayer insulating layer ILD1. For example, the lower semiconductor layer LSL may be formed of or include a semiconductor material (e.g., polysilicon). A lower insulating layer LIL may be formed on the lower semiconductor layer LSL. The formation of the lower insulating layer LIL may include sequentially forming a third insulating layer IL3, a lower sacrificial layer LHL, and a fourth insulating layer IL4 on the lower semiconductor layer LSL. The third and fourth insulating layers IL3 and IL4 may be formed of or include silicon oxide, and the lower sacrificial layer LHL may be formed of or include silicon nitride or silicon oxynitride. An upper semiconductor layer USL may be conformally formed on the lower sacrificial layer LHL. For example, the upper semiconductor layer USL may be formed of or include a semiconductor material (e.g., polysilicon).

Figure 35:
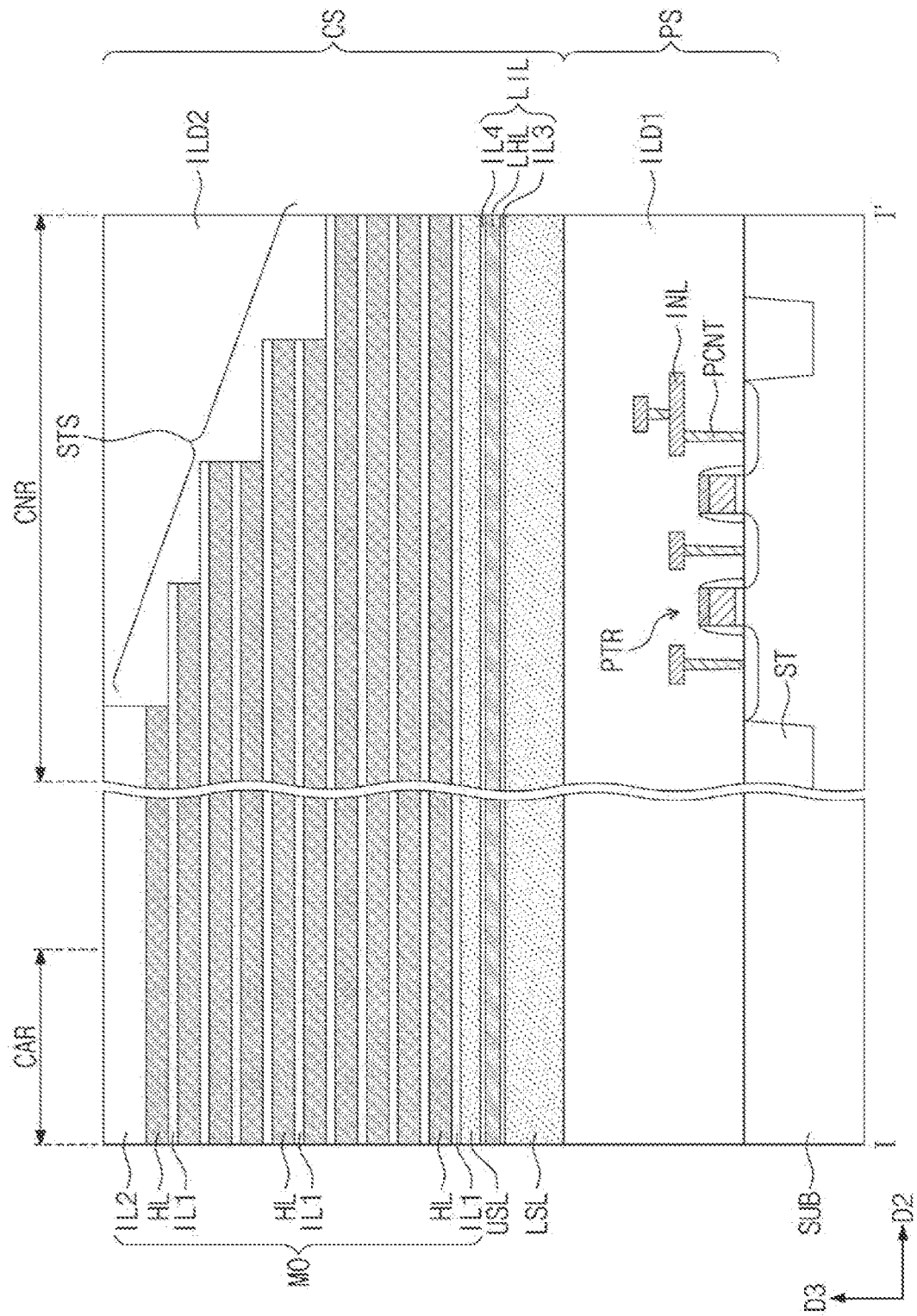

Referring to FIGS. 33 and 35, a stack metal oxide (MO) may be formed on the upper semiconductor layer USL. In detail, the stack MO may be formed by alternately stacking first insulating layers IL1 and sacrificial layers HL on the upper semiconductor layer USL. A second insulating layer IL2 may be formed at a topmost level of the stack MO.

The first insulating layers IL', the sacrificial layers HL, and the second insulating layer IL2 may be deposited using at least one of thermal chemical vapor deposition, plasma-enhanced chemical vapor deposition, physical chemical vapor deposition, or atomic layer deposition processes. The first and second insulating layers IL1 and IL2 may be formed of or include silicon oxide, and the sacrificial layers HL may be formed of or include at least one of silicon nitride or silicon oxynitride.

A staircase structure STS may be formed in the stack MO on a connection region CNR. In detail, the staircase structure STS may be formed on the connection region CNR by performing a cycle process on the stack MO. The formation of the staircase structure STS may include forming a mask pattern on the stack MO and repeatedly performing a patterning process using the mask pattern. Each patterning process may include a step of etching a portion of the stack MO using the mask pattern as an etch mask and a trimming step of reducing a size (e.g., a width) of the mask pattern.

A second interlayer insulating layer ILD2 may be formed on the stack MO. The formation of the second interlayer insulating layer ILD2 may include forming an insulating layer to cover the stack MO and performing a planarization process on the insulating layer to expose the second insulating layer IL2.

Figure 36:
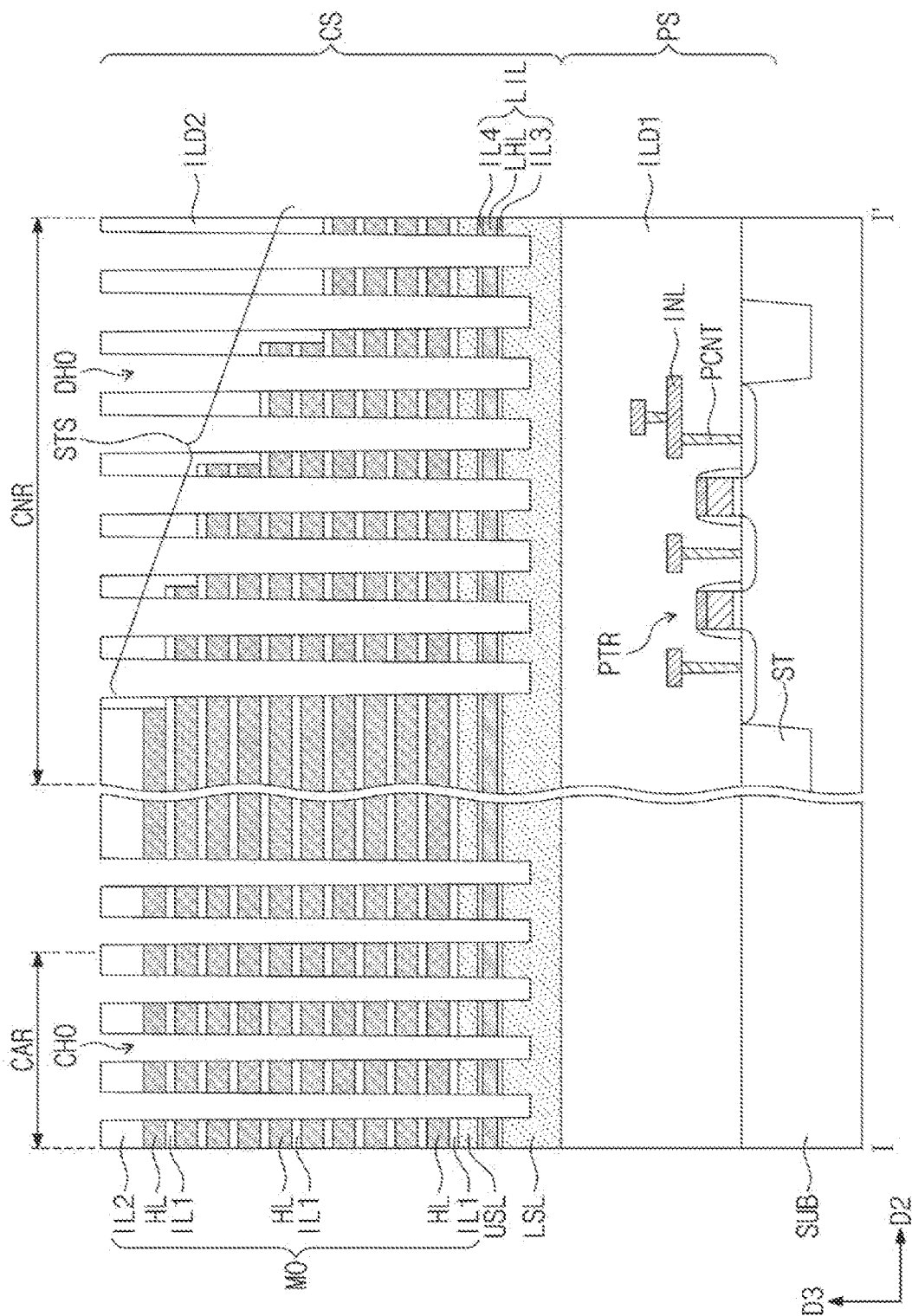

Referring to FIGS. 33 and 36, channel holes CHO may be formed on a cell array region CAR to penetrate the stack MO. In addition, dummy holes DHO may be formed on the connection region CNR to penetrate the stack MO. The dummy holes DHO may be formed to penetrate the staircase structure STS of the stack MO. Each of the channel and dummy holes CHO and DHO may expose the lower semiconductor layer LSL.

In detail, the patterning process for forming the channel holes CHO may be performed using the photolithography process previously described with reference to FIGS. 15 and 16. The photomask 1400 previously described with reference to FIG. 15 may be used as a photomask for forming the channel holes CHO. In other words, the photomask for forming the channel holes CHO may be manufactured through the OPC method described with reference to FIGS. 4 to 15.

Since the photomask manufactured through the afore-described OPC method is used to form the channel holes CHO, the channel holes CHO may be precisely formed, even when the channel holes CHO have fine sizes and fine pitches. Accordingly, it may be possible to form the channel holes CHO precisely penetrating the stack MO, without a process defect issue.

When viewed in a plan view, the channel holes CHO may be arranged in a specific direction or in a zigzag shape. The largest diameter of each of the channel holes CHO may be smaller than the largest diameter of each of the dummy holes DHO.

Figure 37:
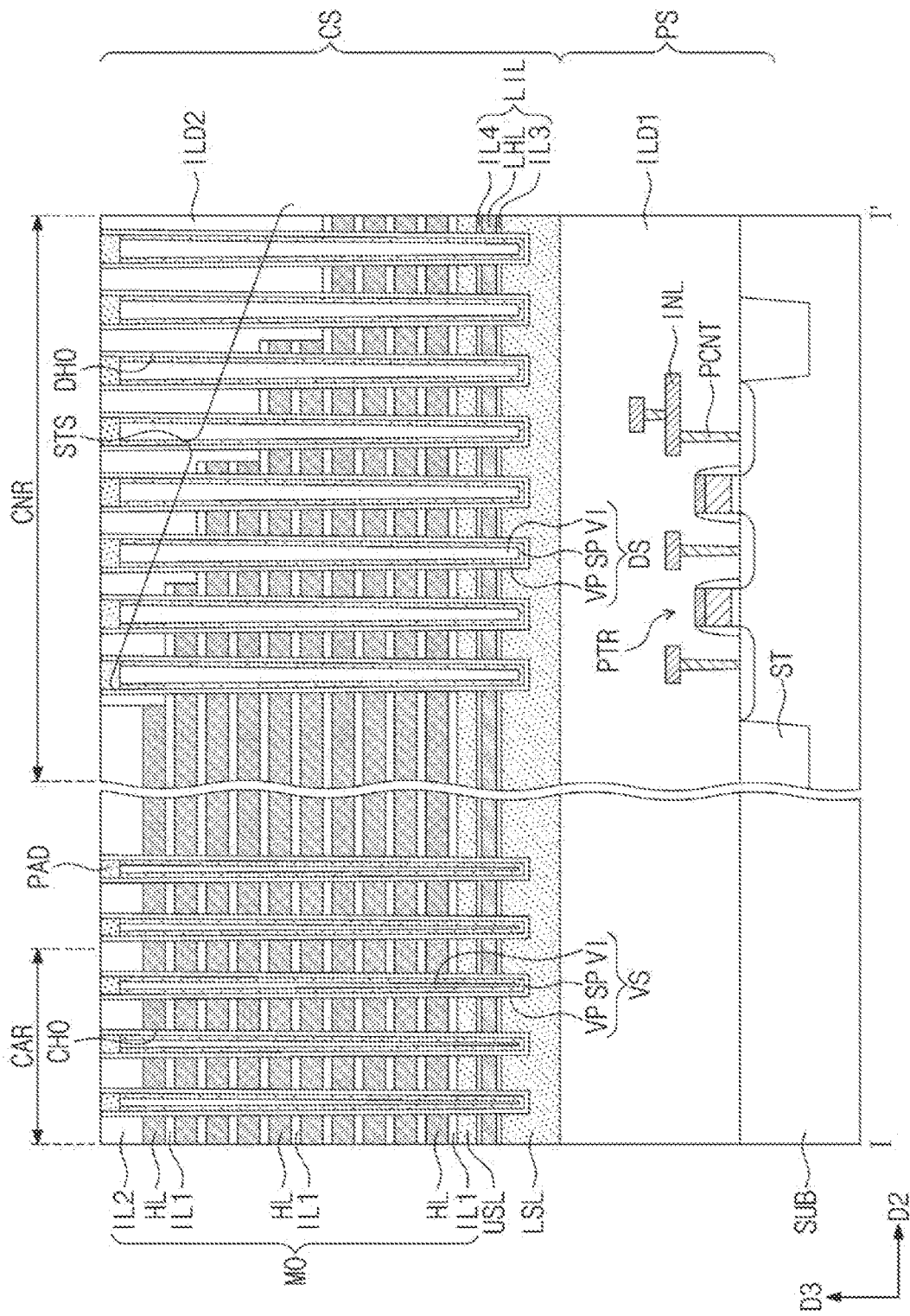

Referring to FIGS. 33 and 37, vertical channel structures VS may be formed in the channel holes CHO, respectively. Dummy structures DS may be formed in the dummy holes DHO, respectively. A conductive pad may be formed on each of the vertical channel structures VS and the dummy structures DS.

In detail, a vertical insulating pattern VP may be formed to conformally cover an inner surface of each channel hole CHO. The formation of the vertical insulating pattern VP may include sequentially forming a blocking insulating layer, a charge storing layer, and a tunnel insulating layer in the channel hole CHO. A vertical semiconductor pattern SP may be formed in the channel hole CHO to cover the vertical insulating pattern VP. The formation of the vertical semiconductor pattern SP may include forming a poly-silicon layer in the channel hole CHO. Thereafter, a gap-fill insulating pattern VI may be formed in the channel hole CHO.

The dummy structure DS in the dummy hole DHO may be formed simultaneously with the vertical channel structure VS.

Figure 38:
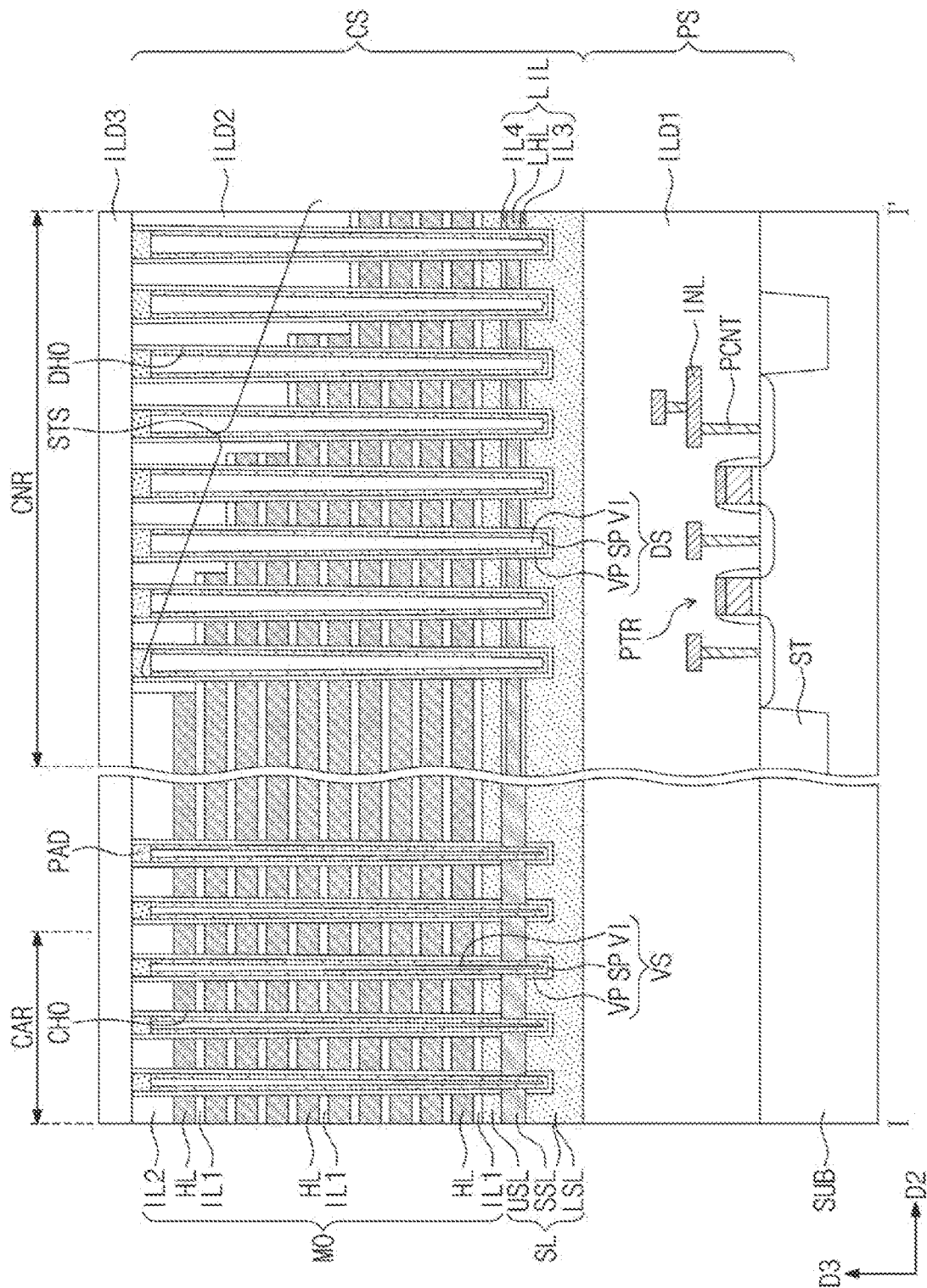

Referring to FIGS. 33 and 38, a third interlayer insulating layer ILD3 may be formed on the stack MO and the second interlayer insulating layer ILD2. The stack MO may be patterned to form cutting holes SPS penetrating the stack MO (e.g., see FIG. 33). The cutting hole SPS may be formed to expose the lower sacrificial layer LHL. The lower sacrificial layer LHL, which is exposed through the cutting hole SPS, may be replaced with a source semiconductor layer SSL. The source semiconductor layer SSL may be in direct contact with an exposed portion of the vertical semiconductor pattern SP. In an example embodiment, the lower sacrificial layer LHL on the connection region CNR may not be removed. Thus, the source semiconductor layer SSL may not be formed on the connection region CNR.

Figure 39:
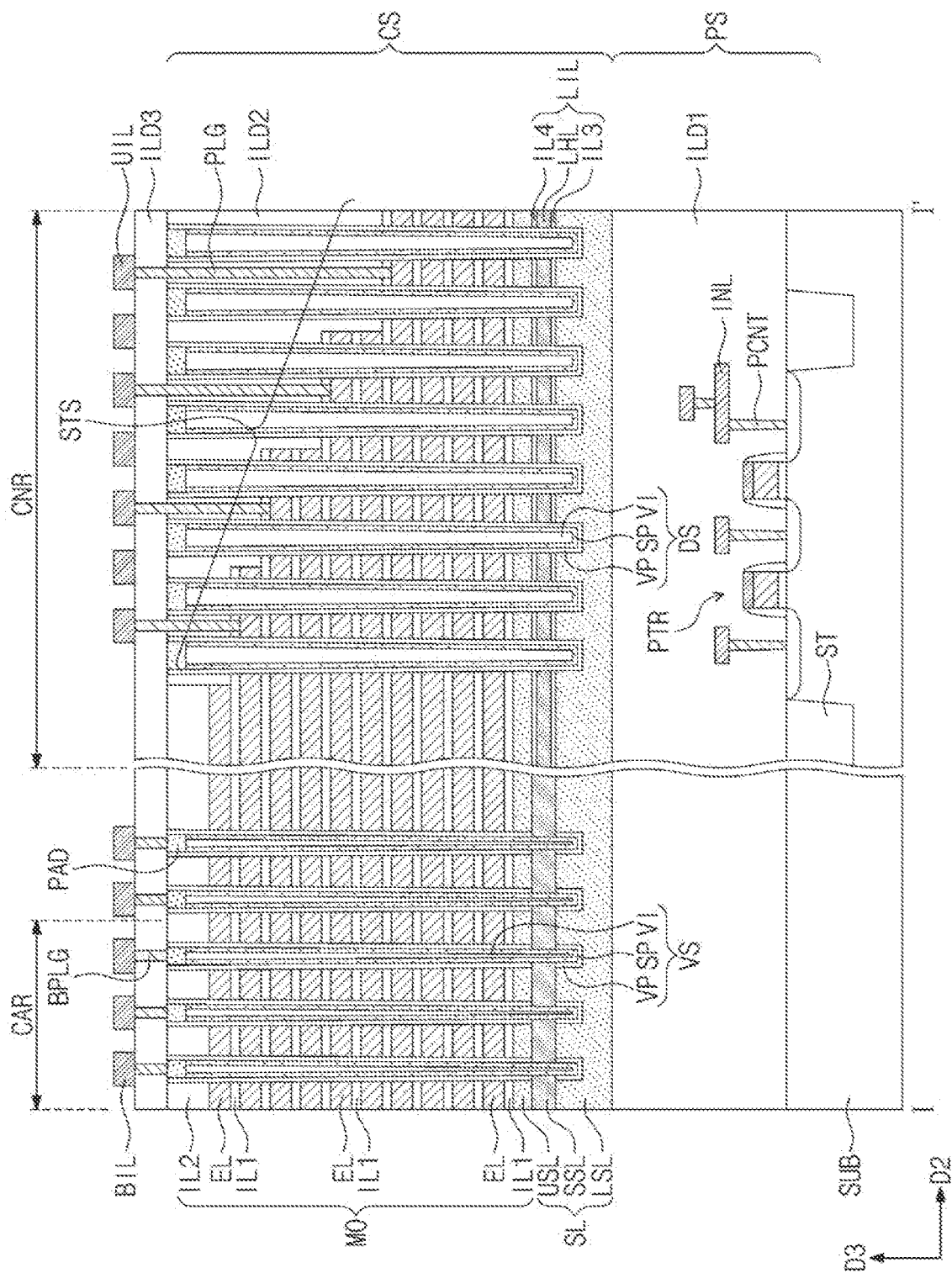

Referring to FIGS. 33 and 39, electrode structure EST may be formed by replacing the sacrificial layers HL, which are exposed through the cutting hole SPS, with electrodes EL. In detail, the sacrificial layers HL, which are exposed through the cutting hole SPS, may be selectively removed. The electrodes EL may be formed in spaces, which are formed by removing the sacrificial layers HL. Thereafter, the cutting hole SPS may be filled with an insulating material.

Bit line contact plugs BPLG may be formed on the cell array region CAR to penetrate the third interlayer insulating layer ILD3 and to be coupled to the conductive pads PAD, respectively. Cell contact plugs PLG may be formed on the connection region CNR to penetrate the second and third interlayer insulating layers ILD2 and ILD3 and to be respectively coupled to the electrodes EL of the staircase structure STS. Bit lines BL and upper interconnection lines UIL may be formed on the third interlayer insulating layer ILD3, and here, the bit lines BL may be electrically connected to the bit line contact plugs BPLG and the upper interconnection lines UIL may be electrically connected to the cell contact plugs PLG.

Figure 40:
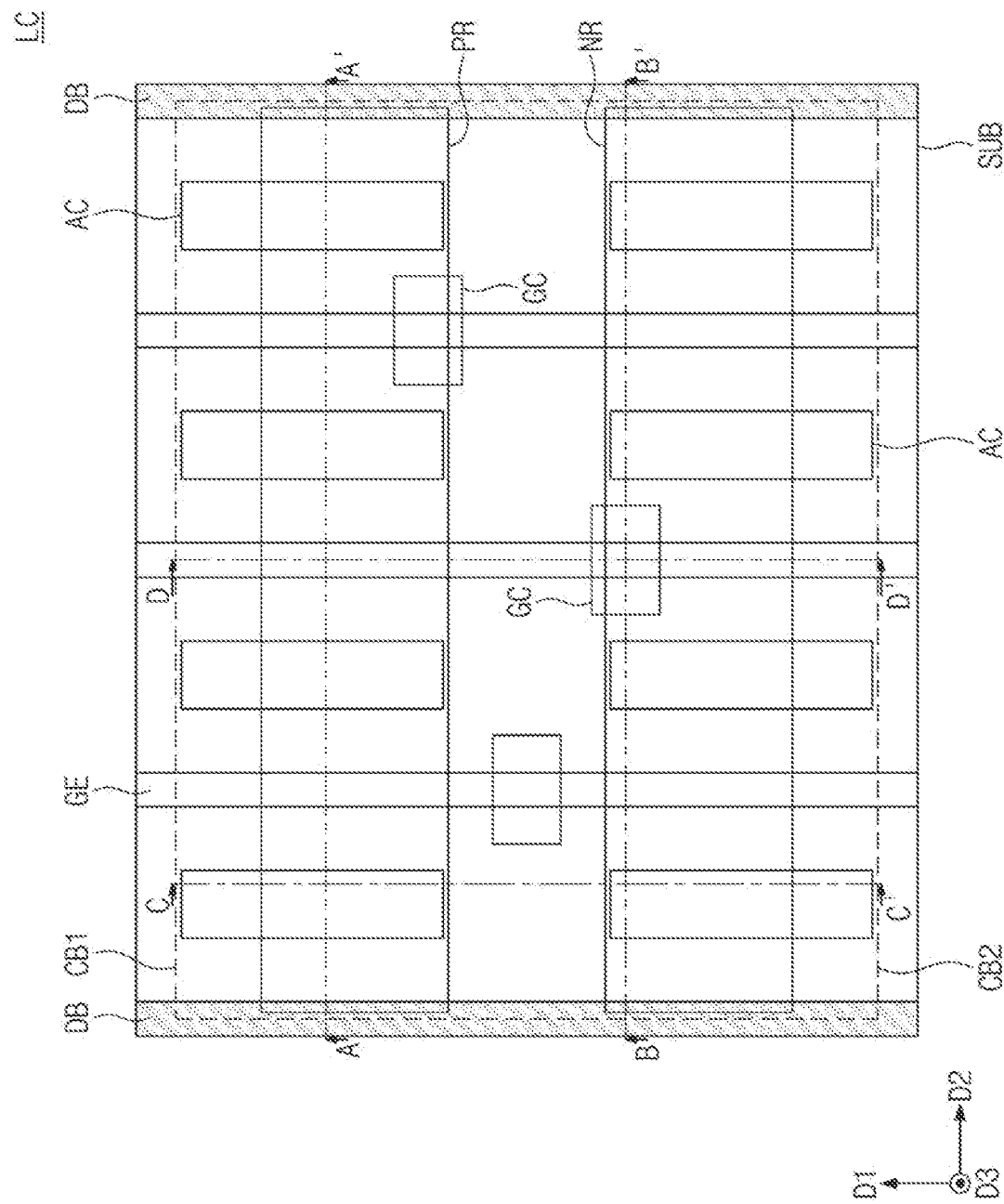
FIGS. 40, 42, and 44 are plan views illustrating a method of fabricating a semiconductor device, according to an example embodiment.
Figure 41A:
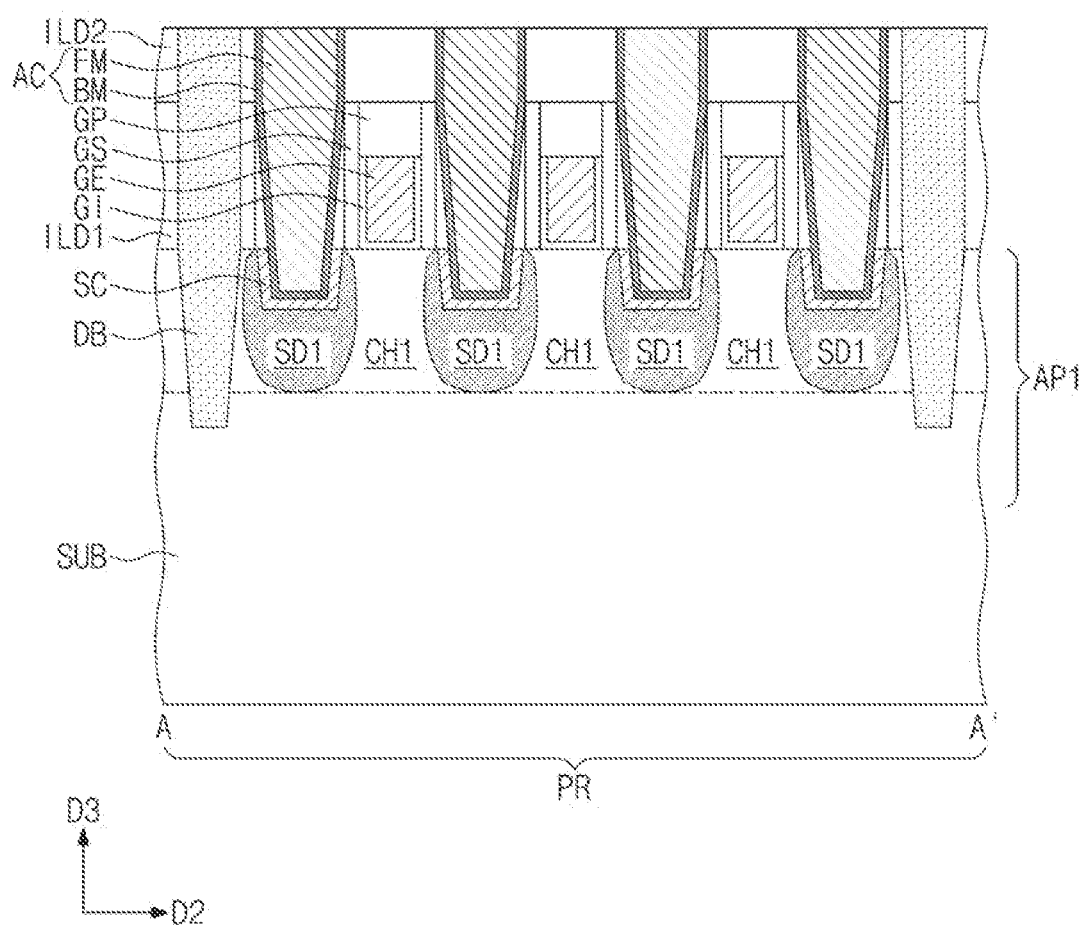
FIGS. 41A, 43A, and 45A are sectional views taken along lines A-A' of FIGS. 40, 42 and 44, respectively.
Figure 41B:
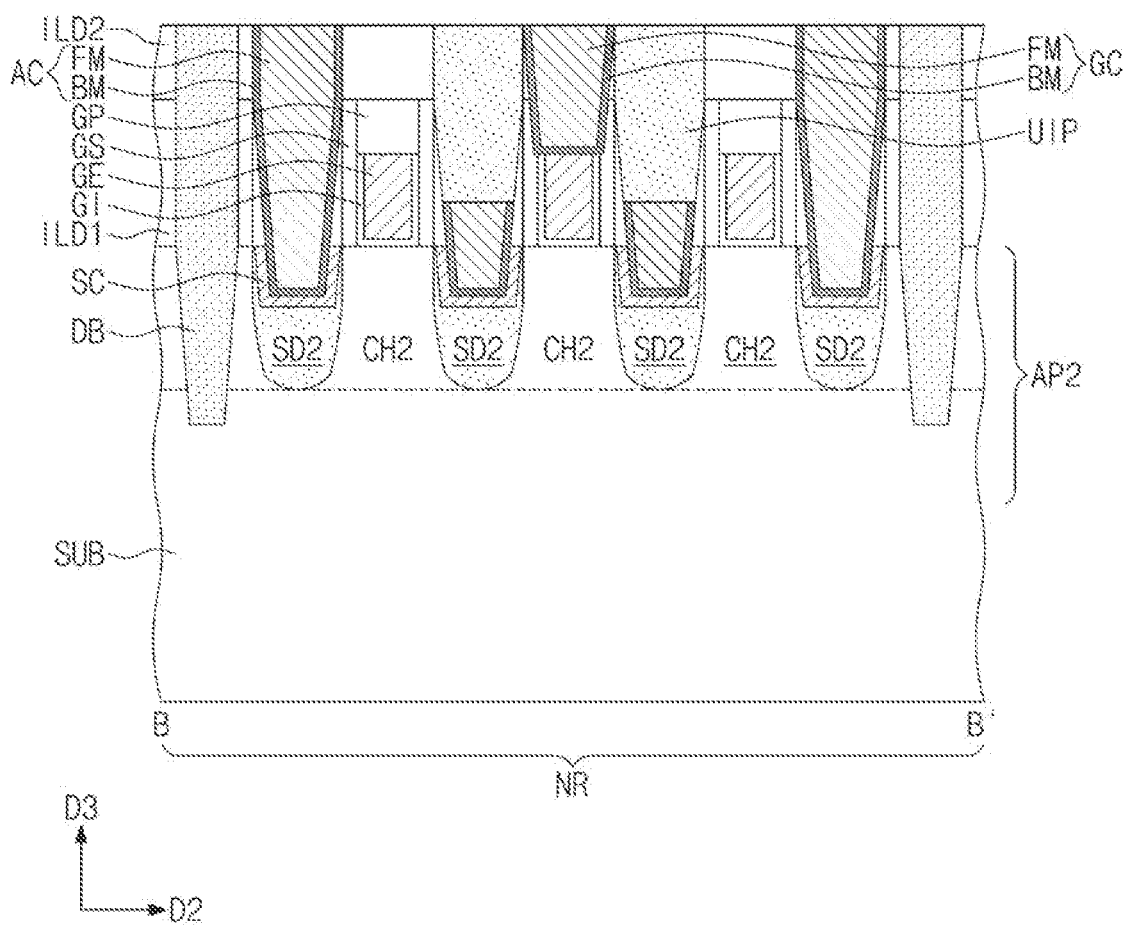
FIGS. 41B, 43B, and 45B are sectional views taken along lines B-B' of FIGS. 40, 42 and 44, respectively.
Figure 41C:
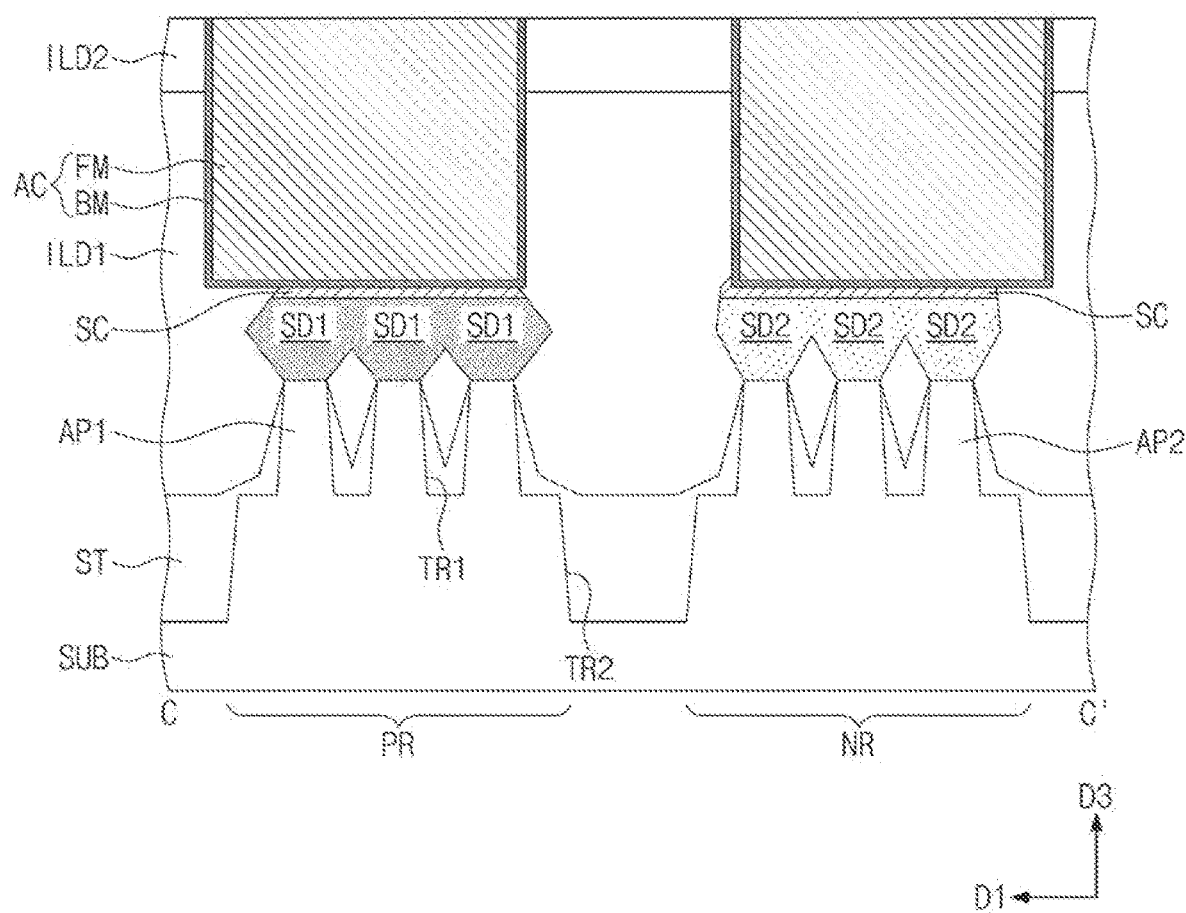
FIGS. 41C, 43C, and 45C are sectional views taken along lines C-C' of FIGS. 40, 42 and 44, respectively.
Figure 41D:
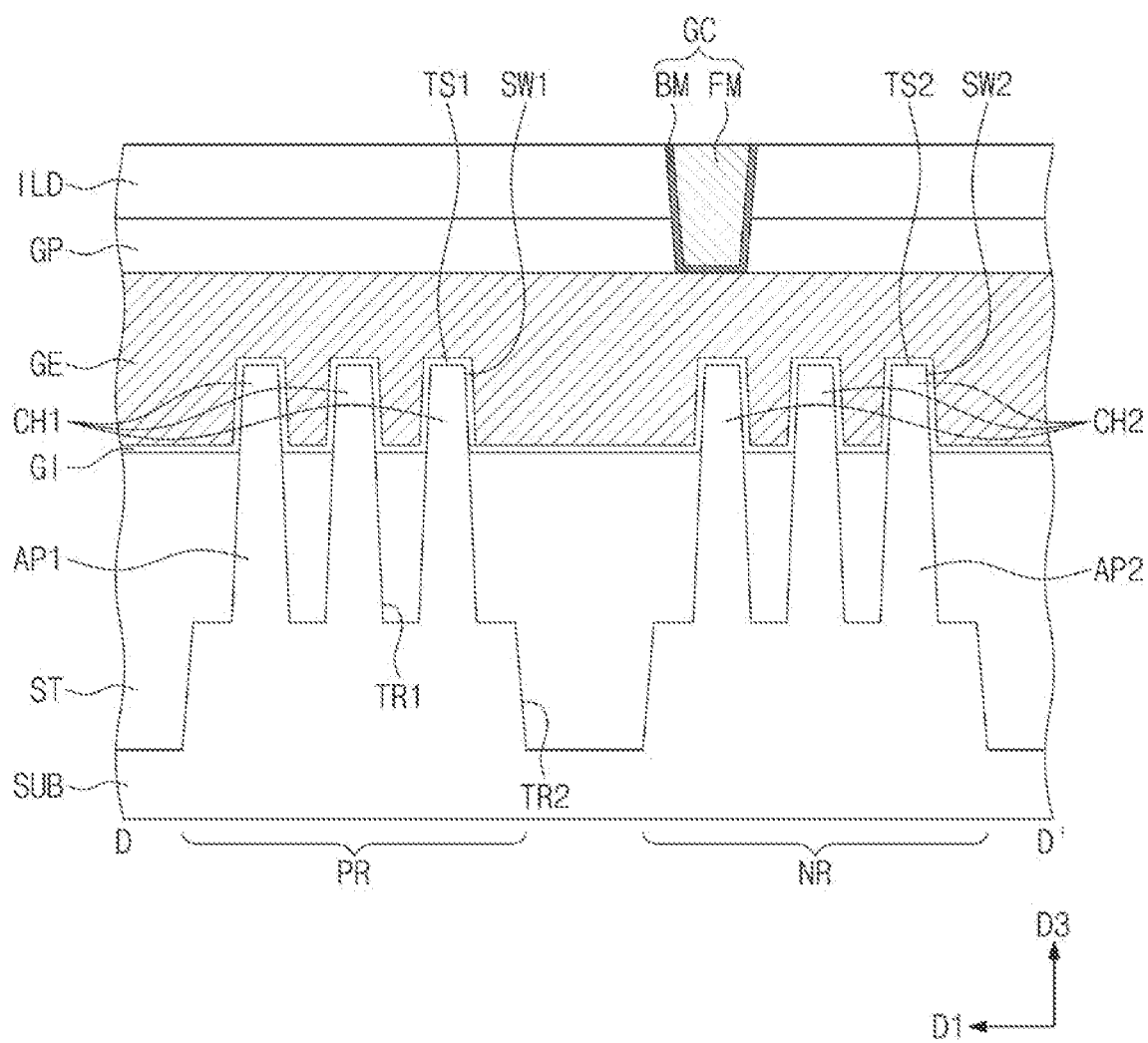
FIGS. 41D, 43D, and 45D are sectional views taken along lines D-D' of FIGS. 40, 42 and 44, respectively.
Figure 42:
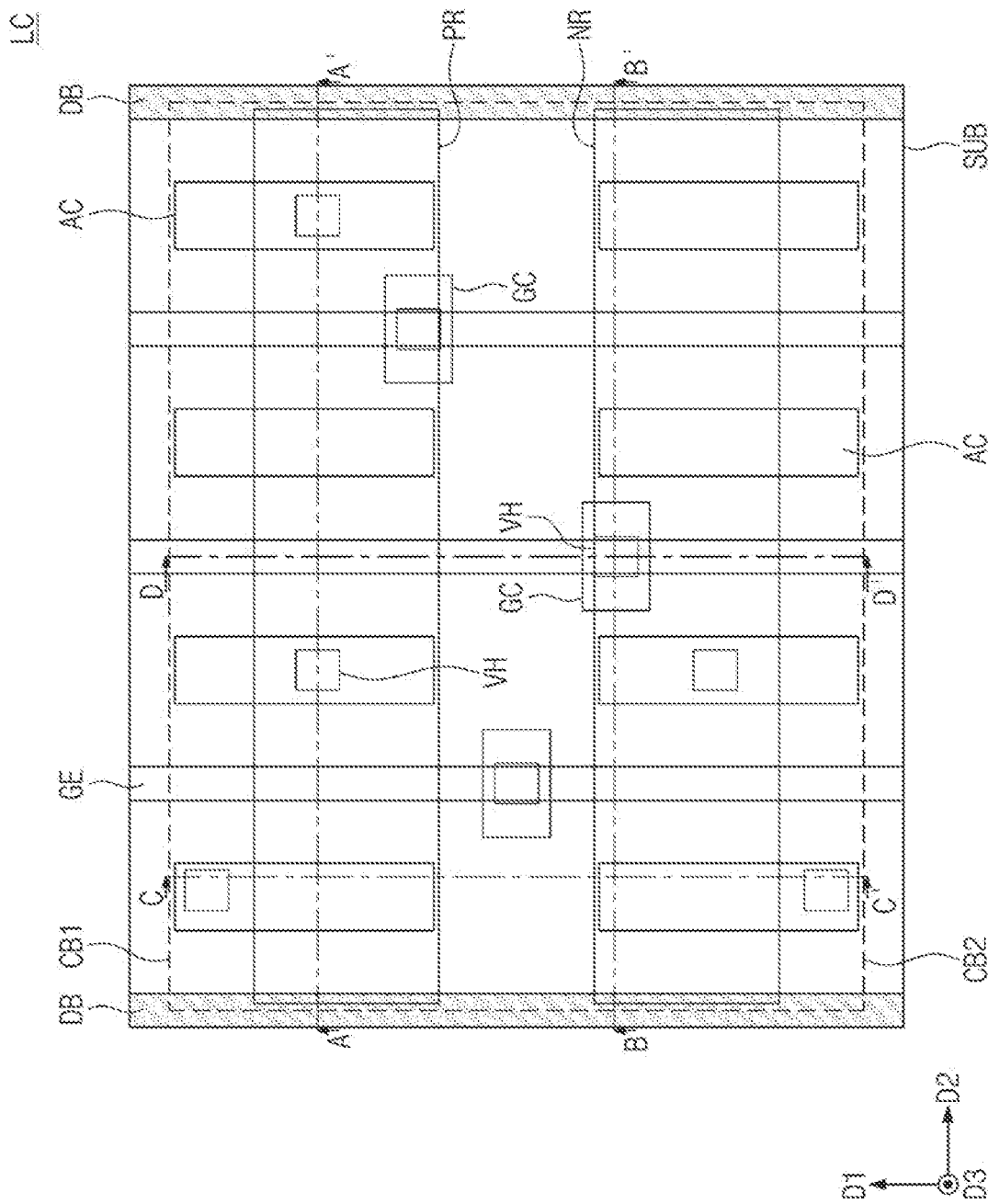
Figure 43A:
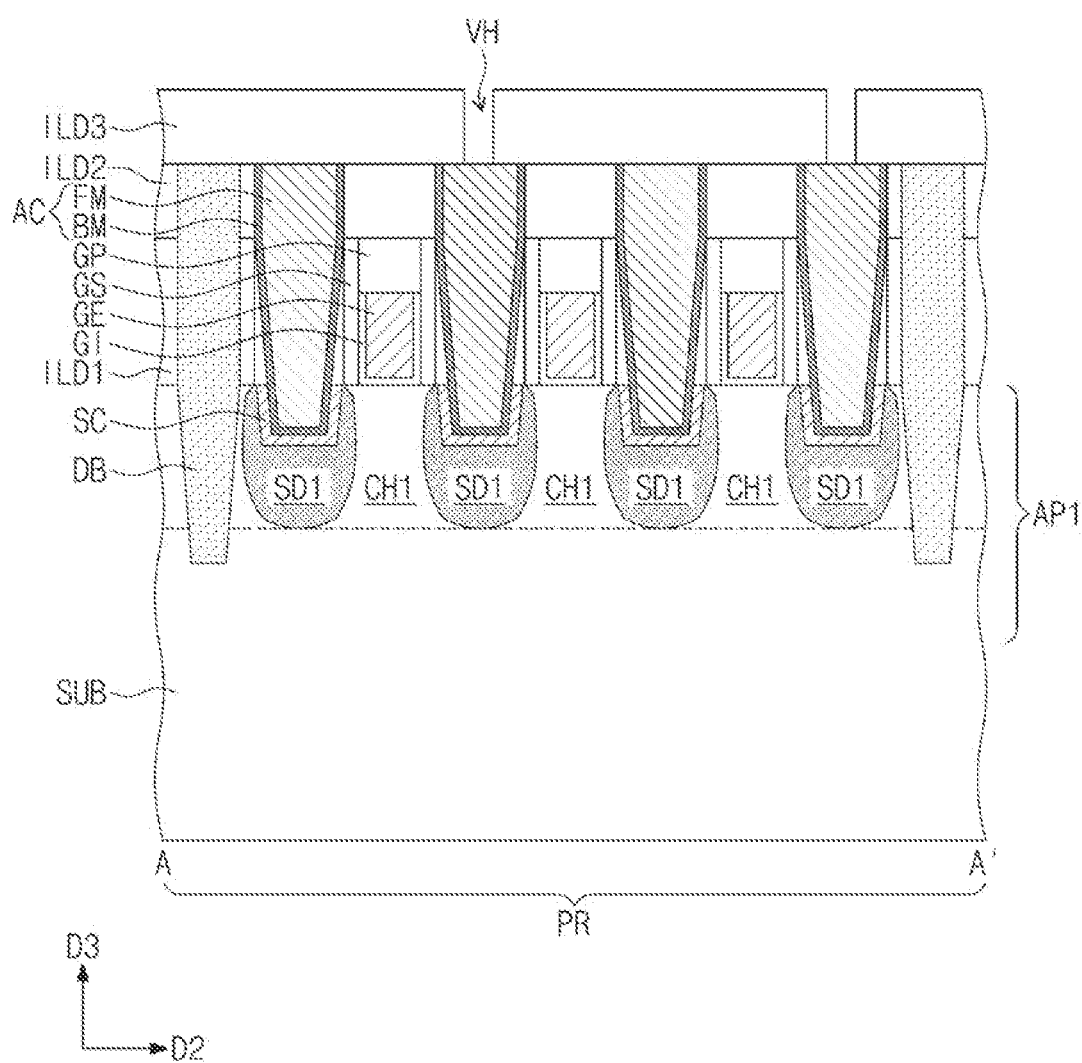
Figure 43B:
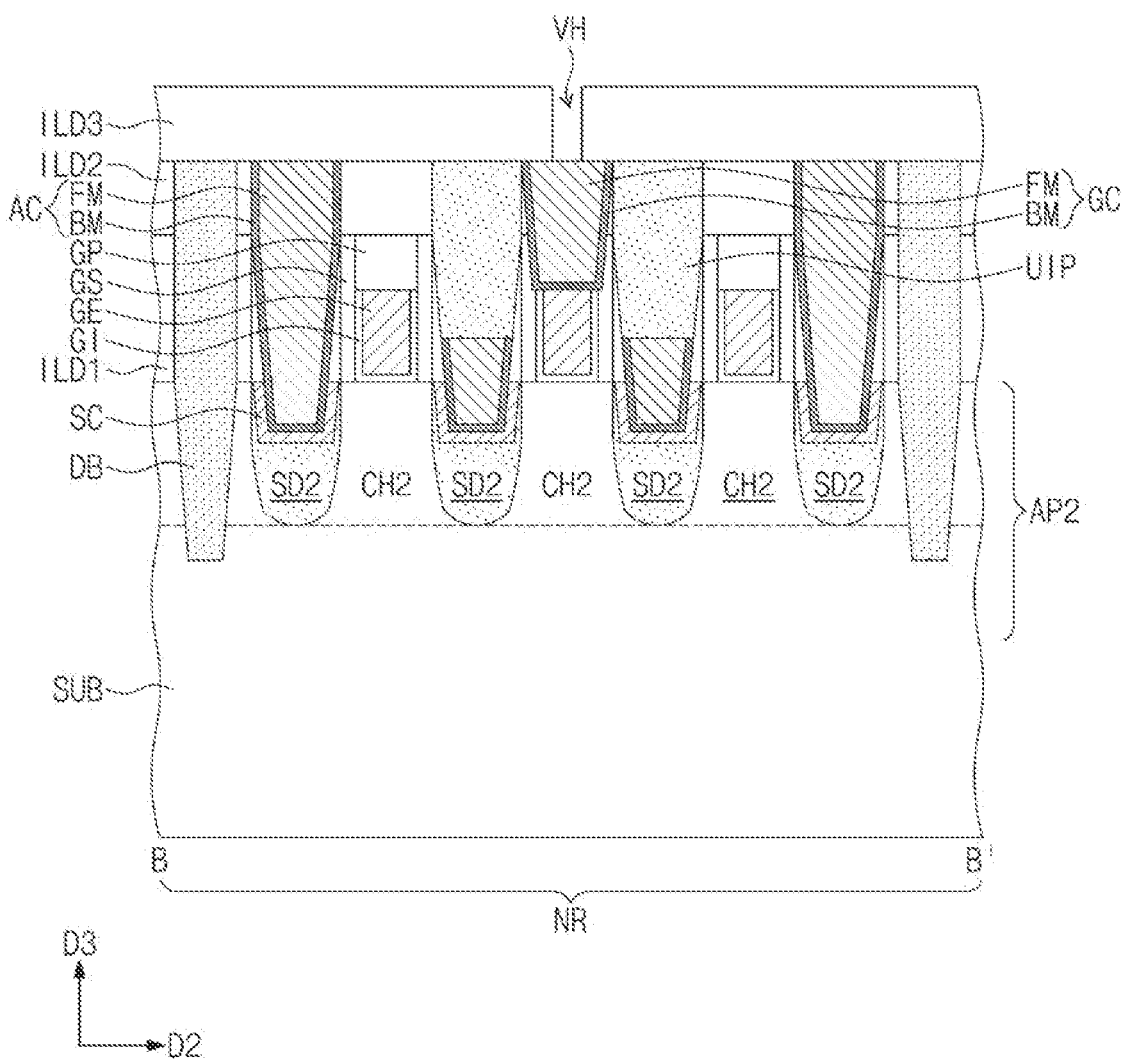
Figure 43C:
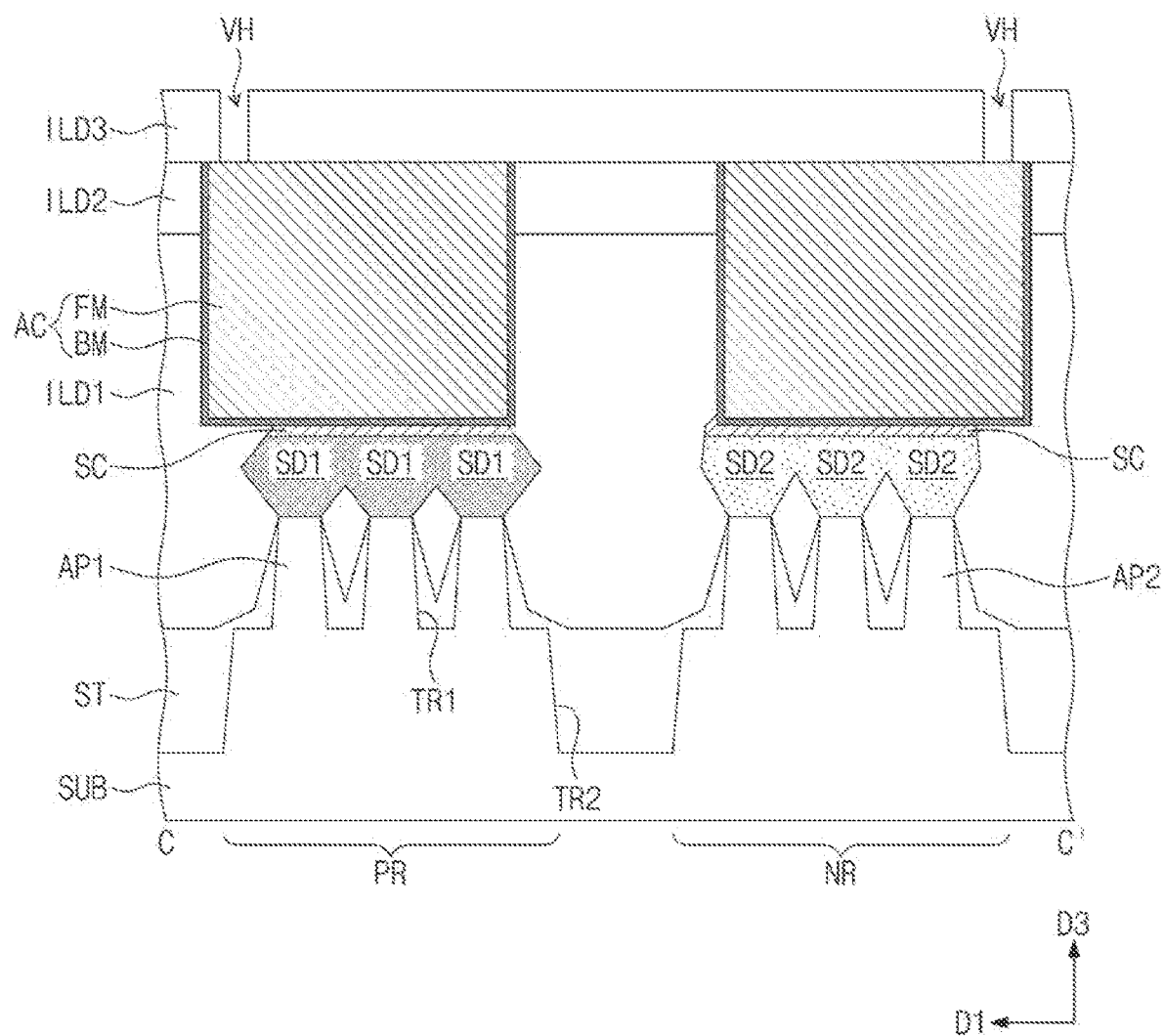
Figure 43D:
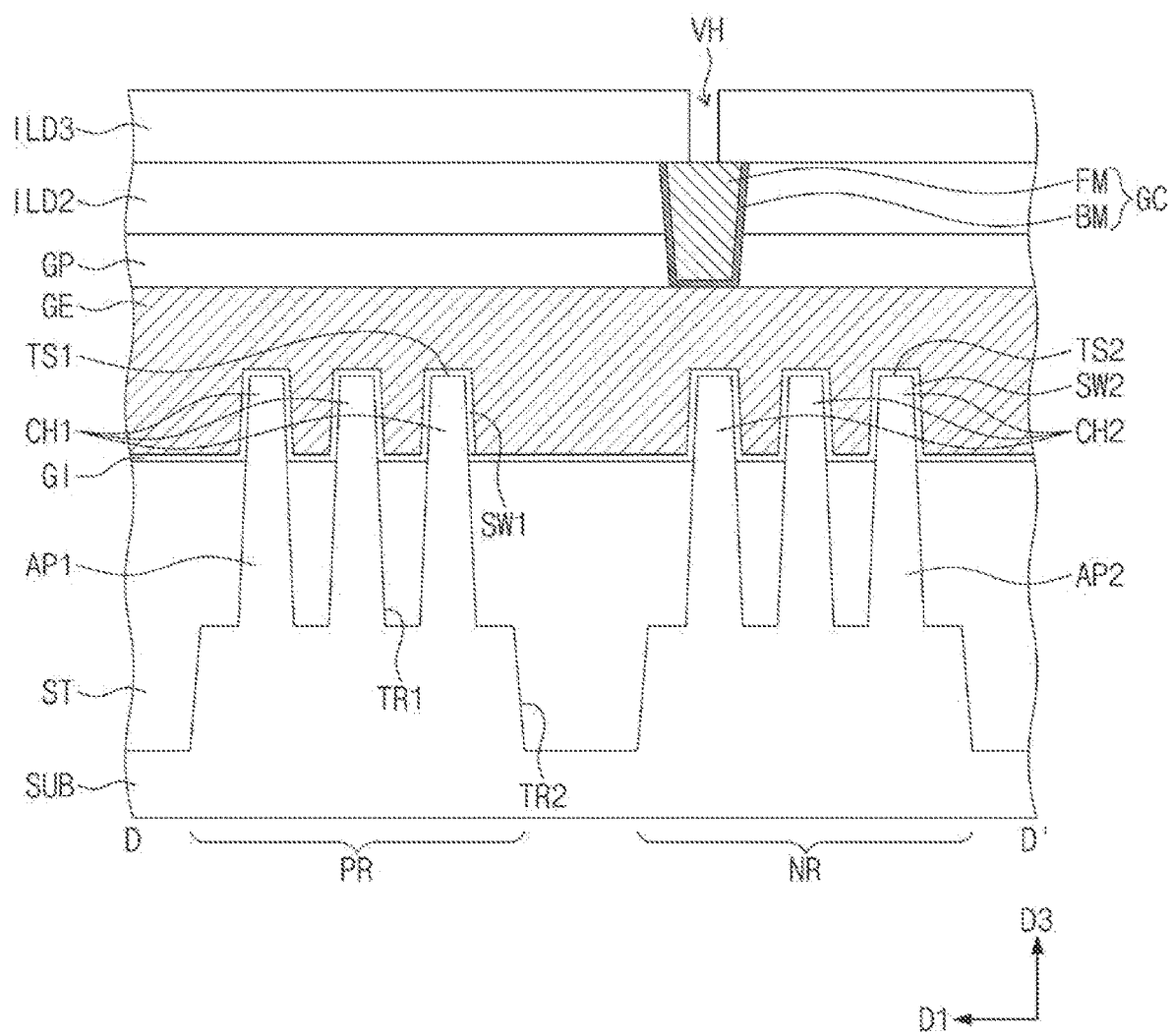
Figure 44:
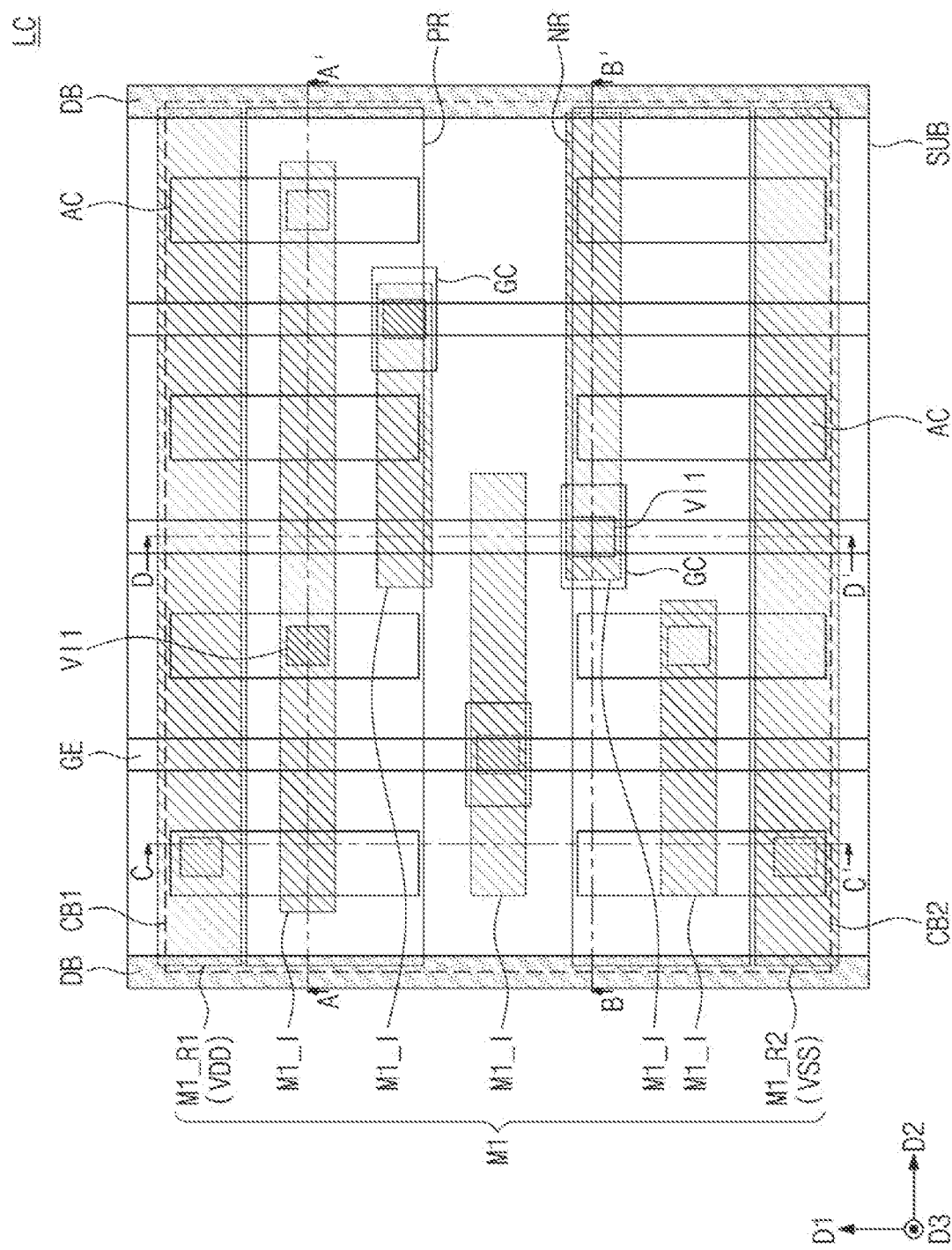
Figure 45A:
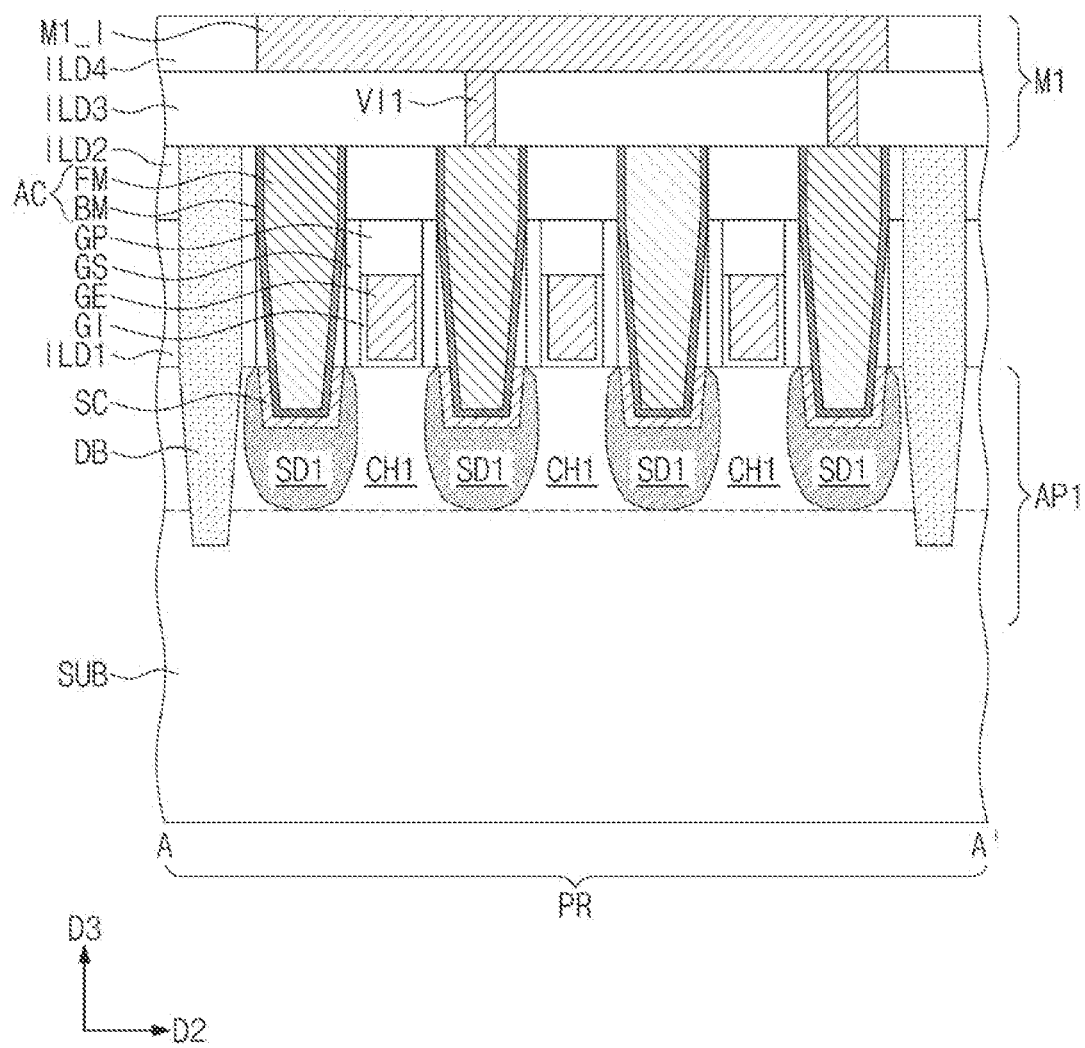
Figure 45B:
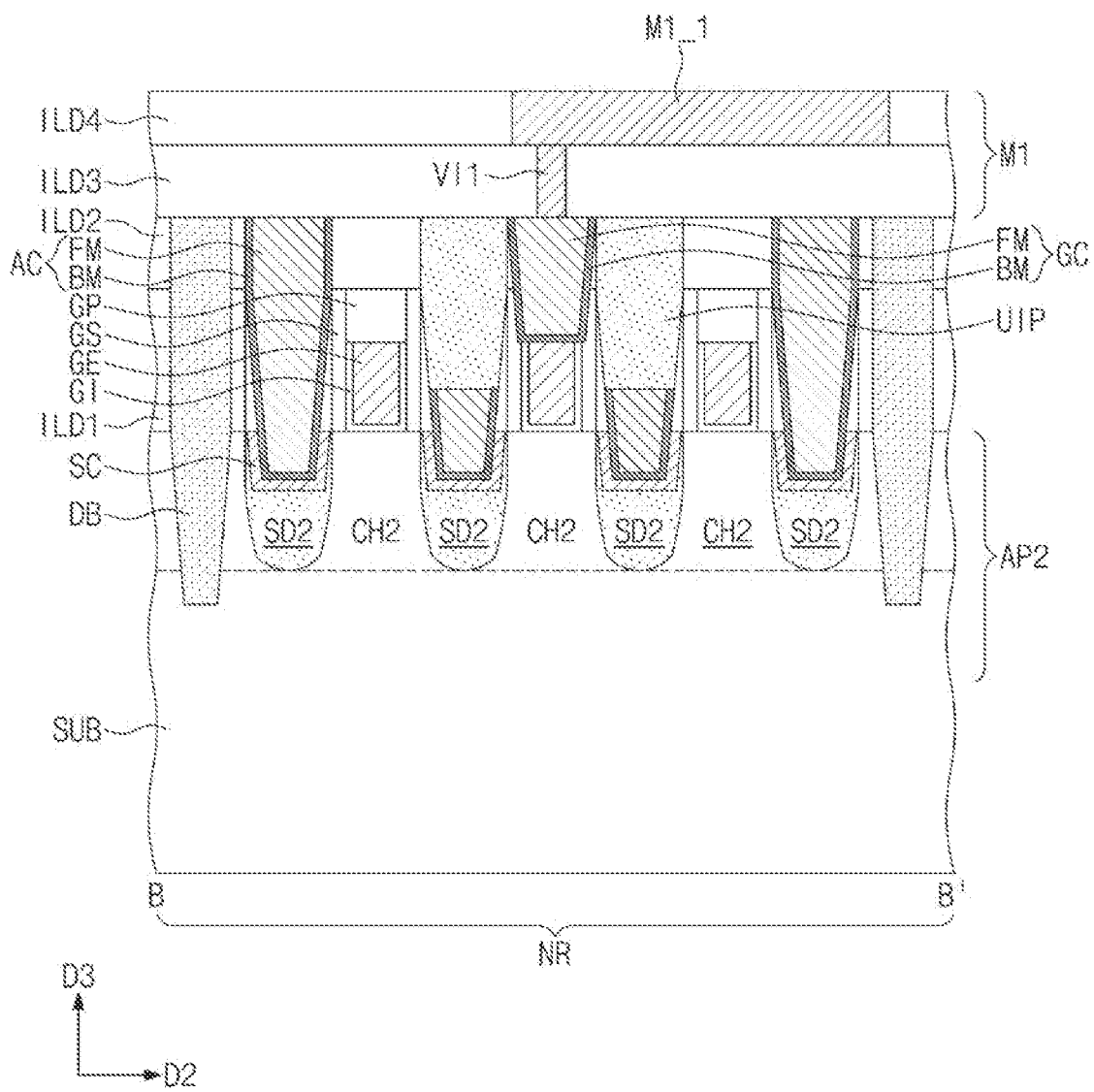
Figure 45C:
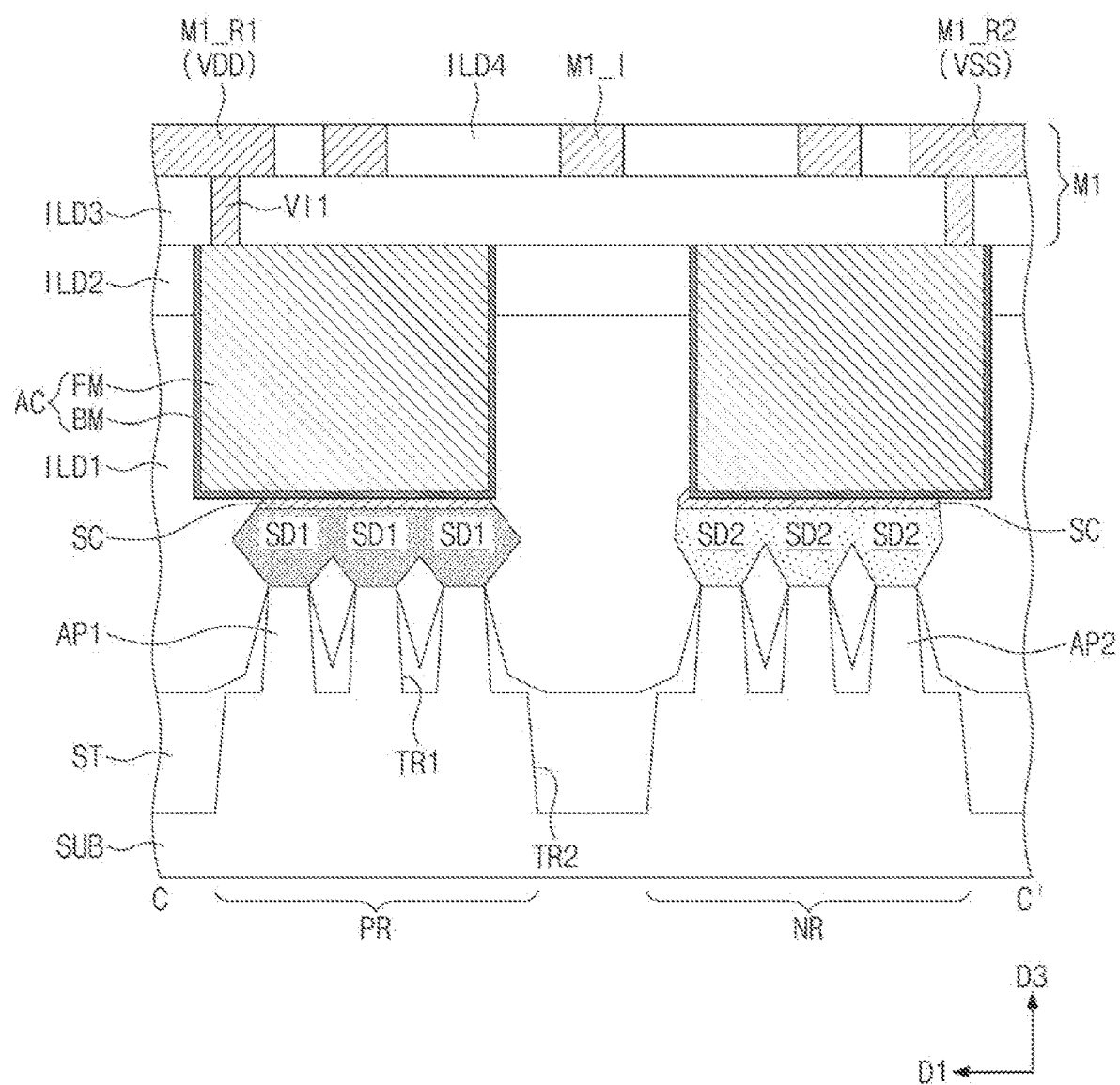
Figure 45D:
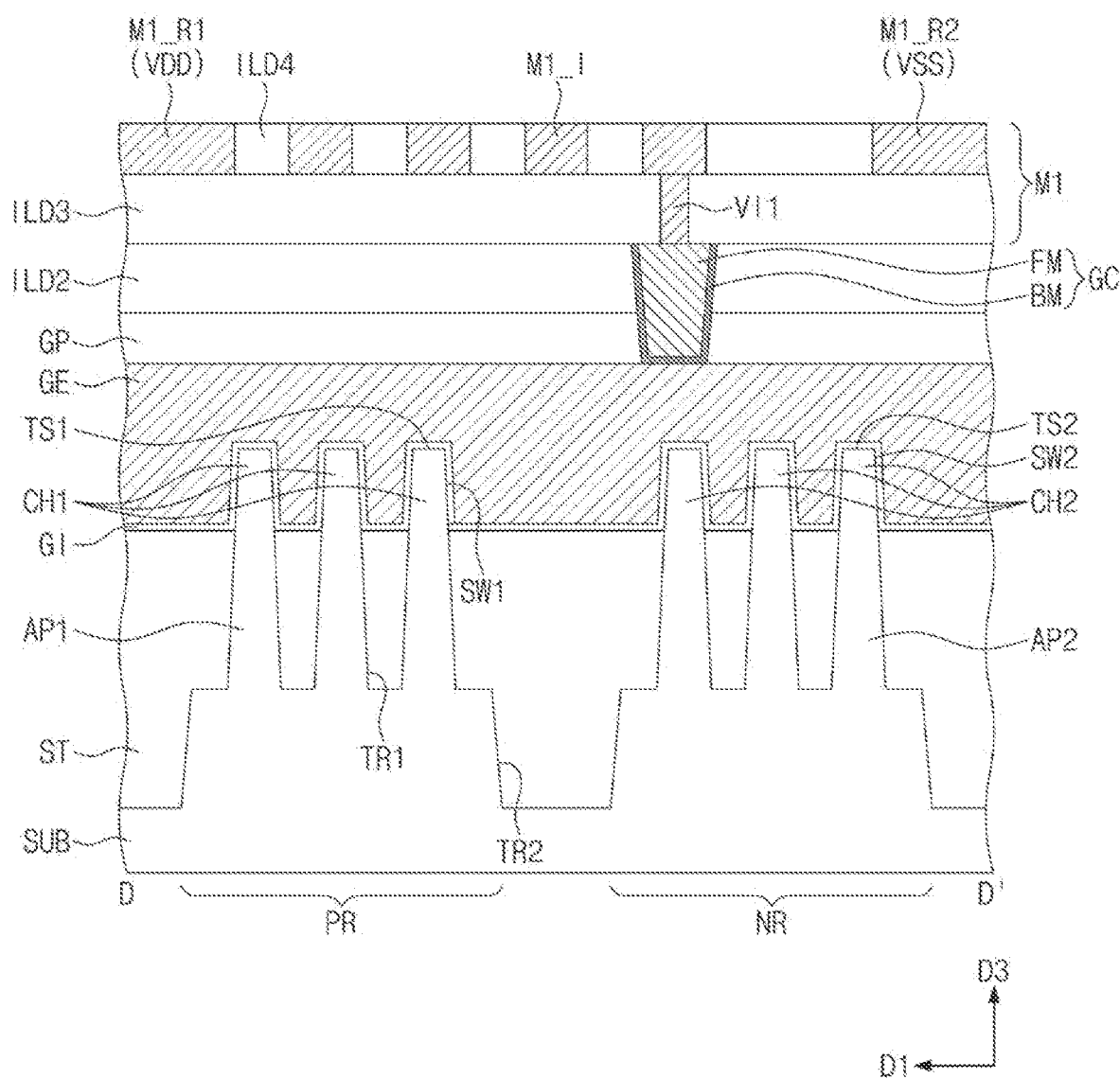
Figure 46:
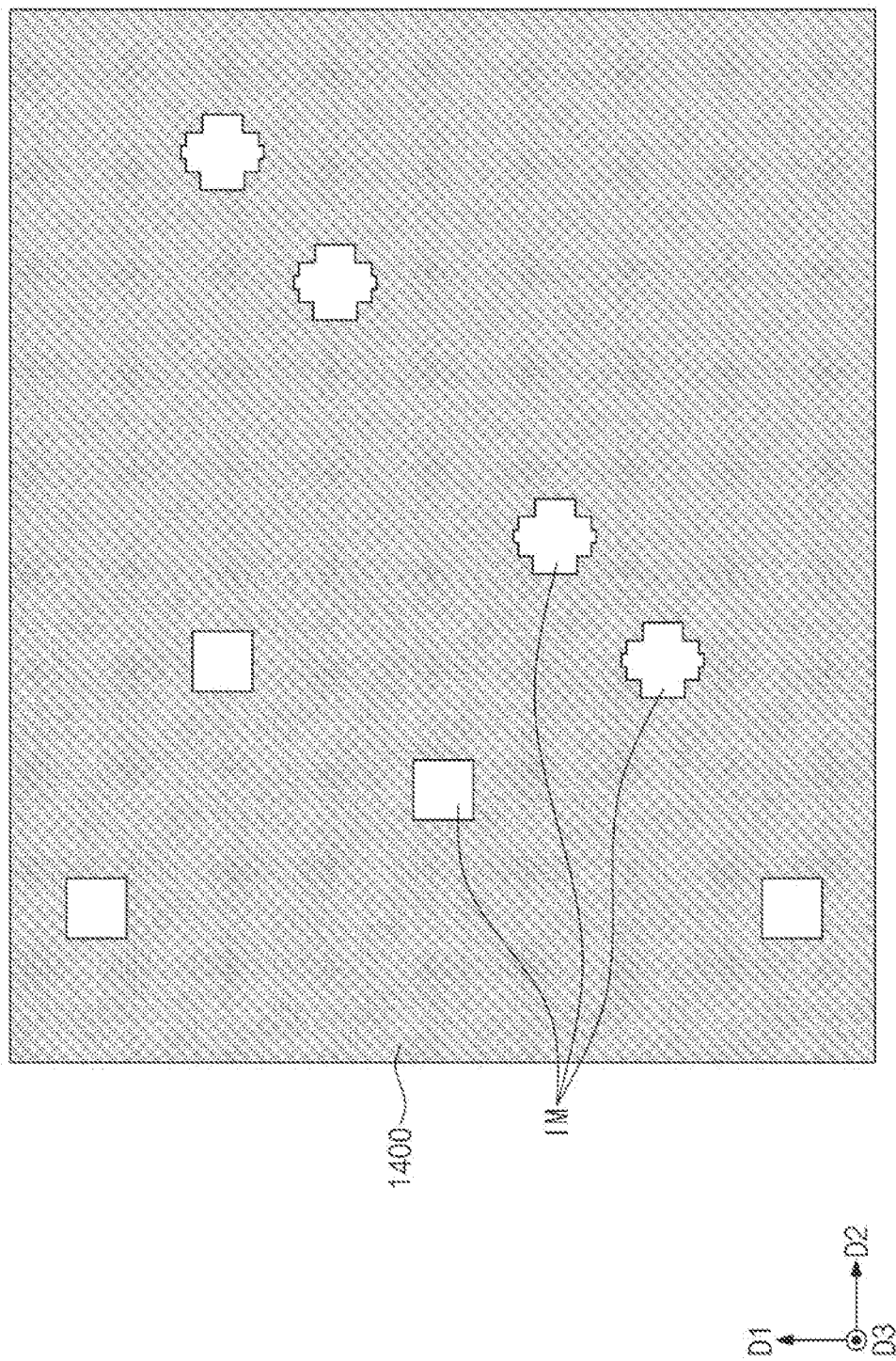
FIG. 46 is a plan view illustrating a photomask, which are used to form via holes, according to an example embodiment.

FIGS. 40, 42, and 44 are plan views illustrating a method of fabricating a semiconductor device, according to an example embodiment. FIGS. 41A, 43A, and 45A are sectional views taken along lines A-A' of FIGS. 40, 42 and 44, respectively. FIGS. 41B, 43B, and 45B are sectional views taken along lines B-B' of FIGS. 40, 42 and 44, respectively. FIGS. 41C, 43C, and 45C are sectional views taken along lines C-C' of FIGS. 40, 42 and 44, respectively. FIGS. 41D, 43D, and 45D are sectional views taken along lines D-D' of FIGS. 40, 42 and 44, respectively. FIG. 46 is a plan view illustrating a photomask, which are used to form via holes, according to an example embodiment.

Referring to FIGS. 40 and 41A to 41D, a logic cell LC may be provided on a substrate SUB. Logic transistors constituting a logic circuit may be disposed on the logic cell LC.

The substrate SUB may include a first active region PR and a second active region NR. In an example embodiment, the first active region PR may be a PMOSFET region, and the second active region NR may be an NMOSFET region. The substrate SUB may be a semiconductor substrate (e.g., made of silicon, germanium, or silicon-germanium) or a substrate made of a compound semiconductor material. As an example, the substrate SUB may be a silicon wafer.

The first and second active regions PR and NR may be defined by a second trench TR2, which is formed in an upper portion of the substrate SUB. The second trench TR2 may be located between the first and second active regions PR and NR. The first and second active regions PR and NR may be spaced apart from each other, in a first direction D1, with the second trench TR2 interposed therebetween. Each of the first and second active regions PR and NR may be extended in a second direction D2 crossing the first direction D1.

First active patterns AP1 and second active patterns AP2 may be provided on the first active region PR and the second active region NR, respectively. The first and second active patterns AP1 and AP2 may be extended in the second direction D2 to be parallel to each other. The first and second active patterns AP1 and AP2 may be vertically-protruding portions of the substrate SUB. A first trench TR1 may be defined between adjacent ones of the first active patterns AP1 and between adjacent ones of the second active patterns AP2. The first trench TR1 may be shallower than the second trench TR2.

A device isolation layer ST may be formed to fill the first and second trenches TR1 and TR2. The device isolation layer ST may be formed of or include silicon oxide. Upper portions of the first and second active patterns AP1 and AP2 may protrude vertically above a top surface of the device isolation layer ST (e.g., see FIG. 41D). Each of the upper portions of the first and second active patterns AP1 and AP2 may be a fin-shaped pattern. The device isolation layer ST may not cover the upper portions of the first and second active patterns AP1 and AP2. The device isolation layer ST may cover lower side surfaces of the first and second active patterns AP1 and AP2.

First source/drain patterns SD1 may be provided in upper portions of the first active patterns AP1. The first source/drain regions SD1 may be impurity regions of a first conductivity type (e.g., p-type). A first channel region CH1 may be interposed between adjacent pairs of the first source/drain regions SD1. Second source/drain regions SD2 may be provided in upper portions of the second active patterns AP2. The second source/drain regions SD2 may be impurity regions of a second conductivity type (e.g., n-type). A second channel region CH2 may be interposed between adjacent pairs of the second source/drain regions SD2.

The first and second source/drain regions SD1 and SD2 may be epitaxial patterns, which are formed by a selective epitaxial growth process. As an example, the first and second source/drain regions SD1 and SD2 may have top surfaces that are coplanar with top surfaces of the first and second channel regions CH1 and CH2. As another example, the top surfaces of the first and second source/drain regions SD1 and SD2 may be higher than the top surfaces of the first and second channel regions CH1 and CH2.

The first source/drain regions SD1 may be formed of or include a semiconductor material (e.g., SiGe) whose lattice constant is larger than a lattice constant of the semiconductor material of the substrate SUB. In this case, the first source/drain regions SD1 may exert a compressive stress on the first channel regions CH1. As an example, the second source/drain regions SD2 may be formed of or include the same semiconductor material (e.g., Si) as that of the substrate SUB.

Gate electrodes GE may be provided to cross the first and second active patterns AP1 and AP2 and to extend in the first direction D1. The gate electrodes GE may be arranged at a constant pitch in the second direction D2. The gate electrodes GE may be vertically overlapped with the first and second channel regions CH1 and CH2. Each of the gate electrodes GE may be provided to enclose the top and two side surfaces of each of the first and second channel regions CH1 and CH2 (e.g., see FIG. 41D).

Referring back to FIG. 41D, the gate electrode GE may be provided on a first top surface TS1 of the first channel region CH1 and at least one first side surface SW1 of the first channel region CH1. The gate electrode GE may be provided on a second top surface TS2 of the second channel region CH2 and at least one second side surface SW2 of the second channel region CH2. In other words, the transistor according to an example embodiment may be a three-dimensional field-effect transistor (e.g., FinFET), in which the gate electrode GE is provided to three-dimensionally surround the channel regions CH1 and CH2.

Referring back to FIGS. 40 and 41A to 41D, a pair of gate spacers GS may be disposed on opposite side surfaces of each of the gate electrodes GE. The gate spacers GS may be extended along the gate electrodes GE and in the first direction D1. Top surfaces of the gate spacers GS may be higher than top surfaces of the gate electrodes GE. The top surfaces of the gate spacers GS may be coplanar with a top surface of a first interlayer insulating layer ILD1, which will be described below. The gate spacers GS may be formed of or include at least one of SiCN, SiCON, or SiN. In an example embodiment, the gate spacers GS may be a multi-layered structure, which includes at least two different materials selected from SiCN, SiCON, and SiN.

A gate capping pattern GP may be provided on each of the gate electrodes GE. The gate capping pattern GP may be extended along the gate electrode GE in the first direction D1. The gate capping pattern GP may be formed of or include a material having an etch selectivity with respect to first and second interlayer insulating layers ILD1 and ILD2, which will be described below. For example, the gate capping patterns GP may be formed of or include at least one of SiON, SiCN, SiCON, or SiN.

A gate insulating layer GI may be interposed between the gate electrode GE and the first active pattern AP1 and between the gate electrode GE and the second active pattern AP2. The gate insulating layer GI may extend along a bottom surface of the gate electrode GE. As an example, the gate insulating layer GI may cover the first top surface TS1 and the first side surface SW1 of the first channel region CH1. The gate insulating layer GI may cover the second top surface TS2 and the second side surfaces SW2 of the second channel region CH2. The gate insulating layer GI may cover a top surface of the device isolation layer ST below the gate electrode GE (e.g., see FIG. 41D).

In an example embodiment, the gate insulating layer GI may be formed of or include a high-k dielectric material whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate insulating layer GI to be adjacent to the first and second channel regions CH1 and CH2. The first metal pattern may include a work function metal adjusting a threshold voltage of the transistor. By adjusting a thickness and composition of the first metal pattern, it may be possible to realize a transistor having a desired threshold voltage.

The first metal pattern may include a metal nitride layer. For example, the first metal pattern may be formed of or include at least one metallic material, which is selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of work function metal layers, which are stacked.

The second metal pattern may include a metallic material whose resistance is lower than that of the first metal pattern. For example, the second metal pattern may be formed of or include at least one metallic material, which is selected from the group consisting of tungsten (W), aluminum (Al), titanium (Ti), and tantalum (Ta).

The first interlayer insulating layer ILD1 may be provided on the substrate SUB. The first interlayer insulating layer ILD1 may cover the gate spacers GS and the first and second source/drain regions SD1 and SD2. A top surface of the first interlayered insulating layer ILD1 may be substantially coplanar with top surfaces of the gate capping patterns GP and the top surfaces of the gate spacers GS (e.g., see FIGS. 41A and 41B). The second interlayer insulating layer ILD2 may be provided on the first interlayer insulating layer ILD1 to cover the gate capping patterns GP.

A pair of division structures DB, which are opposite to each other in the second direction D2, may be provided at both sides of the logic cell LC. The division structure DB may be extended in the first direction D1 and parallel to the gate electrodes GE.

The division structure DB may penetrate the first and second interlayer insulating layers ILD1 and ILD2 and may extend into the first and second active patterns AP1 and AP2. The division structure DB may penetrate an upper portion of each of the first and second active patterns AP1 and AP2. The dividing structure DB may separate the PMOSFET and NMOSFET regions PR and NR of the logic cell LC from an active region of another logic cell adjacent thereto.

Active contacts AC may be provided to penetrate the first and second interlayer insulating layers ILD1 and ILD2 and to be electrically and respectively connected to the first and second source/drain regions SD1 and SD2. Each of the active contacts AC may be provided between a corresponding pair of the gate electrodes GE.

The active contact AC may be a self-aligned contact. For example, the active contact AC may be formed by a self-alignment process using the gate capping pattern GP and the gate spacer GS. In an example embodiment, the active contact AC may cover at least a portion of a side surface of the gate spacer GS. The active contact AC may cover a portion of the top surface of the gate capping pattern GP.

Silicide patterns SC may be interposed between the active contact AC and the first source/drain region SD1 and between the active contact AC and the second source/drain region SD2. The active contact AC may be electrically connected to the source/drain region SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

A gate contact GC may be provided to penetrate the second interlayer insulating layer ILD2 and the gate capping pattern GP and to be electrically connected to the gate electrode GE. Referring to FIG. 43B, an upper insulating pattern UIP may be formed to fill an empty region, which is formed on each of the active contacts AC adjacent to the gate contact GC. Accordingly, it may be possible to prevent the gate contact GC from being in contact with the active contact AC adjacent thereto and thereby to prevent a short circuit issue from occurring.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. In an example embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Referring to FIGS. 42 and 43A to 43D, a third interlayer insulating layer ILD3 may be formed on the second interlayer insulating layer ILD2. Via holes VH may be formed by patterning the third interlayer insulating layer ILD3. Each of the via holes VH may be formed to penetrate the third interlayer insulating layer ILD3 and to expose a top surface of the active or gate contact AC or GC.

Referring to FIG. 46, the via holes VH may be formed by a photolithography process using the photomask 1400 of FIG. 46. The photomask 1400 of FIG. 46 may be formed using the afore-described OPC method described with reference to FIGS. 4 to 14.

Referring to FIGS. 44 and 45A to 45D, first vias VI1 may be formed by filling the via holes VH with a conductive material. A fourth interlayer insulating layer ILD4 may be formed on the third interlayer insulating layer ILD3. Interconnection lines M1_R1, M1_R2, and M1_I may be formed in the fourth interlayer insulating layer ILD4. The interconnection lines M1_R1, M1_R2, and M1_I may include a first power line M1_R1, a second power line M1_R2, and lower interconnection lines M1_I.

Referring to FIG. 44, each of the first and second power lines M1_R1 and M1_R2 may extend in the second direction D2 to cross the logic cell LC. In an example embodiment, a plurality of the lower interconnection lines M1_I may be disposed between the first and second lower power lines M1_R1 and M1_R2. The lower interconnection lines M1_I may be line- or bar-shaped patterns extending in the second direction D2.

The interconnection lines M1_R1, M1_R2, and M1_I and the first vias VI1 thereunder may constitute a first metal layer M1. The first via VI1 may be interposed between the interconnection line and the active or gate contact AC or GC to electrically connect them to each other. Additional metal layers (e.g., M2, M3, M4, and so forth) may be further formed on the first metal layer M1.

Figure 31:
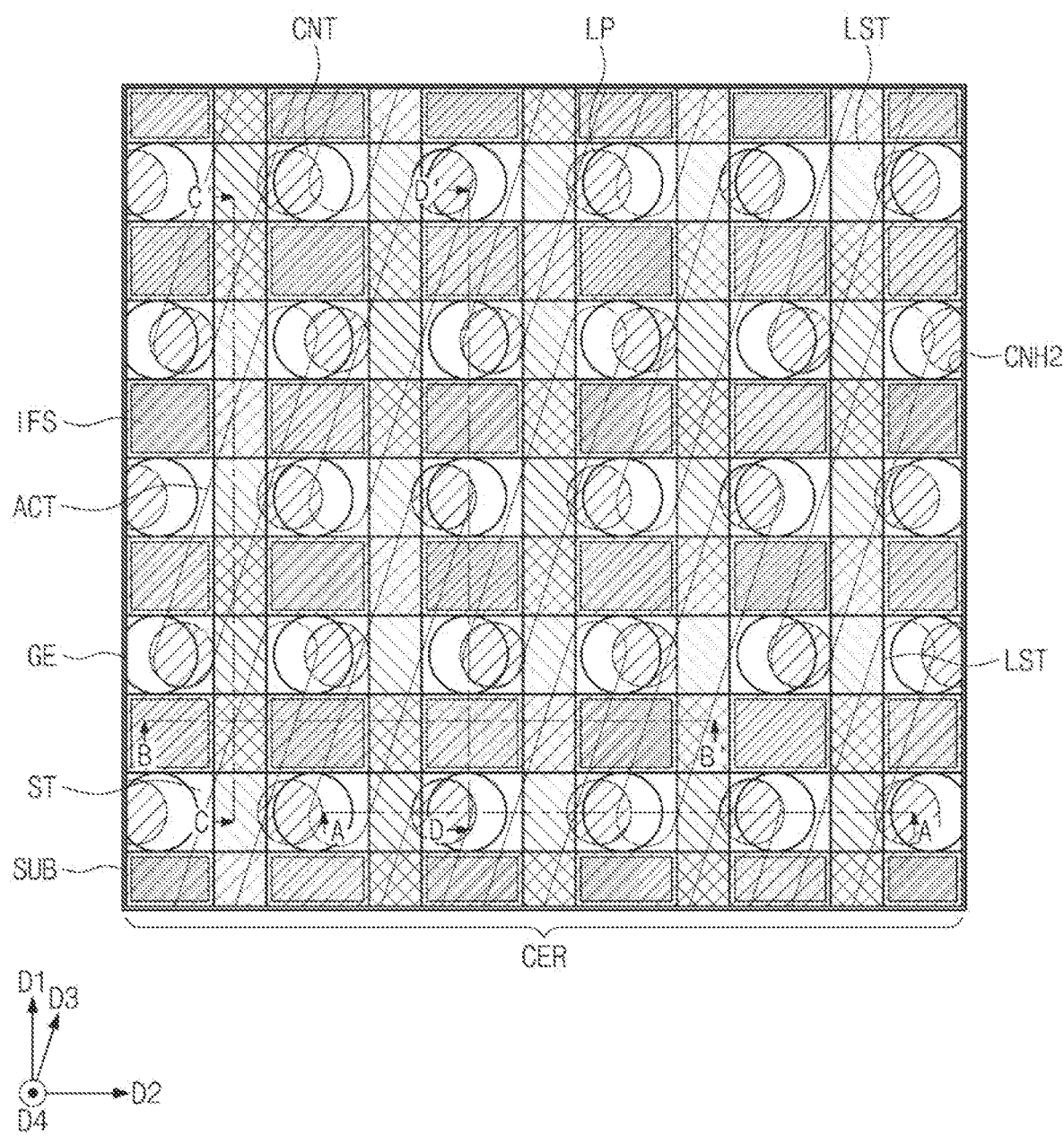
Figure 32A:
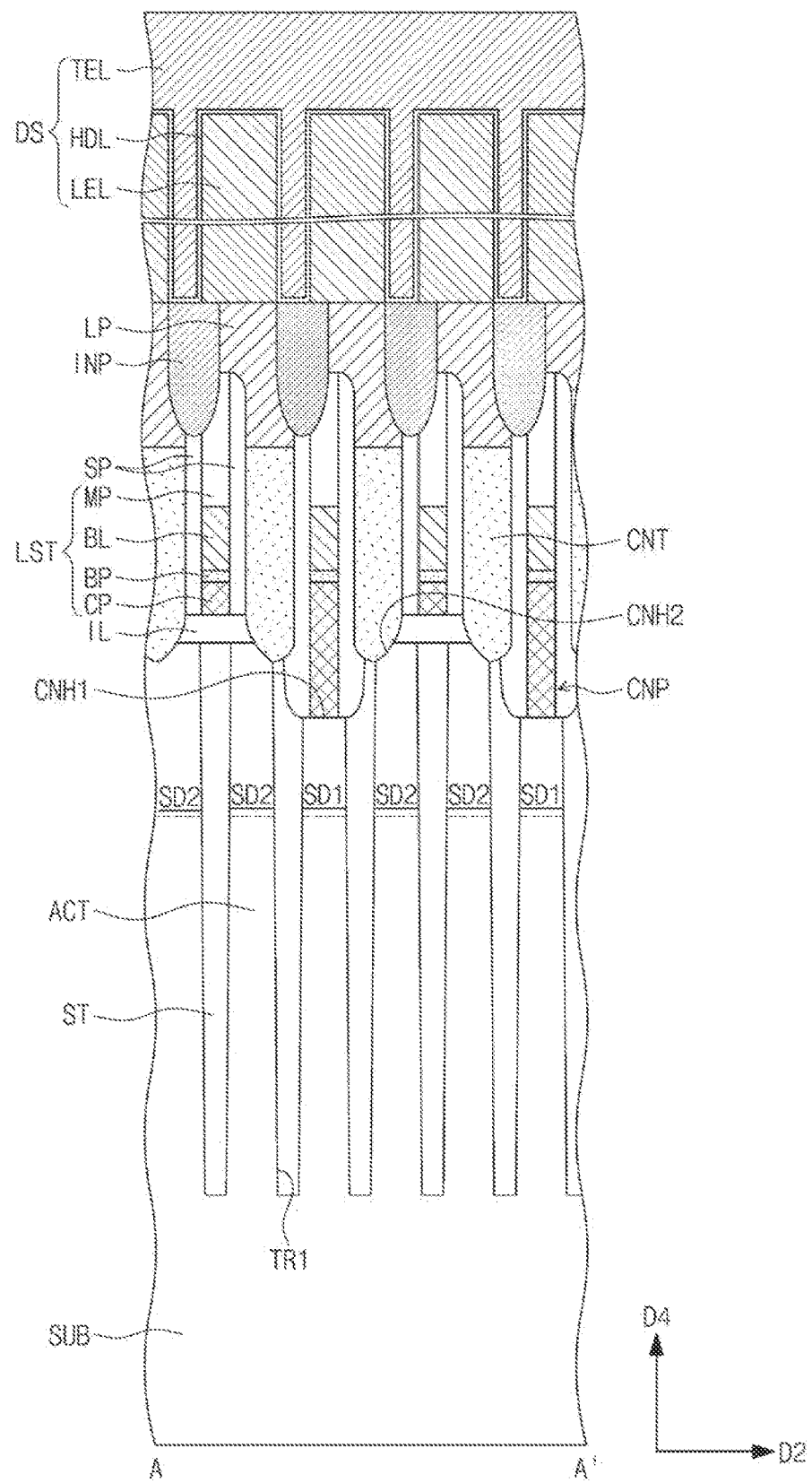
Figure 32B:
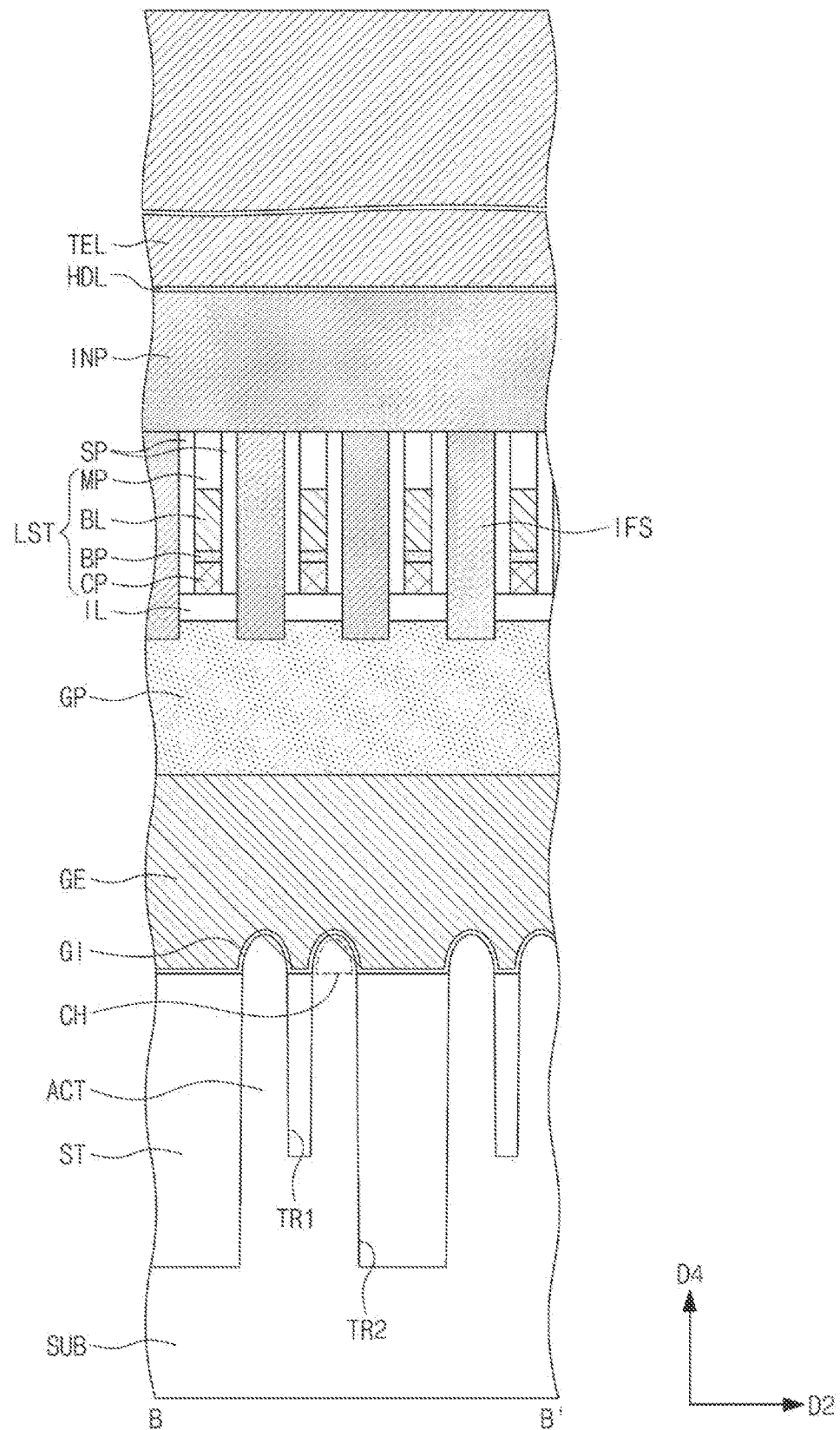
Figure 32C:
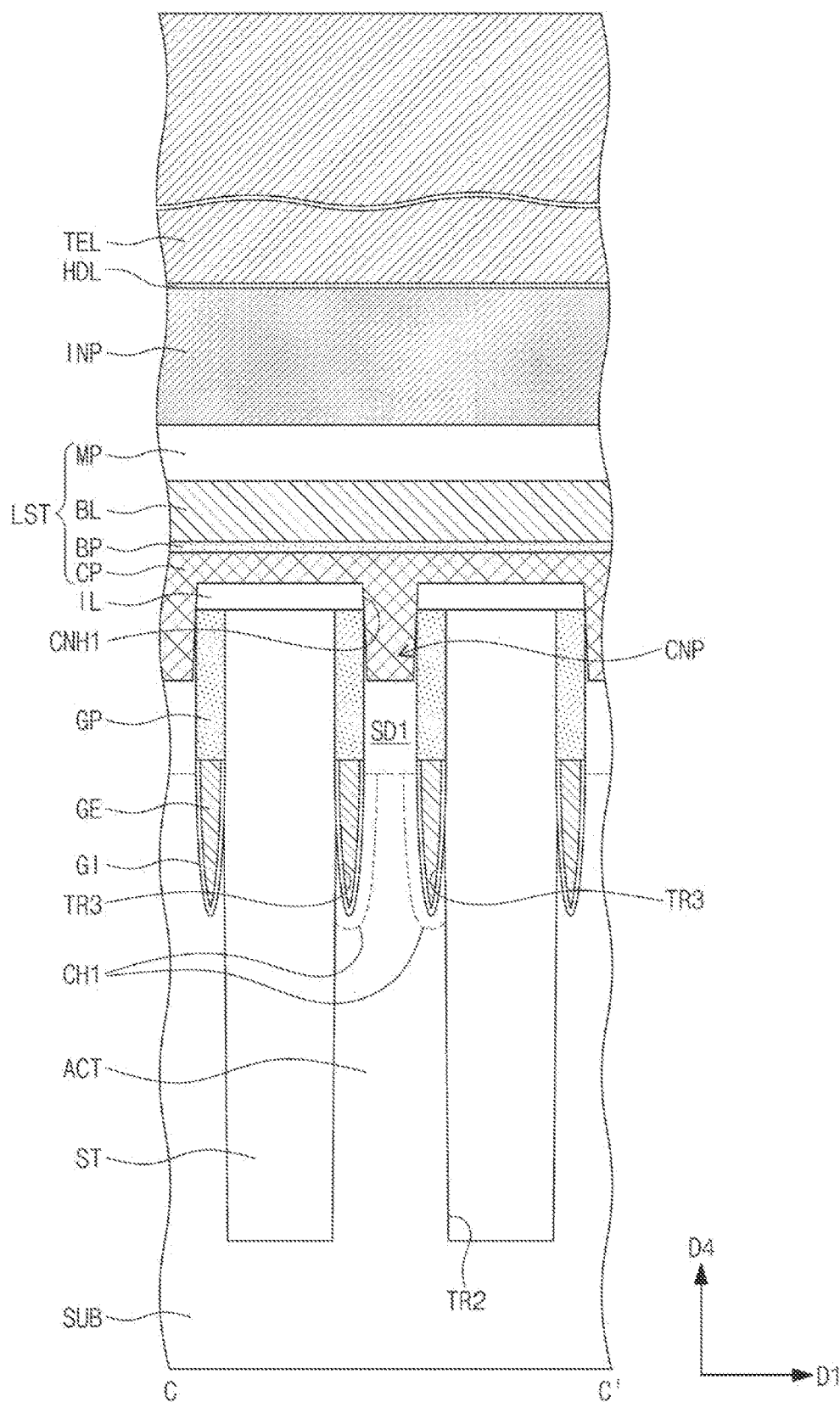
Figure 32D:
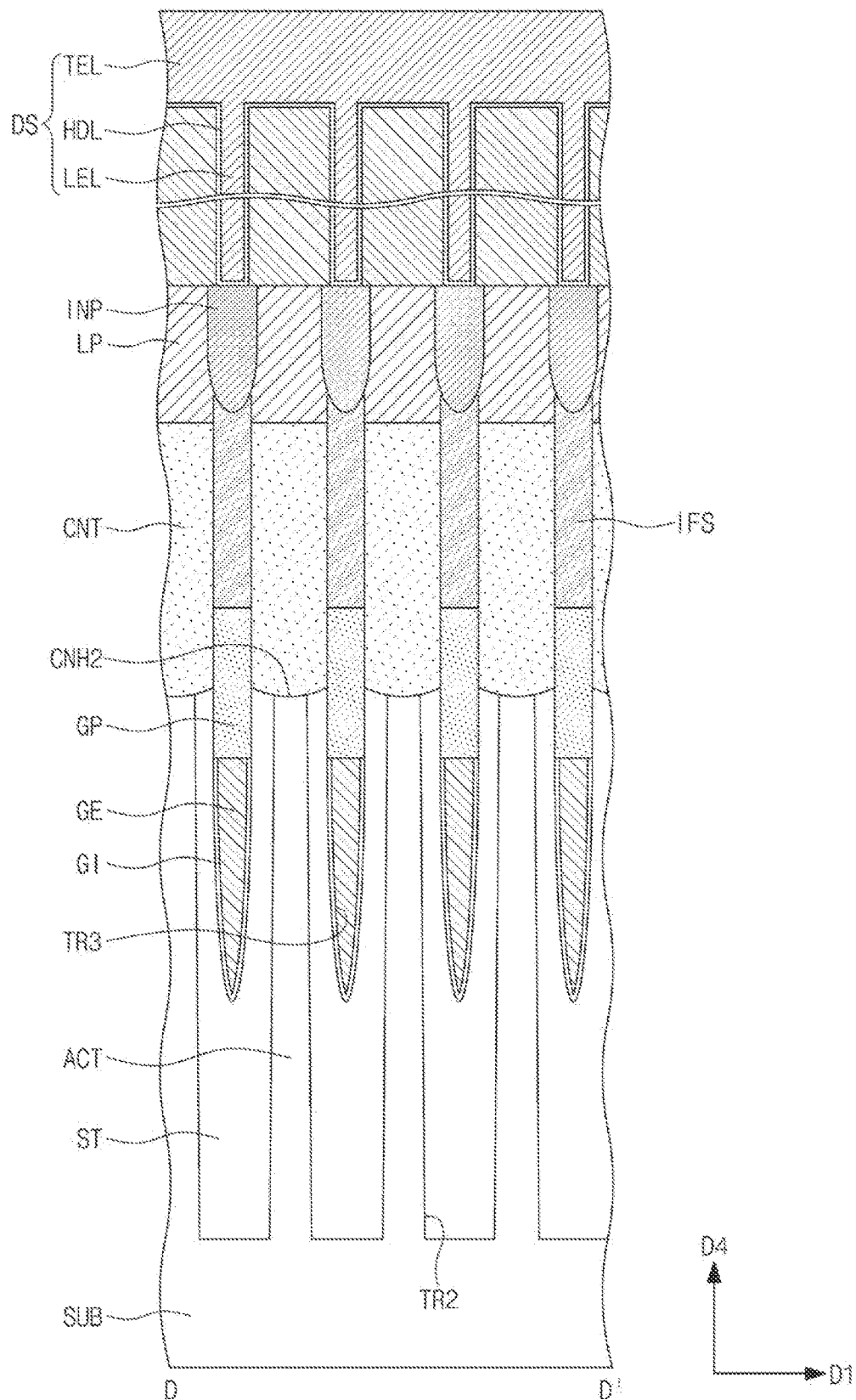

The afore-described OPC method may be used to form island-shaped patterns, such as the landing pads LP of FIG. 31, the channel holes CHO of FIG. 36, and the via holes VH of FIG. 42. In addition, the afore-described OPC method may be used to form line patterns (e.g., interconnection lines) shown in FIG. 44. In the case where a distance between line ends is small, there may be a specific restriction in the mask rule, and especially, the afore-described OPC method may be effectively used for such a case.

In an OPC method according to an example embodiment, an OPC process may be repeated until any target error does not substantially occur between a target pattern and a corresponding simulation pattern. Accordingly, it may be possible to obtain OPC results with extremely high precision. According to an example embodiment, the OPC method may make it possible to more precisely realize fine patterns on a cell region of a substrate through a photolithography process, and thus, it may be possible to improve an integration density and a reliability property of a semiconductor device.

While example embodiments have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
    performing an optical proximity correction (OPC) operation on a design pattern of a layout; and
    forming a photoresist pattern on a substrate, using a photomask which is manufactured with the layout corrected by the OPC operation,
    wherein the OPC operation comprises:
        generating a target pattern based on the design pattern;
        performing a first OPC operation, based on the target pattern, to generate a first correction pattern;
        measuring a first target error by comparing a first simulation image of the first correction pattern with the target pattern;
        generating a retarget pattern from the target pattern, based on the first target error; and
        performing a second OPC operation, based on the retarget pattern, to generate a second correction pattern,
    wherein the method further comprises:
        alternately stacking insulating layers and sacrificial layers on the substrate to form a stack;
        forming channel holes to penetrate the stack;
        forming a respective vertical channel structure in each of the channel holes; and
        replacing each of the sacrificial layers with a respective electrode,
    wherein the photoresist pattern defines a mask to form the channel holes.

2. The method of claim 1, wherein the target pattern comprises a first edge, a second edge, a third edge, and a fourth edge, and
wherein the measuring of the first target error comprises:
measuring a first target error value between a position of the first edge and a position of the first simulation image;
measuring a second target error value between a position of the second edge and the position of the first simulation image;
measuring a third target error value between a position of the third edge and the position of the first simulation image; and
measuring a fourth target error value between a position of the fourth edge and the position of the first simulation image.

3. The method of claim 2, wherein the first target error value is a first minimum distance between the first edge and the first simulation image,
wherein the second target error value is a second minimum distance between the second edge and the first simulation image,
wherein the third target error value is a third minimum distance between the third edge and the first simulation image, and
wherein the fourth target error value is a fourth minimum distance between the fourth edge and the first simulation image.

4. The method of claim 2, wherein the generating the retarget pattern comprises:
compensating the first edge by a first opposite value of the first target error value;
compensating the second edge by a second opposite value of the second target error value;
compensating the third edge by a third opposite value of the third target error value; and
compensating the fourth edge by a fourth opposite value of the fourth target error value.

5. The method of claim 1, wherein a center of the retarget pattern is offset from a center of the target pattern, and
wherein a size of the retarget pattern is different from a size of the target pattern.

6. The method of claim 1, wherein the target pattern comprises a first edge, a second edge, a third edge, and a fourth edge,
wherein the retarget pattern comprises a first retarget edge, a second retarget edge, a third retarget edge, and a fourth retarget edge, and
wherein the generating of the retarget pattern comprises:9
compensating the first edge, based on the first target error, to generate the first retarget edge;
compensating the second edge, based on the first target error, to generate the second retarget edge;
compensating the third edge, based on the first target error, to generate the third retarget edge; and
compensating the fourth edge, based on the first target error, to generate the fourth retarget edge.

7. The method of claim 1, wherein the OPC operation further comprises:
measuring a second target error by comparing a second simulation image of the second correction pattern with the target pattern; and
determining whether the second target error is within an error tolerance.

8. The method of claim 7, wherein the determining whether the second target error is within the error tolerance comprises determining whether the second target error is smaller than a database unit, which is a minimum unit of an OPC tool.

9. The method of claim 7, wherein, based on the second target error being beyond the error tolerance, the OPC operation further comprises:
generating an additional retarget pattern;
performing an additional OPC operation, based on the additional retarget pattern, to generate an additional correction pattern; and
measuring an additional target error by comparing an additional simulation image of the additional correction pattern with the target pattern, and
wherein the generating of the additional retarget pattern and the performing of the additional OPC operation are iteratively performed until the additional target error is smaller than a database unit, which is a minimum unit of an OPC tool.

10. A method of fabricating a semiconductor device, the method comprising:
performing an optical proximity correction (OPC) operation on a layout; and
forming a photoresist pattern on a substrate, using a photomask which is manufactured with the layout corrected by the OPC operation,
wherein the OPC operation comprises:
generating a target pattern comprising a first edge, a second edge, a third edge, and a fourth edge;
performing a first OPC operation, based on the target pattern, to generate a first correction pattern;
measuring a first target error by comparing a first simulation image of the first correction pattern with the target pattern;
compensating each of the first to fourth edges of the target pattern, based on the first target error, to generate a retarget pattern; and
performing a second OPC operation, based on the retarget pattern, to generate a second correction pattern, and
wherein the method further comprises:
forming a device isolation layer on the substrate to define an active pattern;
forming a gate electrode to cross the active pattern;
forming a first source/drain region and a second source/drain region in an upper portion of the active pattern, the first source/drain region being adjacent to a first side of the gate electrode and the second source/drain region being adjacent to a second side of the gate electrode opposite to the first side;
forming a bit line electrically coupled to the first source/drain region;
forming a contact electrically coupled to the second source/drain region;
forming a metal layer on the contact patterning the metal layer using the photoresist pattern to form a landing pad; and
forming a data storing element on the landing pad.

11. The method of claim 10, wherein the measuring the first target error comprises:
measuring a first target error value between a position of the first edge and a position of the first simulation image;
measuring a second target error value between a position of the second edge and the position of the first simulation image;

measuring a third target error value between a position of the third edge and the position of the first simulation image; and measuring a fourth target error value between a position of the fourth edge and the position of the first simulation image.

12. The method of claim 11, wherein the generating the retarget pattern comprises:

compensating the first edge by an opposite value of the first target error value;

compensating the second edge by an opposite value of the second target error value;

compensating the third edge by an opposite value of the third target error value; and compensating the fourth edge by an opposite value of the fourth target error value.

13. The method of claim 10, wherein a center of the retarget pattern is offset from a center of the target pattern, and wherein a size of the retarget pattern is different from a size of the target pattern.

14. A method of fabricating a semiconductor device, the method comprising:

forming a peripheral circuit structure on a substrate, the peripheral circuit structure comprising peripheral transistors and lower interconnection lines provided on the peripheral transistors, the substrate comprising a cell array region and a connection region;

forming a semiconductor layer on the peripheral circuit structure;

alternately stacking insulating layers and sacrificial layers on the semiconductor layer to form a stack;

patterning the stack on the connection region to form a staircase structure;

forming channel holes to penetrate the stack on the cell array region;

forming dummy holes to penetrate the staircase structure on the connection region;

forming vertical channel structures in the channel holes, respectively, each of the vertical channel structures comprising a vertical insulating pattern comprising a charge storing layer, a vertical semiconductor pattern connected to the semiconductor layer, and a gap-fill insulating pattern;

forming dummy structures in the dummy holes, respectively;

replacing the sacrificial layers with electrodes, respectively;

forming bit lines, each bit line of the bit lines being electrically connected to a respective one of the vertical channel structures; and forming upper interconnection lines, each upper interconnection line of the upper interconnection lines being electrically connected to a respective one of the electrodes exposed through the staircase structure, wherein the forming the channel holes comprises:

designing a layout defining the channel holes;

performing an optical proximity correction (OPC) operation on the designed layout; and performing a photolithography process using a photomask which is manufactured with the layout corrected by the OPC operation, wherein the OPC operation comprises:

generating a target pattern including a first edge, a second edge, a third edge, and a fourth edge;

performing a first OPC operation, based on the target pattern, to generate a first correction pattern;

measuring a first target error by comparing a first simulation image of the first correction pattern with the target pattern;

compensating each of the first to fourth edges of the target pattern, based on the first target error, to generate a retarget pattern; and performing a second OPC operation, based on the retarget pattern, to generate a second correction pattern.

15. The method of claim 14, wherein the measuring the first target error comprises:

measuring a first target error value between a position of the first edge and a position of the first simulation image;

measuring a second target error value between a position of the second edge and the position of the first simulation image;

measuring a third target error value between a position of the third edge and the position of the first simulation image; and measuring a fourth target error value between a position of the fourth edge and the position of the first simulation image.

16. The method of claim 15, wherein the generating the retarget pattern comprises:

compensating the first edge by an opposite value of the first target error value;

compensating the second edge by an opposite value of the second target error value;

compensating the third edge by an opposite value of the third target error value; and compensating the fourth edge by an opposite value of the fourth target error value.

17. The method of claim 14, wherein a center of the retarget pattern is offset from a center of the target pattern, and wherein a size of the retarget pattern is different from a size of the target pattern.

18. The method of claim 14, wherein the OPC operation further comprises:

measuring a second target error by comparing a second simulation image of the second correction pattern with the target pattern; and examining whether the second target error is within an error tolerance.

* * * * *